(12) United States Patent
Tsukamoto et al.

(10) Patent No.: US 10,622,575 B2
(45) Date of Patent: Apr. 14, 2020

(54) DISPLAY APPARATUS AND METHOD FOR MANUFACTURING SAME

(71) Applicant: Sharp Kabushiki Kaisha, Sakai, Osaka (JP)

(72) Inventors: Yuto Tsukamoto, Sakai (JP); Shinichi Kawato, Sakai (JP); Manabu Niboshi, Sakai (JP); Hiroshi Imada, Sakai (JP); Tokiyoshi Umeda, Sakai (JP); Bai Zhang, Sakai (JP); Tomoaki Jo, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 16/340,706

(22) PCT Filed: Oct. 6, 2017

(86) PCT No.: PCT/JP2017/036426
§ 371 (c)(1),
(2) Date: Apr. 10, 2019

(87) PCT Pub. No.: WO2018/070348
PCT Pub. Date: Apr. 19, 2018

(65) Prior Publication Data
US 2019/0312220 A1    Oct. 10, 2019

(30) Foreign Application Priority Data

Oct. 13, 2016 (JP) .................................. 2016-202073

(51) Int. Cl.
*H01L 51/50* (2006.01)
*H01L 51/52* (2006.01)
(Continued)

(52) U.S. Cl.
CPC ............ *H01L 51/5004* (2013.01); *G09F 9/30* (2013.01); *H01L 27/32* (2013.01); *H01L 27/3244* (2013.01); *H01L 51/001* (2013.01); *H01L 51/50* (2013.01); *H01L 51/5016* (2013.01); *H01L 51/5044* (2013.01); *H01L 51/5218* (2013.01); *H01L 51/5234* (2013.01); *H01L 51/5265* (2013.01); *H01L 51/56* (2013.01);
(Continued)

(58) Field of Classification Search
CPC ... H01L 51/5004; H01L 51/001; H01L 51/50; H01L 51/5016; H01L 51/5044; H01L 51/5218; H01L 51/5234; H01L 51/5265; H01L 51/56; H01L 27/32; H01L 27/3244; H01L 2251/5315; G09F 9/30; H05B 33/10; H05B 33/12; H05B 33/26; H05B 33/28
USPC ........................................................... 257/40
See application file for complete search history.

(56) References Cited

U.S. PATENT DOCUMENTS

| 2007/0145350 | A1  | 6/2007  | Kobori  |           |
|--------------|-----|---------|---------|-----------|
| 2008/0299365 | A1* | 12/2008 | Choi    | C09K 11/06 |
|              |     |         |         | 428/213    |
| 2012/0187386 | A1  | 7/2012  | Matsumi |           |

FOREIGN PATENT DOCUMENTS

| JP | 4441883 B2 | 3/2010 |
|----|------------|---------|
| JP | 5819069 B2 | 11/2015 |

* cited by examiner

*Primary Examiner* — Tong-Ho Kim
(74) *Attorney, Agent, or Firm* — Keating & Bennett, LLP

(57) ABSTRACT

Provided is a display apparatus where: a red light-emitting layer is formed as a layer that is common to a first subpixel, a second subpixel, and a third subpixel; a blue light-emitting layer is formed as a layer that is common to the first subpixel
(Continued)

and the second subpixel; and the green light-emitting layer is formed only in the second subpixel.

16 Claims, 21 Drawing Sheets

(51) Int. Cl.
*H01L 51/00* (2006.01)
*H01L 51/56* (2006.01)
*H01L 27/32* (2006.01)
*H05B 33/26* (2006.01)
*H05B 33/12* (2006.01)
*G09F 9/30* (2006.01)
*H05B 33/28* (2006.01)
*H05B 33/10* (2006.01)

(52) U.S. Cl.
CPC ............. *H05B 33/10* (2013.01); *H05B 33/12* (2013.01); *H05B 33/26* (2013.01); *H05B 33/28* (2013.01); *H01L 2251/5315* (2013.01)

B LIGHT EMISSION

G LIGHT EMISSION

R LIGHT EMISSION

DISPLAY APPARATUS AND METHOD FOR MANUFACTURING SAME

TECHNICAL FIELD

The disclosure relates to a display apparatus and to a method for manufacturing a display apparatus.

BACKGROUND ART

In recent years, a self-luminous display apparatus using a light-emitting element employing an electroluminescence (hereinafter referred to as "EL") phenomenon has been developed as a display apparatus instead of a liquid crystal display apparatus.

The display apparatus including an EL element can emit light at a low voltage. As the display apparatus is self-luminous element, the display apparatus has a wide viewing angle and high viewability. In addition, use of a complete solid element having a thin-film shape allows the display apparatus to save space and thus to be portable, which makes the display apparatus more attractive.

The EL element has a configuration in which a light-emitting layer containing a luminescent material is provided between an anode electrode and a cathode electrode. The EL element emits light by the use of the light-releasing phenomenon observed when excitons generated by the recombination of the electrons and the holes having been injected into the light-emitting layer are deactivated.

The light-emitting layer in the EL element is formed mainly by the use of a vapor deposition technique such as the vacuum vapor deposition technique. The vapor deposition technique for forming a full-color organic EL display apparatus is roughly classified into a white color filter (CF) technique and a separate-patterning technique. In addition, a technique that is classified into neither the white CF technique nor the separate-patterning technique has been proposed in recent years. The technique combines the EL element with a color conversion layer.

In the white CF technique, the luminescent color of each subpixel is selected by combining an EL element emitting white light with a CF layer. According to the white CF technique, each subpixel emits white light by layering a red light-emitting layer, a green light-emitting layer, and a blue light-emitting layer between the cathode electrode and anode electrode. In addition, each subpixel includes color filters of red color (R), green color (G) and blue color (B), which allows such subpixels to compose a full-color display apparatus.

In the separate-patterning technique, a separately patterning vapor deposition is performed by the use of vapor deposition masks for individual colors. Commonly, subpixels including red color (R) EL elements, subpixels including green color (G) EL elements, and subpixels including blue color (B) EL elements are arranged on a substrate. The subpixels are selectively made to emit light of their respective colors with desired luminance by the use of TFTs to display intended images. Between every mutually-adjacent EL elements, a bank (partition) is disposed to define light emitting regions of the subpixels. The light-emitting layer in each EL element is formed in an opening in the bank by the use of a vapor deposition mask.

According to the technique combining the EL elements with color conversion layers, a blue light-emitting layer is formed as a common layer to all the subpixels. Each green subpixel includes a green color conversion layer configured to convert the blue light to the green light; and a green color filter. Each red subpixel includes a red color conversion layer configured to convert the blue light to the red light; and a red color filter. Each blue subpixel includes a blue color filter but does not include color conversion layer. Hence, the blue light emitted by the blue light-emitting layer is extracted through the blue color filter without having been subjected to any color conversion. Accordingly, each subpixel emits light of the corresponding color (e.g., see PTL 1).

The display apparatus disclosed in PTL 1 includes a pair of substrates that are arranged face to face each other. For each subpixel, a counter electrode layer is formed on a first one of the substrates, then a function layer including a blue light-emitting layer is formed on the counter electrode layer, and then an optical transparent electrode layer is formed on the function layer. On a second one of the substrates, a color filter and, if necessary, as described above, a color conversion layer are formed for each subpixel. The counter electrode layer is a layered body including a reflective electrode layer and a transparent electrode layer formed by layering these layers in this order from the first substrate side.

In the case of the display apparatus of PTL 1, the blue subpixels have no color conversion layers, and the optical distance between the reflective electrode layer and the blue light-emitting layer in each of the blue subpixels is set to a distance enabling the interference of the blue light in the blue light-emitting layer. Hence, the blue light that is extracted has an intensity increased by the interference. On the other hand, the red subpixels and the green subpixels include their respective color conversion layers. In each of the subpixels, the optical distance between the reflective electrode layer and the light-emitting layer is set to a distance enabling the light of the luminescent color obtained as a result of the conversion by the color conversion layer to be extracted with the highest intensity possible. Hence, the intensity of the extracted red light and the intensity of the extracted green light can be increased.

CITATION LIST

Patent Literature

PTL 1: JP 4441883 B (Published on Jan. 22, 2010)
PTL 2: JP 5819069 B (Published on Oct. 9, 2015)

SUMMARY

Technical Problem

The white CF technique has an advantage in that the display apparatus manufactured by the technique can achieve a high resolution without requiring any high-resolution vapor deposition masks. The white CF technique, however, needs to make the blue light-emitting layer, the green light-emitting layer, and the red light-emitting layer emit light simultaneously to obtain the emission of white light. This requires a higher drive voltage. In addition, the use of color filters causes an energy loss. Hence, the display apparatus employing the white CF technique has a problem of an increased power consumption when driven. In addition, the display apparatus employing the white CF technique is manufactured by layering a red light-emitting layer, a green light-emitting layer, and a blue light-emitting layer in each of all the subpixels. This means that more layers need to be formed in each of all the subpixels than other techniques. In addition, the use of the color filters results in a much higher manufacturing cost.

The separate-patterning technique, on the other hand, has some excellent properties such as the luminous efficiency and the low voltage driving. The separate-patterning technique, however, has difficulty in performing a highly accurate patterning. The separate-patterning technique may have a problem of the mixing of the color intended for a particular pixel into a neighboring pixel. This problem may be caused, for example, if the openings are not formed accurately enough in a vapor deposition mask or if the distance between the vapor deposition source and the film target substrate is inappropriate. In addition, a certain thickness of the vapor deposition mask or a certain vapor deposition angle may result in a shadow, that is, a film thickness that is thinner than the intended one. Hence, the display apparatus employing the separate-patterning technique may have a problem of a display quality degraded by the mixing-in of the vapor deposition material from a neighboring pixel and/or by a shadow. In particular, the attachment of only a slightest amount of different-color dopant to a neighboring pixel may have a disproportionately great effect in the EL light emission spectrum in a certain apparatus structure, resulting in an unintentional change in chromaticity.

Hence, manufacturing a high-resolution display apparatus by the separate-patterning technique needs to separate the vapor deposition source from the film target substrate by a certain distance that allows an acute vapor deposition angle to be achieved, which in turn requires a vacuum chamber that is high enough to accommodate the vapor deposition source and the film target substrate thus remotely separated.

Such a high vacuum chamber, however, requires a higher manufacturing cost. In addition, bad material-utilization efficiency increases the material cost.

In a display apparatus employing a technique combining EL elements with color conversion layers, such as the technique disclosed in PTL 1, the formation of a single blue light-emitting layer as a common layer to all the subpixels can reduce the number of required separate-patterning vapor-deposition sessions using different vapor deposition masks.

The technique using the color conversion layers achieves the emission of green light and red light by the use of color conversion layers containing fluorescent media capable of absorbing the blue light and of generating fluorescence that enables the re-emission of green light and red light, respectively. Hence, the technique results in lower luminous efficiencies for green light and for red light. In particular, absorption of blue light by the red color conversion layer needs a significant wavelength shift to the longer wavelength side. Hence, this wavelength shift results in a remarkable decrease in the light emission intensity.

The technique using the color conversion layers has additional problems. The variation in the thickness of the layered film may result in great changes in the light extraction efficiency. In addition, the gap that exists between the EL element and the color conversion layer allows the blue light to exit obliquely, which in turn causes color mixing and/or color shifting, resulting in difficulty in achieving a high resolution.

PTL 2 discloses an organic EL display apparatus including a blue light-emitting layer that is common to all the subpixels (i.e., a common blue light-emitting layer); an individual green light-emitting layer for each of the green subpixels; an individual red light-emitting layer for each of the red subpixels; a blue color filter for each of the blue subpixels; a green color filter for each of the green subpixels; and a red color filter for each of the red subpixels.

It should be noted that the green luminescent material and the red luminescent material have lower energy levels than the blue luminescent material. Hence, in a case where the organic EL display apparatus disclosed in PTL 2 selects, as the common light-emitting layer, the light-emitting layer using either the green luminescent material or the red luminescent material as its luminescent material, an energy transfer occurs, which may result in color mixing. Hence, the only selectable common light-emitting layer is the blue light-emitting layer. In addition, it is important to control the position where the holes and the electrons are recombined together. Hence, a certain carrier mobility of the material for each layer may result in color mixing. Accordingly, the order of layering the blue light-emitting layer, the green light-emitting layer, and the red light-emitting layer has a low degree of freedom, and the selection of the host material of each light-emitting layer has also a low degree of freedom. A change in the layering order will change the recombination position of the holes and the electrons, which in turn may result in color mixing.

Additional problems may arise from the use of the color filters by the organic EL display apparatus disclosed in PTL 2: an increased manufacturing cost and an energy loss.

The disclosure has been made in view of the above-described problems of the display apparatus of related art and thus provides a display apparatus, along with a manufacturing method thereof, capable of: preventing color mixing or color shift from occurring in each subpixel; achieving a high efficiency in providing each luminescent color; and reducing the power consumption when driven and reducing the manufacturing cost from their respective counterparts of display apparatus of related art.

Solution to Problem

A solution to the problems described above is provided by a display apparatus according to an aspect of the disclosure. The display apparatus includes: a display region; a first electrode; a second electrode; and a layered body formed between the first electrode and the second electrode. In the display apparatus, the display region includes: a first subpixel, a second subpixel, and a third subpixel. The first subpixel, the second subpixel, and the third subpixel emit their respective light having mutually different peak wavelengths. The layered body includes: a first light-emitting layer containing a first fluorescent luminescent material, a second light-emitting layer containing a second fluorescent luminescent material; a third light-emitting layer containing a third fluorescent luminescent material or a phosphorescent luminescent material as a third luminescent material. The first fluorescent luminescent material emits light having a first peak wavelength, the second fluorescent luminescent material emits light having a second peak wavelength that is longer than the first peak wavelength, and the third luminescent material emits light having a third peak wavelength that is longer than the second peak wavelength. The second fluorescent luminescent material has a lower energy level in a minimum excited singlet state than an energy level of the first fluorescent luminescent material in the minimum excited singlet state. The third luminescent material has a lower energy level in a minimum excited singlet state than the energy level of the second fluorescent luminescent material in the minimum excited singlet state. The third light-emitting layer is formed as a layer that is common to the first subpixel, the second subpixel, and the third subpixel. The first light-emitting layer is formed as a layer that is common to the first subpixel and the second subpixel. The second light-emitting layer is formed only in the second subpixel. A distance between the first light-emitting layer and the second light-emitting layer in the second subpixel is not greater than a Förster radius. The distance between the second light-emitting layer and the third light-emitting layer is greater than the Förster radius. The third light-emitting layer is formed on the first electrode side or on the second electrode side closer than the first light-emitting layer and the second light-emitting layer.

A solution to the problems described above is provided by a display apparatus manufacturing method according to an aspect of the disclosure. The display apparatus manufacturing method is a method for manufacturing a display apparatus including: a display region; a first electrode; a second electrode; and a layered body formed between the first electrode and the second electrode. In the display apparatus, the display region includes: a first subpixel, a second subpixel, and a third subpixel. The first subpixel, the second subpixel, and the third subpixel emit their respective light having mutually different peak wavelengths. The layered body includes: a first light-emitting layer containing a first fluorescent luminescent material, a second light-emitting layer containing a second fluorescent luminescent material, and a third light-emitting layer containing a third fluorescent luminescent material or a phosphorescent luminescent material as a third luminescent material. The first fluorescent luminescent material emits light having a first peak wavelength. The second fluorescent luminescent material emits light having a second peak wavelength that is longer than the first peak wavelength. The third luminescent material emits light having a third peak wavelength that is longer than the second peak wavelength. The second fluorescent luminescent material has a lower energy level in a minimum excited singlet state than an energy level of the first fluorescent luminescent material in the minimum excited singlet state. The third luminescent material has a lower energy level in a minimum excited singlet state than the energy level of the second fluorescent luminescent material in the minimum excited singlet state. The display apparatus manufacturing method includes: a first electrode formation step for forming the first electrode; a layered body formation step for forming the layered body; a second electrode formation step for forming the second electrode. In the manufacturing method, the layered body formation step includes: a first light-emitting layer vapor deposition step for vapor-depositing the first light-emitting layer as a layer that is common to the first subpixel, the second subpixel, and the third subpixel; a second light-emitting layer vapor-deposition step for vapor-depositing the second light-emitting layer in a separately patterning manner as a layer that is common to the second subpixel and the third subpixel; and a third light-emitting layer vapor-deposition step for vapor-depositing the third light-emitting layer in a separately patterning manner in the third subpixel. A distance between the first light-emitting layer and the second light-emitting layer in the second subpixel is not greater than the Förster radius. A distance between the second light-emitting layer and the third light-emitting layer is greater than the Förster radius. The layered body is formed allowing the third light-emitting layer located on the first electrode side or on the second electrode side closer than the first light-emitting layer and the second light-emitting layer.

Advantage Effects of Disclosure

According to the aspect of the disclosure, the third light-emitting layer is formed to cover the entire display region and thus serves commonly to the first subpixel, the second subpixel, and the third subpixel. Hence, not all the light-emitting layers have to be formed by the separately patterning vapor deposition technique. According to the aspect of the disclosure, the third light-emitting layer is vapor-deposited to cover the entire display region and thus serves commonly to all the subpixels including the first subpixel, the second subpixel, and the third subpixel. This reduces the number of separate-patterning vapor-deposition sessions using different vapor deposition masks.

In addition, according to the aspect of the disclosure, in the third subpixel, an almost 100% light emission is achieved by the third light-emitting layer provided in the third subpixel. In addition, the second peak wavelength is longer than the first peak wavelength, whereas the third peak wavelength is longer than the second peak wavelength. The wavelength of the light emitted by a luminescent material is slightly shifted to the lower wavelength side from the wavelength of the absorbed light. For example, the second fluorescent luminescent material absorbs the light having a wavelength within the wavelength range of the first fluorescent luminescent material and emits light having a wavelength corresponding to the second peak wavelength. The third luminescent material, for example, absorbs the light having a wavelength within the wavelength range of the second fluorescent luminescent material and emits light having a wavelength corresponding to the third peak wavelength. Hence, the PL emission spectrum of the first fluorescent luminescent material and the absorption spectrum of the third luminescent material are remote from each other in terms of wavelengths and overlap each other to so small a degree that there is little overlapping between the two above-mentioned spectra. Hence, no direct Förster transfer takes place from the first fluorescent luminescent material to the third luminescent material. The possible Förster transfer from the first fluorescent luminescent material to the third luminescent material is a 2-stage Förster transfer: firstly, from the first fluorescent luminescent material to the second fluorescent luminescent material; and secondly, from the second fluorescent luminescent material to the third luminescent material.

To put it differently, a direct Förster transfer does occur from the $S_1$ level of the first fluorescent luminescent material to the $S_1$ level of the second fluorescent luminescent material, but no direct Förster transfer occurs from the $S_1$ level of the first fluorescent luminescent material to the $S_1$ level of the third luminescent material. Hence, the first subpixel achieves an almost 100% light emission of the first light-emitting layer by generating excitons in the first light-emitting layer. In the second subpixel, the first light-emitting layer, the second light-emitting layer, and the third light-emitting layer are layered one upon another, but in the second subpixel, the distance between the second light-emitting layer and the third light-emitting layer is greater than the Förster radius, and thus the third light-emitting layer is located on the first electrode side or on the second electrode side closer than the first light-emitting layer and the second light-emitting layer. In addition, no direct Förster transfer occurs from the $S_1$ level of the first fluorescent luminescent material to the $S_1$ level of the third luminescent material. Hence, no exciton energy transfer occurs from the first light-emitting layer or the second light-emitting layer to the third light-emitting layer. On the other hand, the energy level of the second fluorescent luminescent material in the minimum excited singlet state is lower than the energy level of the first fluorescent luminescent material in the minimum excited singlet state. In addition, the distance between the first light-emitting layer and the second light-emitting layer is not greater than the Förster radius. In addition, the third light-emitting layer is located on the first electrode side or on the second electrode side closer than the first light-emitting layer and the second light-emitting layer and thus is not layered between the first light-emitting layer and the second light-emitting layer. Hence, within the second subpixel, excitons can be generated in the second light-emitting layer or in the first light-emitting layer. Accordingly, in a case where excitons are generated in the second light-emitting layer within the second subpixel, the second light-emitting layer achieves an almost 100% light emission. In an alternative case where excitons are generated in the first light-emitting layer within the second subpixel, a Förster-type energy transfer occurs and enables the second light-emitting layer to achieve an almost 100% light emission. In addition, according to the aspect of the disclosure, it is not necessary to form, separately, a color filter or a color conversion layer. Hence, according to the aspect of the disclosure, each subpixel can obtain its own luminescent color with a high efficiency without causing any color mixing or color shift to take place. As a result, a higher resolution can be achieved easily.

In addition, according to the aspect of the disclosure, the first subpixel, the second subpixel, and the third subpixel emit their respective lights having different peak wavelengths from one another. Hence, according to the aspect of the disclosure, unlike the case of the white CF technique, it is not necessary to make the blue light-emitting layer, the green light-emitting layer, and the red light-emitting layer emit light simultaneously. Accordingly, the power consumption at the time of driving the display apparatus can be reduced from the corresponding power consumption in a case of employing the white CF technique.

In addition, according to the aspect of the disclosure, the unnecessity of any color filters that would otherwise have to be separately provided reduces the manufacturing cost and eliminates the possible energy loss that would otherwise be caused by the use of the color filters.

According to the aspect of the disclosure, use of, for example, the red light-emitting layer as the common layer is allowed. In addition, in comparison to PTL 1, the aspect of the disclosure has a relatively high degree of freedom in order of layering the light-emitting layers and in the selection of the materials for the light-emitting layers. Even a change in order of layering the light-emitting layers or in the materials for the light-emitting layers does not cause the occurrence of color mixing or color shift. As a result, the light of each luminescent color is obtained with a high efficiency.

Hence, the aspect of the disclosure provides a display apparatus, along with a manufacturing method thereof, that is capable of: preventing color mixing or color shift from occurring in each subpixel; achieving a high efficiency in providing each luminescent color; and reducing the power consumption when driven and reducing the manufacturing cost from their respective counterparts of display apparatus of related art.

DESCRIPTION OF EMBODIMENTS

Hereinafter, embodiments of the disclosure will be described in detail.

First Embodiment

An embodiment of the disclosure is described below with reference to FIGS. 1 to 8.

Note that the following description is based on a case where the display apparatus according to the present embodiment is an organic EL display apparatus.

Schematic Configuration of Organic EL Display Apparatus

Figure 1:
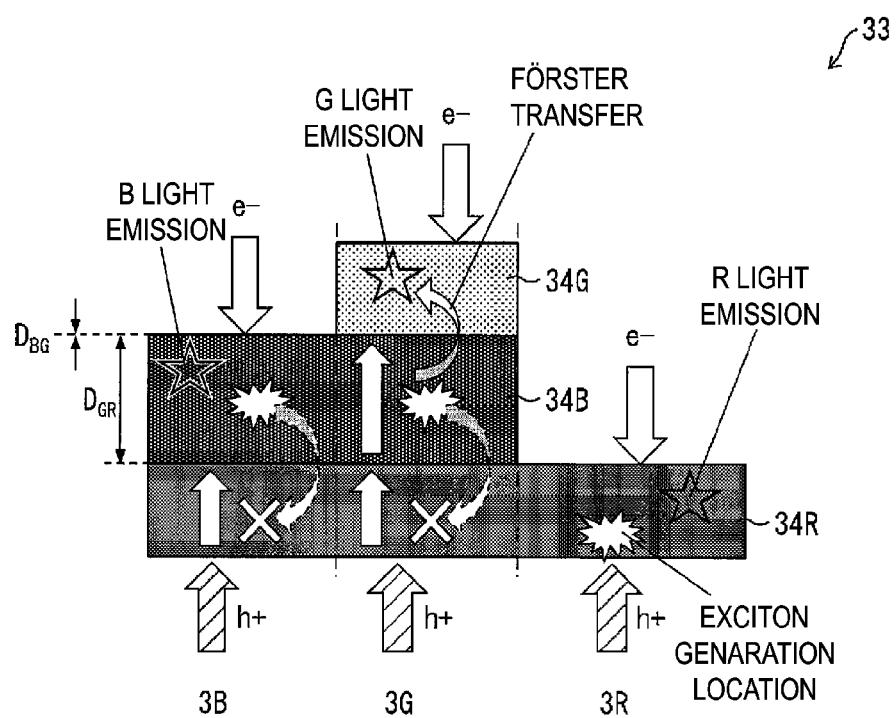
FIG. 1 is a diagram illustrating a schematic configuration of a light-emitting layer unit of an organic EL display apparatus and illustrating a principle of light emission by the light-emitting layer unit according to a first embodiment of the disclosure.
Figure 2A:
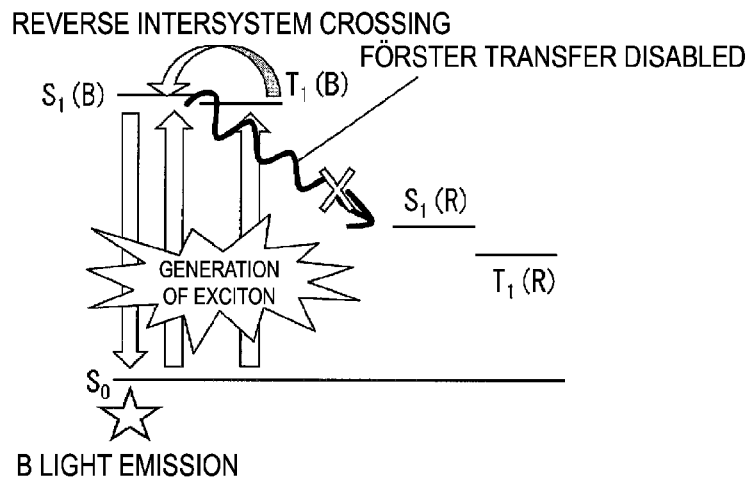
FIG. 2A is a diagram illustrating a principle of light emission in a blue subpixel of the organic EL display apparatus according to the first embodiment of the disclosure.
Figure 2B:
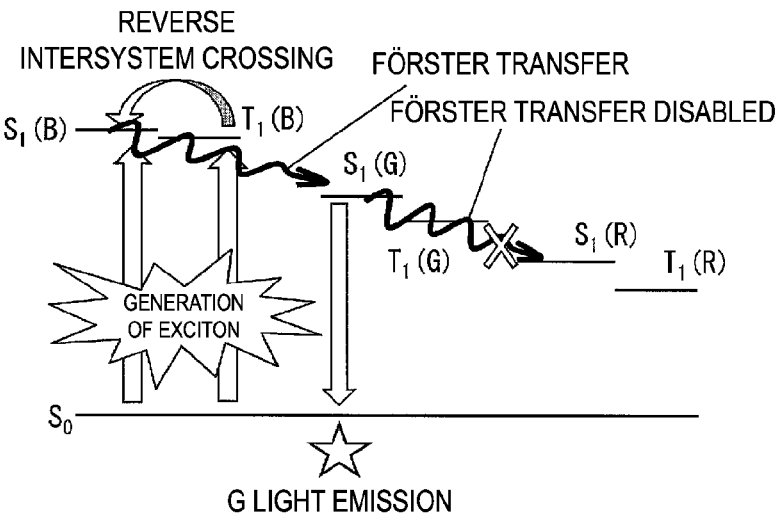
FIG. 2B is a diagram illustrating a principle of light emission in a green subpixel of the organic EL display apparatus according to the first embodiment of the disclosure.
Figure 2C:
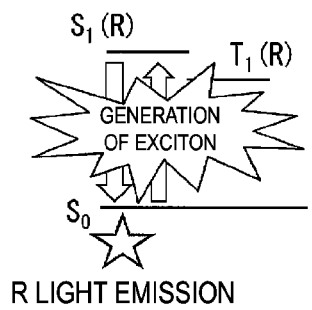
FIG. 2C is a diagram illustrating a principle of light emission in a red subpixel of the organic EL display apparatus according to the first embodiment of the disclosure.
Figure 3:
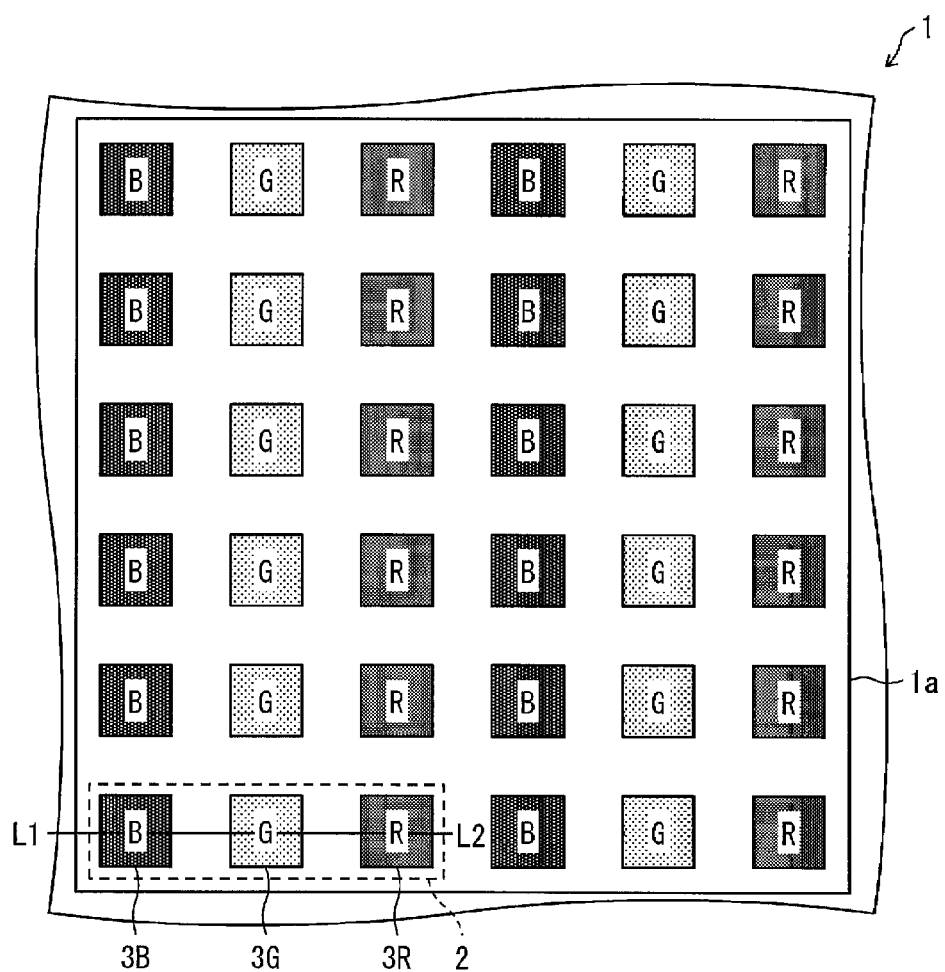
FIG. 3 is a diagram schematically illustrating a pixel arrangement of the organic EL display apparatus according to the first embodiment of the disclosure.
Figure 4:
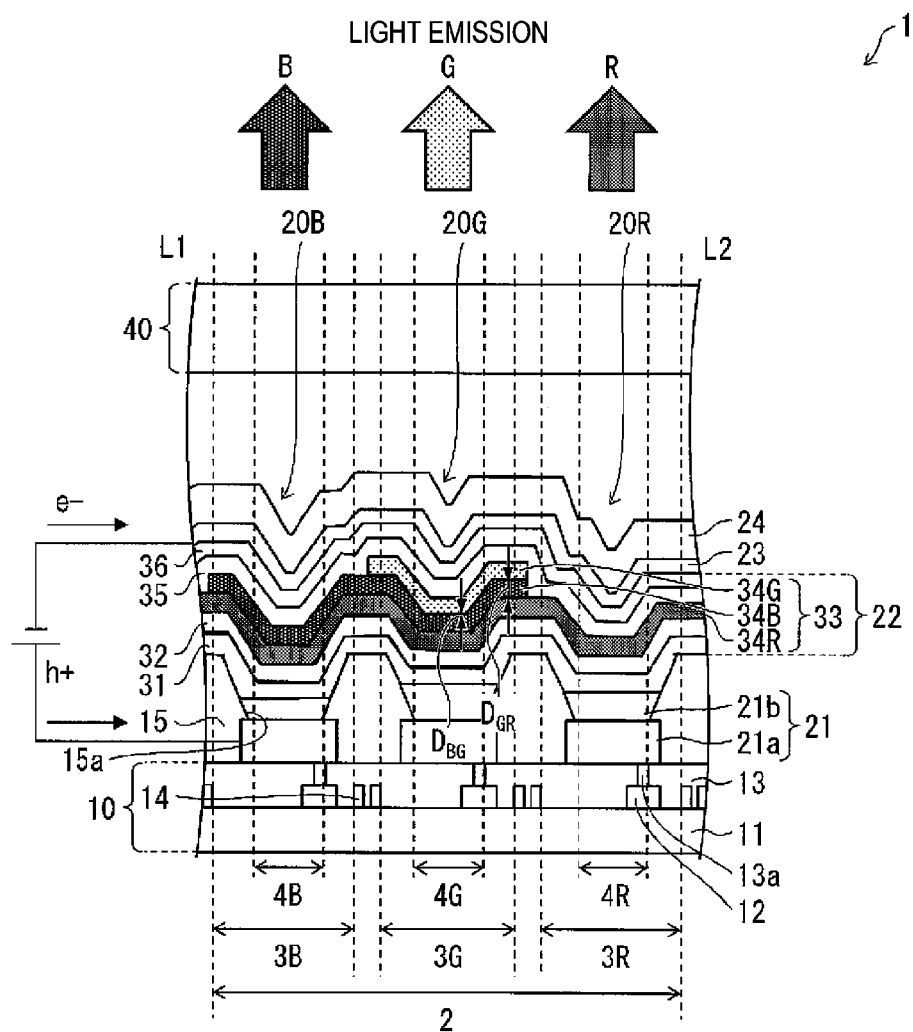
FIG. 4 is a cross-sectional view illustrating an example of a schematic configuration of the organic EL display apparatus according to the first embodiment of the disclosure.
Figure 5A:
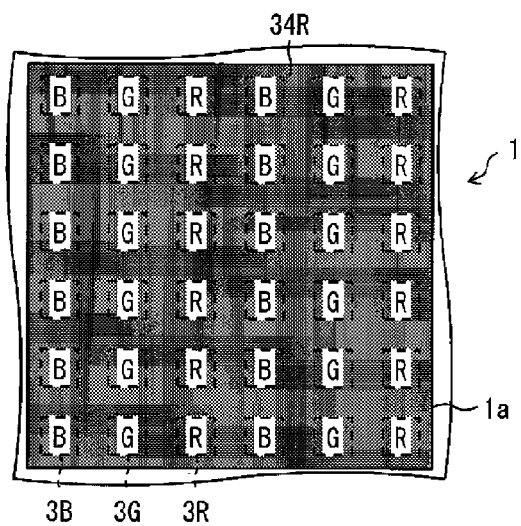
FIGS. 5A to 5C are plan views illustrating a method of layering a blue light-emitting layer, a green light-emitting layer, and a red light-emitting layer in the organic EL display apparatus according to the first embodiment of the disclosure, and the sequence from FIGS. 5A to 5C corresponds to the order of layering.
Figure 5B:
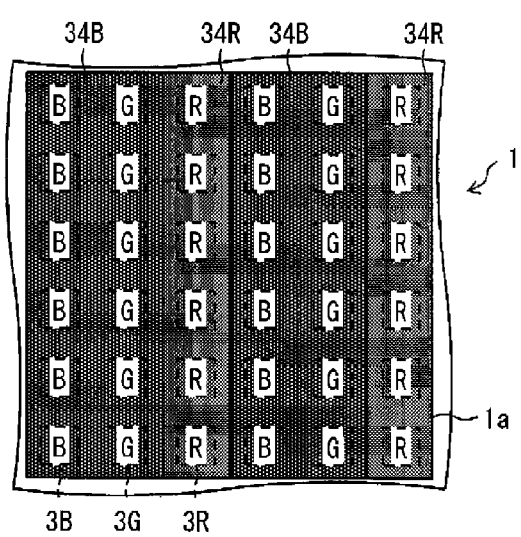
Figure 5C:
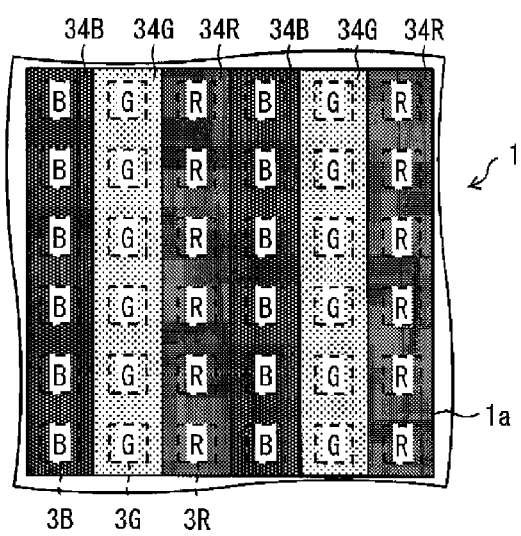

FIG. 1 is a diagram illustrating a schematic configuration of a light-emitting layer unit 33 of an organic EL display apparatus 1 and illustrating a principle of light emission by the light-emitting layer unit 33 according to the present embodiment. FIG. 2A is a diagram illustrating a principle of light emission in a subpixel 3B of the organic EL display apparatus 1 according to the present embodiment. FIG. 2B is a diagram illustrating a principle of light emission in a subpixel 3G of the organic EL display apparatus 1 according to the present embodiment. FIG. 2C is a diagram illustrating a principle of light emission in a subpixel 3R of the organic EL display apparatus 1 according to the present embodiment. FIG. 3 is a plan view schematically illustrating a pixel arrangement of the organic EL display apparatus 1 according to the present embodiment. FIG. 4 is a cross-sectional view illustrating an example of a schematic configuration of the organic EL display apparatus 1 according to the present embodiment. Note that the cross-sectional view of FIG. 4 illustrates an example of a schematic configuration of a single pixel area of the organic EL display apparatus 1 and corresponds to a cross section taken along the line L1-L2 in FIG. 3. FIGS. 5A to 5C are plan views illustrating a method of layering a blue light-emitting layer 34B, a green light-emitting layer 34G, and a red light-emitting layer 34R in the organic EL display apparatus 1 according to the present embodiment, and the sequence from FIGS. 5A to 5C corresponds to the order of layering.

As illustrated in FIG. 3, the organic EL display apparatus 1 according to the present embodiment includes a plurality of pixels 2 arranged in a matrix shape in a display region 1a. Note that in FIG. 3, for the convenience of illustration, the number of the pixels 2 is reduced.

As illustrated in FIG. 3 and FIG. 4, each of the pixels 2 (i.e., a single pixel) includes three subpixels 3B, 3G, and 3R. As illustrated in FIG. 3, the organic EL display apparatus 1 according to the present embodiment is an organic EL display apparatus with a pixel arrangement referred to as a "RGB-stripe arrangement," where the subpixels 3B, 3G, and 3R are arranged in a stripe pattern.

As illustrated in FIG. 4, each of the subpixels 3B includes an organic EL element 20B whose luminescent color is blue (B), each of the subpixels 3G includes an organic EL element 20G whose luminescent color is green (G), and each of the subpixels 3R includes an organic EL element 20R whose luminescent color is red (R).

Each of the subpixels 3B configured to display a first color—blue in this example—(referred also to as "first subpixels," and "blue subpixels") includes the organic EL element 20B whose luminescent color is blue and allows blue light to pass therethrough. Each of the subpixels 3G configured to display a second color—green in this example—(referred also to as "second subpixels," and "green subpixels") includes the organic EL element 20G whose luminescent color is green and allows green light to pass therethrough. Each of the subpixels 3R configured to display a third color—red in this example—(referred also to as "third subpixels," and "red subpixels") includes the organic EL element 20R whose luminescent color is red and allows red light to pass therethrough.

To make the following description simpler, the organic EL elements 20B, 20G, and 20R are collectively referred to simply as the "organic EL elements 20," unless it is necessary to distinguish the organic EL elements 20B, 20G, and 20R from one another. Likewise, the subpixels 3B, 3G, and 3R are collectively referred to simply as the "subpixel 3," unless it is necessary to distinguish the subpixels 3B, 3G, and 3R from one another.

As illustrated in FIG. 4, the organic EL display apparatus 1 has, for example, a configuration including a thin film transistor (TFT) substrate 10 (which may be simply referred to as the "substrate") and a sealing substrate 40 that are bonded together via an unillustrated sealing member. The plurality of organic EL elements 20 of each of the colors described above are formed on the TFT substrate 10.

The plurality of organic EL elements 20, each of which emits light of one of these colors, are enclosed between a pair of substrates including the TFT substrate 10 and the sealing substrate 40. For example, an unillustrated filler layer is formed between the TFT substrate 10 and the sealing substrate 40, that is, in a space where the organic EL elements 20 are layered one upon another. The following description will be based on a case where the TFT substrate 10 has a rectangular shape.

The organic EL display apparatus 1 according to the present embodiment is a top-emitting display apparatus that emits light from the sealing substrate 40 side. Details are described below.

Configuration of TFT Substrate 10

The TFT substrate 10 is a circuit substrate in which TFT circuits including TFTs 12 and wiring lines 14 are formed. The TFT substrate 10 serves as a support substrate and includes an unillustrated insulating substrate 11.

The insulating substrate 11 is not particularly limited as long as it has an insulating property. The insulating substrate 11 may be one of a variety of publicly known insulating substrates: e.g., inorganic substrates including a glass substrate, a quartz substrate, and the like; and plastic substrates including a substrate made from polyethylene terephthalate, polyimide resin, or the like.

Note that as described later, the description of the present embodiment is based on a case where the insulating substrate 11 is a transparent glass substrate (transparent substrate). In a case of a top-emitting organic EL element 20, however, the insulating substrate 11 does not have to be transparent. Hence, in a case where the organic EL display apparatus 1 is a top-emitting organic EL display apparatus as is the case with the present embodiment, the insulating substrate 11 may be an insulating substrate having no transparency (non-transparent substrate). Some examples of such non-transparent substrates are: a semiconductor substrate such as a silicon wafer; a substrate including a metal substrate made from aluminum (Al), iron (Fe), or the like, with its surface coated with an insulating material including silicon oxide, an organic insulating material, or the like; a substrate including a metal substrate made from Al or the like, with its surface subjected to an insulation treatment by a method such as an anode electrode oxidation and other methods.

A plurality of wiring lines 14 are formed on the insulating substrate 11. The plurality of wiring lines 14 includes: a plurality of gate lines formed in a horizontal direction; and a plurality of signal lines formed in a vertical direction and intersecting the gate lines. An interlayer insulating film 13 covers the wiring lines 14 and the TFTs 12. Unillustrated gate line drive circuits are connected to their corresponding gate lines to drive the gate lines. Unillustrated signal line drive circuits are connected to their corresponding signal lines to drive the signal lines.

On the TFT substrate 10, there are areas each of which is surrounded by the wiring lines 14. These areas are the locations where light emitting regions 4B of the organic EL elements 20B, light emitting regions 4G of the organic EL elements 20G, and light emitting regions 4R of the organic EL elements 20R are formed on a one-to-one basis. Hereinafter, the light emitting regions 4B, 4G, and 4R are collectively referred to simply as the "light emitting regions 4," unless it is necessary to distinguish the light emitting regions 4B, 4G, and 4R from one another.

Each area surrounded by the wiring lines 14 is the single subpixel 3 (dot). The light emitting region 4R, 4G, or 4B is defined for each subpixel 3.

Each subpixel 3 includes a plurality of TFTs 12 including a TFT serving as a drive transistor configured to supply a drive current to the organic EL element 20. The light emission intensity of each subpixel 3 is determined by scanning and selection by the wiring lines 14 and the TFTs 12. As described above, the organic EL display apparatus 1 displays images by selectively making each organic EL element 20 emit light of the desired luminance by the use of the TFTs 12.

Configuration of Organic EL Element 20

As illustrated in FIG. 4, each organic EL element 20 includes a first electrode 21, an organic EL layer 22, and a second electrode 23. The organic EL layer 22 is sandwiched by the first electrode 21 and the second electrode 23. In the present embodiment, the term "organic EL layer 22" refers collectively to the layers formed between the first electrode 21 and the second electrode 23.

The organic EL layer 22 is an organic layer including at least one function layer. The organic EL layer 22 in each organic EL element 20 includes the light-emitting layer unit 33 that includes at least one of the blue light-emitting layer 34B, the green light-emitting layer 34G, and the red light-emitting layer 34R. Hereinafter, the blue light-emitting layer 34B, the green light-emitting layer 34G, and the red light-emitting layer 34R are collectively referred to simply as the "light-emitting layers 34" unless it is necessary to distinguish the blue light-emitting layer 34B, the green light-emitting layer 34G, and the red light-emitting layer 34R from one another.

The first electrode 21, the organic EL layer 22, and the second electrode 23 are layered in this order from the side of the TFT substrate 10.

The first electrode 21 is formed in an island-like pattern for each subpixel 3. The end portions of the first electrode 21 are covered with bank 15 (partition, edge cover). The first electrode 21 is connected to the TFTs 12 through a contact hole 13a formed in the interlayer insulating film 13.

The bank 15 is an insulating layer and is made, for example, from a photosensitive resin. The bank 15 prevents a short-circuit between the first electrode 21 and the second electrode 23 from occurring even in a case where a concentration of electrodes occurs in an end portion of the first electrode 21 or even in a case where the organic EL layer 22 becomes thinner in an end portion of the first electrode 21. In addition, the bank 15 functions also as a pixel separation film configured to prevent electric current from leaking out from one subpixel 3 to an adjacent subpixel 3.

The bank 15 includes openings 15a, each of which corresponds to one of the subpixels 3. As illustrated in FIG. 4, each opening 15a allows a portion of the corresponding first electrode 21 and a portion of the corresponding organic EL layer 22 to be exposed. The exposed portions define the light emitting region 4 of the corresponding subpixel 3. The region other than the light emitting region 4 serves as a non-emissive region.

The second electrode 23 is a common electrode that is common to every subpixel 3. The second electrode 23 is a single electrode common to all the subpixels 3 of the pixel 2. This, however, is not the only possible configuration for the present embodiment. Alternatively, the second electrodes 23 may be formed individually for the subpixels 3.

A protection layer 24 is formed on and covers the second electrode 23. The protection layer 24 protects the second electrode 23 serving as the upper electrode and prevents external oxygen and moisture from infiltrating into each organic EL element 20. Note that the protection layer 24 covers the second electrode 23 of all the organic EL elements 20, and the protection layer 24 is a single layer common to all the organic EL elements 20. In the present embodiment, the first electrode 21, the organic EL layer 22, the second electrode 23, and the protection layer 24 (that is formed when necessary) formed in each subpixel 3 are collectively referred to as the "organic EL element 20."

First Electrode 21 and Second Electrode 23

The first electrode 21 and the second electrode 23 are a pair of electrodes. One of the first and second electrodes 21 and 23 functions as an anode electrode whereas the other one functions as a cathode electrode.

The anode electrode has only to have a function as an electrode configured to inject holes ($h^+$) into the light-emitting layer unit 33. On the other hand, the cathode electrode has only to have a function as an electrode configured to inject electrons (e⁻) into the light-emitting layer unit 33.

The shape, the structure, and the size of the anode electrode and those of the cathode electrode are not particularly limited and can be appropriately selected according to the application and purpose of the organic EL element 20.

As illustrated in FIG. 4, the description of the present embodiment is based on a case where the first electrodes 21 are provided as patterned anode electrodes and where the second electrodes 23 are provided as a single cathode electrode common to all the subpixels in each pixel 2. This, however, is not the only possible configuration for the present embodiment. Alternatively, the first electrodes 21 may be cathode electrodes and the second electrodes 23 may be anode electrodes. Assume that in a first case the first electrodes 21 are the anode electrodes and the second electrodes 23 are the cathode electrodes and that in a second case the first electrodes 21 are the cathode electrodes and the second electrodes 23 are the anode electrodes. Between the first case and the second case, the order of layering the function layers included in the light-emitting layer unit 33 or the carrier mobility of each of the function layers (carrier transport properties, that is, the hole transport properties and the electron transport properties) is reversed. Likewise, the material for the first electrodes 21 and the material for the second electrodes 23 are also reversed.

Electrode materials capable of being employed as the anode electrode and the cathode electrode are not particularly limited to a specific material, and, for example, known electrode materials may be employed thereto.

As the anode electrode, for example, metals such as gold (Au), platinum (Pt), and nickel (Ni), transparent electrode materials such as indium tin oxide (ITO), tin oxide ($SnO_2$), indium zinc oxide (IZO), gallium-added and zinc oxide (GZO) can be utilized.

On the other hand, it is preferable that a material having a small work function be used for the cathode electrode to inject electrons into the light-emitting layer 34. As the cathode electrode, for example, metals such as lithium (Li), calcium (Ca), cerium (Ce), barium (Ba), and aluminum (Al), or alloys such as Ag (silver)-Mg (magnesium) alloy and Al—Li alloy containing these metals can be utilized.

The thickness of the anode electrode and the thickness of the cathode electrode are not limited to specific thicknesses, and the thicknesses may be similar to the thicknesses of electrodes of related art.

The light generated by the light-emitting layer unit 33 is extracted through either one of the first electrode 21 or the second electrode 23. It is preferable that the electrode through which the light is extracted be a transparent or semi-transparent light-transmissive electrode made from a light-transmissive electrode material (i.e., a transparent electrode or a semi-transparent electrode), and that the electrode through which no light is extracted be either a reflective electrode made from a reflective electrode material or a reflective electrode including a reflective layer.

To put it differently, various kinds of conductive materials are used for the first electrodes 21 and the second electrodes 23. In a case where the organic EL display apparatus 1 is a top-emitting organic EL display apparatus as described above, the first electrodes 21 on the side where the TFT substrate 10, which is a support body configured to support the organic EL element 20, is located be made from a reflective electrode material. In addition, it is preferable that the second electrode 23 located on the opposite side of the organic EL element 20 from the first electrode 21 be made from either a transparent or a semi-transparent light-transmissive electrode material.

Each of the first electrode 21 and the second electrode 23 may have a single layer structure made from one electrode material or may have a layered structure made from a plurality of electrode materials.

Hence, in a case where the organic EL element 20 is a top-emitting organic EL element as described above, the first electrode 21 may have a layered structure including a reflective electrode 21a (reflective layer) and a light-transmissive electrode 21b as illustrated in FIG. 4. In the present embodiment, the first electrode 21 has a configuration where the reflective electrode 21a and the light-transmissive electrode 21b are layered in this order from the TFT substrate 10 side.

Exemplar reflective electrode materials include a black electrode material such as tantalum (Ta) or carbon (C), a reflective metal electrode material such as Al, Ag, gold (Au), Al—Li alloy, Al-neodymium (Nd) alloy, or Al-silicon (Si) alloy.

As the light-transmitting electrode material, for example, a transparent electrode material described above may be employed, or a translucent electrode material such as a thin film of Ag may be used.

The reflective electrode 21a having the same film thickness for each subpixel 3 is independently formed and is connected to the drain electrode of the TFT 12 in each subpixel 3.

The light-transmissive electrode 21b is formed to have an appropriate thickness in accordance with the peak wavelength of the light of the wavelength range of each color of the light emitted from each subpixel 3. The appropriate thickness allows the distance between the reflective electrode 21a and the second electrode 23 serving as the cathode electrode to be a distance that enhances the intensity of the peak wavelength of the light of the wavelength range of each color of the light emitted from each subpixel 3.

Organic EL Layer 22

As illustrated in FIG. 4, the organic EL layer 22 has a configuration including the following function layers: a hole injection layer 31, a hole transport layer 32; the light-emitting layer unit 33 including the light-emitting layer 34; an electron transport layer 35; and an electron injection layer 36. These function layers are layered in this order from the first electrode 21 side. The hole injection layer 31, the hole transport layer 32, the electron transport layer 35, and the electron injection layer 36 are formed across a plurality of pixels 2 as common layers, each of which is common to the plurality of pixels 2. Hence, the hole injection layer 31, the hole transport layer 32, the electron transport layer 35, and the electron injection layer 36 are formed to be common layers that are common to the subpixels 3B, 3G, and 3R.

It should be noted that the function layers other than the light-emitting layer unit 33 are not indispensable to the organic EL layer 22. Hence, each of these functional layers may be selectively formed in accordance with the properties that are required of the organic EL element 20. Each of the function layers mentioned above will be described below.

Light-Emitting Layer Unit 33

As illustrated in FIG. 1 and FIG. 4, the organic EL display apparatus 1 according to the present embodiment includes the light-emitting layer unit 33, which includes the red light-emitting layer 34R, the blue light-emitting layer 34B, and the green light-emitting layer 34G.

As illustrated in FIG. 5A, the red light-emitting layer 34R is formed, for example, in a solid-like manner all over the entire display region 1a across all the pixels 2 and is formed as a single common layer that is common to the subpixels 3B, 3G, and 3R (i.e., the organic EL elements 20B, 20G, and 20R) of all the pixels 2 (i.e., a common blue light-emitting layer). As illustrated in FIG. 5B, the blue light-emitting layers 34B are formed, for example, in a stripe-like manner across the subpixels 3B and 3G in a plurality of pixels 2 that are arranged in the column direction, and each of the blue light-emitting layers 34B is formed as a common layer (i.e., common blue light-emitting layer) that is common to the subpixels 3B and 3G of each pixel 2 (i.e., common to the organic EL elements 20B and 20G). As illustrated in FIG. 5C, the green light-emitting layers 34G are individual layers, and each of the green light-emitting layers 34G is formed only for the subpixel 3G in each pixel 2 (i.e., for the organic EL element 20G). The green light-emitting layers 34G are formed, for example, in a stripe-like manner across the subpixels 3G of a plurality of pixels 2 that are arranged in the column direction.

As illustrated in FIG. 1, FIG. 4, and FIGS. 5A to 5C, the light-emitting layer unit 33 according to the present embodiment has a configuration where in each pixel 2. the red light-emitting layer 34R, the blue light-emitting layer 34B, and the green light-emitting layer 34G are layered in this order from the first electrode 21 side and are adjacent each other.

Hence, in the present embodiment, in the subpixel 3B, between the first electrode 21 and the second electrode, the light-emitting layer unit 33 includes the red light-emitting layer 34R and the blue light-emitting layer 34B that are layered in this order from the first electrode 21 side and that are adjacent each other. In the subpixel 3G, between the first electrode 21 and the second electrode, the light-emitting layer unit 33 includes the red light-emitting layer 34R, the blue light-emitting layer 34B, and the green light-emitting layer 34G that are layered in this order from the first electrode 21 side, and that are adjacent one another. In the subpixel 3R, between the first electrode 21 and the second electrode, the light-emitting layer unit 33 includes only the red light-emitting layer 34R.

The blue light-emitting layer 34B includes, as a luminescent material (first luminescent material), a blue fluorescent luminescent material that emits blue light. The green light-emitting layer 34G includes, as a luminescent material (second luminescent material), a green fluorescent luminescent material that emits green light. The red light-emitting layer 34R includes, as a luminescent material (third luminescent material), a red fluorescent luminescent material that emits red light.

Figure 6:
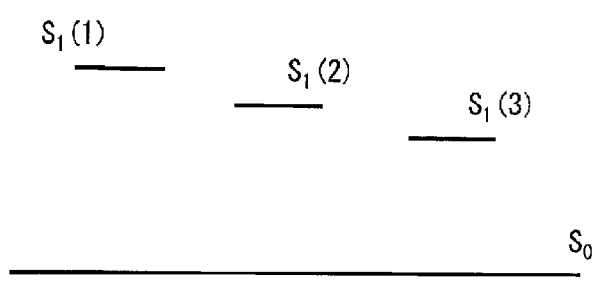
FIG. 6 is a diagram illustrating relations among the energy levels of a blue luminescent material, a green luminescent material, and a red luminescent material when these materials are in the minimum excited singlet state.

FIG. 6 is a diagram illustrating relations among the energy levels of a blue luminescent material, a green luminescent material, and a red luminescent material when these materials are in the minimum excited singlet state. (hereinafter, the energy level in the minimum excited singlet state is referred to as the "$S_1$ level"). In FIG. 6, $S_1(1)$ represents the $S_1$ level of the blue luminescent material, $S_1(2)$ represents the $S_1$ level of the green luminescent material, and $S_1(3)$ represents the $S_1$ level of the red luminescent material. Note that in FIG. 6, $S_0$ represents the singlet ground state.

As illustrated in FIG. 6, $S_1$ level of the green luminescent material ($S_1(2)$) is lower than $S_1$ level of the blue luminescent material ($S_1(1)$) whereas $S_1$ level of the red luminescent material ($S_1(3)$) is lower than $S_1$ level of the green luminescent material ($S_1(2)$). To put it differently, $S_1$ level of the green fluorescent luminescent material is lower than $S_1$ level of the blue fluorescent luminescent material whereas $S_1$ level of the red fluorescent luminescent material ($S_1(3)$) is lower than $S_1$ level of the green fluorescent luminescent material ($S_1(2)$).

Figure 7:
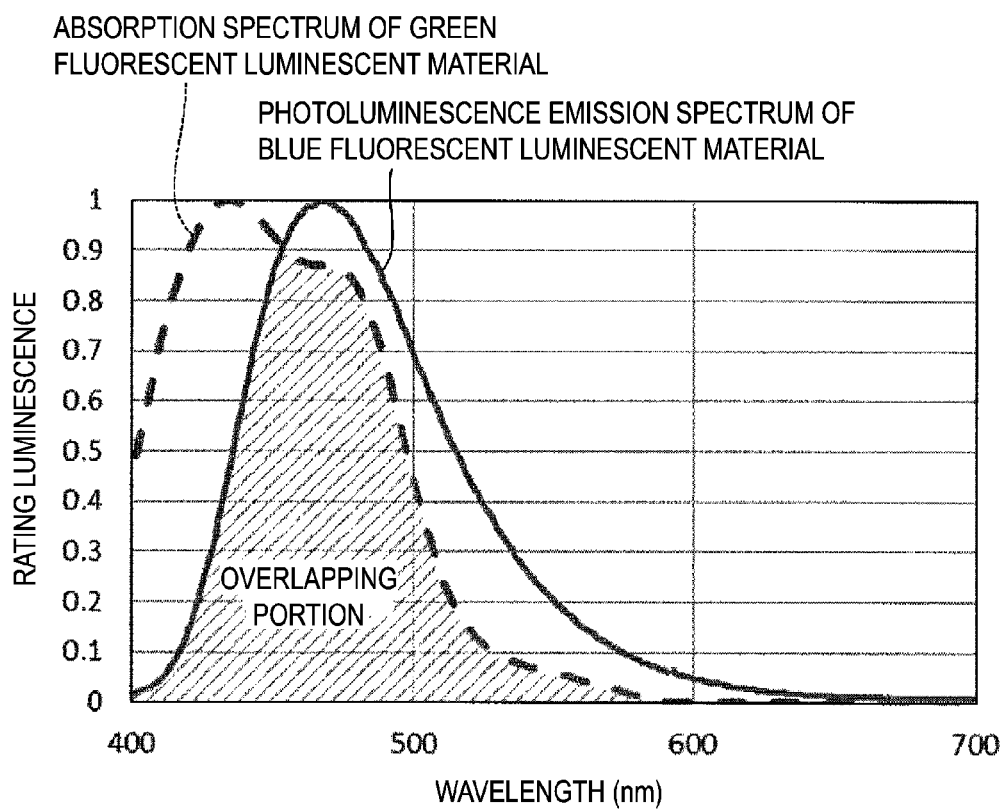
FIG. 7 is a graph showing both an exemplar photoluminescence emission spectrum of a blue fluorescent luminescent material used in the first embodiment of the disclosure and an exemplar absorption spectrum of a green fluorescent luminescent material used in the first embodiment of the disclosure.

FIG. 7 is a graph showing both an exemplar photoluminescence (PL) emission spectrum of a blue fluorescent luminescent material and an exemplar absorption spectrum of a green fluorescent luminescent material.

Note that FIG. 7 illustrates the PL emission spectrum of 2,5,8,11-tetra-tert-butylperylene (TBP) as the PL emission spectrum of the blue fluorescent luminescent material and also illustrates the absorption spectrum of 2,3-(2-benzothiazolyl)-7-(diethylamino) coumarin (coumarin 6) as the absorption spectrum of the green fluorescent luminescent material.

In a case where the light-emitting layer unit 33 has a layered structure such as one illustrated in FIG. 1 and FIG. 4, it is preferable that a part of the PL emission spectrum of the blue luminescent material (the blue fluorescent luminescent material in the present embodiment) overlap a part of the absorption spectrum of the green luminescent material (the green fluorescent luminescent material in the present embodiment), as illustrated in FIG. 7.

The overlapping between a part of the PL emission spectrum of the blue luminescent material and a part of the absorption spectrum of the green luminescent material allows the energy transfer from the blue luminescent material to the green luminescent material to occur more easily.

As illustrated in FIG. 1, the blue light-emitting layer 34B and the green light-emitting layer 34G are in a direct contact with each other in each of the subpixels 3G and 3B. Hence, in the subpixels 3G and 3B the distance between the blue light-emitting layer 34B and the green light-emitting layer 34G (i.e., the distance $D_{BG}$ between mutually opposing surfaces of the blue light-emitting layer 34B and the green light-emitting layer 34G) is not greater than Förster radius.

Förster radius refers to the distance between mutually-adjacent light-emitting layers 34 (specifically, in the mutually adjacent light-emitting layers 34, the distance between the two mutually opposing surfaces that are most closely adjacent each other) that may cause Förster transfer to occur. The greater the degree of overlapping between the photoluminescence (PL) emission spectrum of the luminescent material included in a first one of the mutually adjacent light-emitting layers 34 and the absorption spectrum of the luminescent material included in a second one of the mutually adjacent light-emitting layer 34, the greater the Förster radius. In contrast, the smaller degree of overlapping, the smaller the Förster radius. It is commonly understood that Förster radius ranges from 1 to 10 nm, approximately.

Note that Förster transfer refers to an energy transfer between the mutually adjacent light-emitting layers 34, specifically from singlet excitons having higher energy levels exciting molecules having lower energy levels in the singlet ground state.

Note that this Förster transfer occurs in a case where the mutually adjacent light-emitting layers 34 exist within the Förster radius. In addition, in a case where all of three or more mutually adjacent light-emitting layers 34 exist within the Förster radius, a plurality of Förster transfers occur in a step-like manner among the three or more mutually adjacent light-emitting layers 34 making the singlet excitons having higher energy levels excite the molecules having lower energy levels in the singlet ground state.

As illustrated in FIG. 6, $S_1(1)$ is higher than $S_1(2)$, and $S_1(2)$ is higher than $S_1(3)$ (i.e., $S_1(1) > S_1(2) > S_1(3)$). Hence, an energy transfer is more likely to occur from the blue luminescent material to the green luminescent material, and from the green luminescent material to the red luminescent material.

Figure 8:
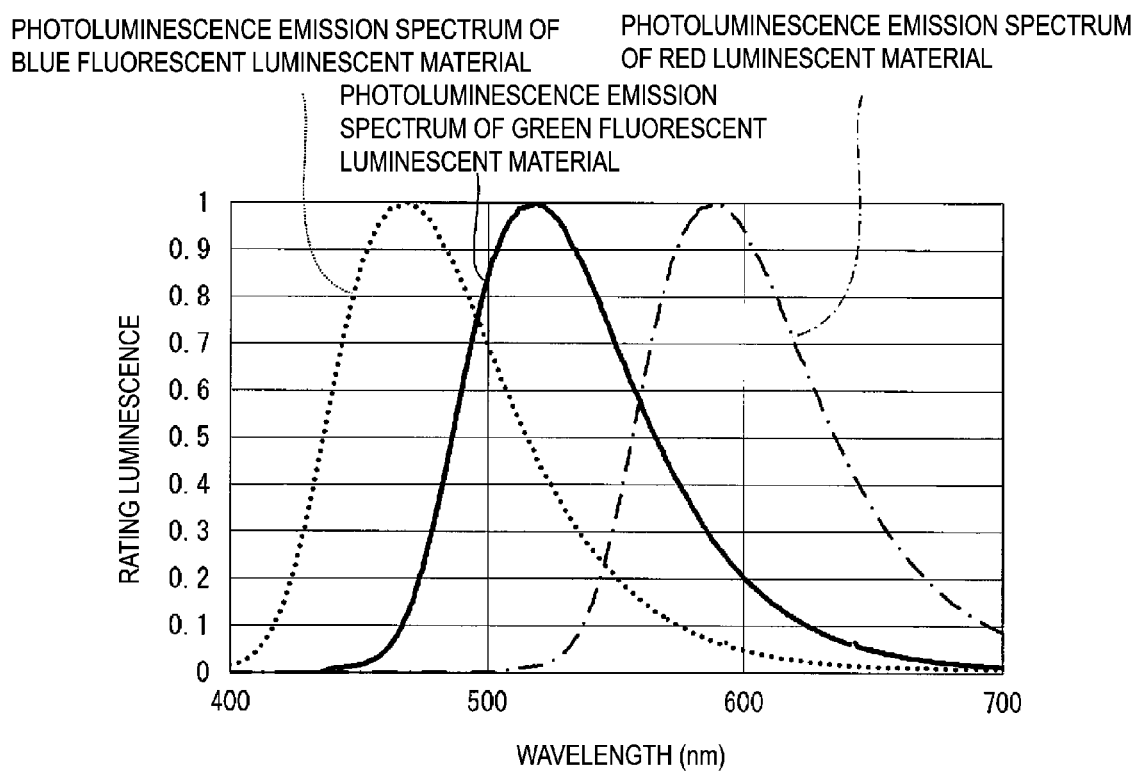
FIG. 8 is a graph showing an exemplar photoluminescence emission spectrum of the blue fluorescent luminescent material, an exemplar photoluminescence emission spectrum of the green fluorescent luminescent material, and an exemplar photoluminescence emission spectrum of a red fluorescent luminescent material.

FIG. 8 is a graph showing an exemplar PL emission spectrum of a blue fluorescent luminescent material, an exemplar PL emission spectrum of a green fluorescent luminescent material, and an exemplar PL emission spectrum of a red fluorescent luminescent material.

Note that in FIG. 8, the PL emission spectrum of a blue fluorescent luminescent material is the PL emission spectrum of TBPe, the PL emission spectrum of a green fluorescent luminescent material is the PL emission spectrum of coumarin 6, and the PL emission spectrum of a red fluorescent luminescent material is the PL emission spectrum of Ir(piq)3.

As illustrated in FIG. 8, the blue fluorescent luminescent material has a peak wavelength (first peak wavelength) of approximately 470 nm, the green fluorescent luminescent material has a peak wavelength (second peak wavelength) of approximately 520 nm, and the red fluorescent luminescent material has a peak wavelength (third peak wavelength) of approximately 590 nm.

As described above, the green luminescent material emits light having a longer peak wavelength than the peak wavelength in the PL emission spectrum of the blue luminescent material. In addition, the red luminescent material emits light having a longer peak wavelength than the peak wavelength in the PL emission spectrum of the green luminescent material. The wavelength of the light emitted by the luminescent material is shorter than the wavelength of the absorbed light. Specifically, the green luminescent material absorbs light having a wavelength within the blue wavelength range and emits green light, whereas the red luminescent material absorbs light having a wavelength within the green wavelength range and emits red light. Hence, the PL emission spectrum of the blue luminescent material and the absorption spectrum of the red luminescent material are remote from each other in terms of wavelengths and overlap each other to so small a degree that there is little overlapping between the two above-mentioned spectra. Hence, no direct Förster transfer takes place from the blue luminescent material to the red luminescent material. The possible Förster transfer from the blue luminescent material to the red luminescent material is a 2-stage Förster transfer: firstly, from the blue luminescent material to the green luminescent material; and secondly, from the green luminescent material to the red luminescent material.

To put it differently, a direct Förster transfer does occur from the $S_1$ level of the blue luminescent material to the $S_1$ level of the green luminescent material, but no direct Förster transfer occurs from the $S_1$ level of the blue luminescent material to the $S_1$ level of the red luminescent material. Note that the illustration in FIG. 8 and the associated description are based on a case of fluorescent luminescent materials, but even in a case where phosphorescent luminescent materials are used as the luminescent materials, similar phenomena can be observed.

In the present embodiment, a direct Förster transfer does occur from the $S_1$ level of the blue fluorescent luminescent material in the subpixel 3G to the $S_1$ level of the green fluorescent luminescent material, but no Förster transfer occurs from the $S_1$ level of the blue fluorescent luminescent material in the subpixels 3B and 3G to the $S_1$ level of the red fluorescent luminescent material. To put it differently, in the present embodiment, in a case where excitons are generated in the blue light-emitting layer 34B within the subpixel 3G, a Förster transfer does occur from the blue light-emitting layer 34B to the green light-emitting layer 34G, but no Förster transfer occurs from the blue light-emitting layer 34B to the red light-emitting layer 34R. In addition, in the case where excitons are generated in the blue light-emitting layer 34B within the subpixel 3B, no Förster transfer occurs from the blue light-emitting layer 34B to the red light-emitting layer 34R.

As will be understood in view of the foregoing description, through there is no particularly limited combination of a blue luminescent material and a red luminescent material, it is preferable that a blue luminescent material and a red luminescent material be combined to allow the PL emission spectrum of the blue luminescent material and the absorption spectrum of the red luminescent material to leave as small an overlap as possible. In addition, it is more preferable that a blue luminescent material and a red luminescent material be combined to allow the PL emission spectrum of the blue luminescent material and the absorption spectrum of the red luminescent material to leave no overlap at all.

In addition, as described earlier, in the organic EL display apparatus 1, the subpixel 3G includes the red light-emitting layer 34R whose luminescent material is a red luminescent material having a lower energy level than the energy level of the green luminescent material. As described earlier, the energy transfer from the green luminescent material to the red luminescent material is more likely to occur, and the red luminescent material absorbs light having a wavelength within the green wavelength range and emits red light. Hence, a part of the PL emission spectrum of the green luminescent material overlaps a part of the absorption spectrum of the red luminescent material. Hence, in the organic EL display apparatus, it is necessary to prevent the energy from being transferred from the green light-emitting layer 34G to the red light-emitting layer 34R within the subpixel 3G. Accordingly, in the subpixel 3G, the distance between the green light-emitting layer 34G and the red light-emitting layer 34R (i.e., the distance $D_{GR}$ between mutually opposing surfaces of the green light-emitting layer 34G and the red light-emitting layer 34R) needs to be made greater than Förster radius.

The Förster radius is commonly 1 to 10 nm, approximately. Hence, in a case where the two mutually opposing surfaces of the two light-emitting layers 34 are separated from each other by a distance that is greater than 10 nm, no Förster transfer occurs.

In addition, in a case where the two mutually opposing surfaces of the two light-emitting layers 34 are separated from each other by a distance that is greater than 15 nm, even a total overlapping between the PL emission spectrum and the absorption spectrum of the luminescent materials of the two light-emitting layers 34 can cause no Förster transfer between the two light-emitting layers 34. Accordingly, it is preferable that at least 15-nm distance DGR be secured between the green light-emitting layer 34G and the red light-emitting layer 34R in the subpixel 3G. In the present embodiment, the blue light-emitting layer 34B is the only member that is formed between the green light-emitting layer 34G and the red light-emitting layer 34R. Hence, the blue light-emitting layer 34B is configured to have a layer thickness that is greater than the Förster radius. Accordingly, it is preferable that the blue light-emitting layer 34B have at least 15-nm layer thickness.

Note that the layer thickness of the red light-emitting layer 34R and the layer thickness of the green light-emitting layer 34G may be configured as those in cases of related art and are not limited to particular ones.

In addition, each light-emitting layer 34 may be made from two components: a host material in charge of the transportation of the carriers (holes and electrons); and a luminescent dopant (guest) material serving as a luminescent material in charge of the light emission. Alternatively, each light-emitting layer 34 may be made from a luminescent material alone.

Of all the materials (components) of the light-emitting layer 34, the material having the highest content percentage may be the host material or may be the luminescent material.

The host material is a material into which holes and electrons can be injected. The host material has a function to transport the holes and the electrons, makes the holes and the electrons recombine with each other within the molecules of the host material, and thus makes the luminous material emit light. In a case where a host material is used, the luminescent material is dispersed uniformly within the host material.

In the case where a host material is used, the host material to be used is an organic compound having a higher $S_1$ level and/or a higher energy level in the minimum excited triplet state (hereinafter referred to as the "$T_1$ level") than that of the luminescent material. Thus, the host material can trap the energy of the luminescent material within the luminescent material and thus can enhance the luminous efficiency by the luminescent material.

Each subpixel 3 having a layering structure according to the present embodiment is intended to efficiently emit the light of the luminescent color that is to be displayed. To this end, it is preferable that the material having the highest content percentage of all the materials for the blue light-emitting layer 34B or, desirably, all the materials for the blue light-emitting layer 34B be a material or materials allowing the carriers to flow from the first electrode 21 and the second electrode 23 towards the green light-emitting layer 34G within the subpixel 3G. The preferable transfer of the holes ($h^+$) and the electrons ($e^-$) is indicated by the arrows in FIG. 1. Note that for this transfer, it is desirable to use a hole-transport material having a hole mobility that is higher than its electron mobility.

In addition, it is preferable that the material having the highest content percentage of all the materials for the red light-emitting layer 34R or, desirably, all the materials for the red light-emitting layer 34R be a material or materials allowing the carriers to flow from the first electrode 21 and the second electrode 23 towards the blue light-emitting layer 34B in the subpixel 3B (or both subpixels 3B and 3G if the fact that the layering structure of the subpixel 3B and the layering structure of the subpixel 3G are identical is taken into consideration). It should be noted that as described earlier, the material having the highest content percentage of all the materials for the blue light-emitting layer 34B or, desirably, all the materials for the blue light-emitting layer 34B is a material or are materials allowing the carriers to flow from the first electrode 21 and the second electrode 23 towards the green light-emitting layer 34G within the subpixel 3G. Hence, the material having the highest content percentage of all the materials for the red light-emitting layer 34R or, desirably, all the materials for the red light-emitting layer 34R at least has to be a material or have to be materials allowing the carriers from the first electrode 21 and the second electrode 23 towards at least the blue light-emitting layer 34B. Accordingly, it is preferable that the material having the highest content percentage of all the materials for the red light-emitting layer 34R or, desirably, all the materials for the red light-emitting layer 34R be a hole-transport material or hole-transport materials. Alternatively, it is preferable that the red light-emitting layer 34R as a whole exhibit high bipolar transport properties, that is, exhibit both high hole transport properties and high electron transport properties. Of the two options, the bipolar transport properties are more desirable. Note that in a case where the red light-emitting layer 34R exhibits bipolar transport properties, each of the materials contained in the red light-emitting layer 34R may be a material that exhibits the bipolar transport properties by itself. Alternatively, the red light-emitting layer 34R may use a combination of two or more kinds of materials to give bipolar transport properties to the red light-emitting layer 34R. In this case, one material should exhibit high hole transport properties having a higher hole mobility than its electron mobility, and another material should exhibit high electron transport properties having a higher electron mobility than its hole mobility.

The carrier mobilities of each material for the green light-emitting layer 34G are not particularly limited, but it is preferable that the material having the highest combination ratio of all the materials for the green light-emitting layer 34G or preferably all the materials for the green light-emitting layer 34G be either a material or materials exhibiting electron transport properties or bipolar transport properties, and it is more preferable that such a material or materials be an electron-transport material or electron-transport materials. This is because of the following reasons.

By taking into account the recent development situation in the organic EL display apparatus industry, host materials exhibiting better electron transport properties are easier to be synthesized than the host materials exhibiting better hole transport properties. In addition, there are more types of the former host materials than the latter host materials. In this sense, the development of the former host materials has progressed much further than the latter host materials. Hence, selecting an electron-transport material, not a hole-transport material, as the host material allows a material having good properties to be obtained easily.

In fact, electron-transport materials exhibiting very high electron mobilities are better known than hole-transport materials exhibiting very high hole mobilities. For example, of those host materials available in the market, not the ones exhibiting better hole transport properties but the ones exhibiting better electron transport properties are the ones that tend to be driven at lower voltages easily. Hence, a low-voltage driving is more likely to be achieved by the use of the host material exhibiting good electron transport properties than by the use of the host material exhibiting good hole transport properties.

Some examples of the host materials exhibiting better hole transport properties are hole-transport materials such as 4,4'-bis[N-phenyl-N-(3"-methylphenyl)amino]biphenyl (TPD), 9,10-di(2-naphthyl)anthracene(ADN), 1,3-bis(carbazole-9-yl)benzene(mCP), and 3,3'-di(9H-carbazole-9-yl)biphenyl(mCBP). Some examples of the host materials exhibiting better electron transport properties are electron-transport materials such as 2,9-dimethyl-4,7-diphenyl-1,10-phenanthroline(BCP), bis[(2-diphenylphosphoryl)phenyl]ether(DPEPO), 4,4'-bis(2,2-diphenylvinyl)-1,1'-biphenyl (DPVBi), 2,2',2"-(1,3,5-benzinetolyl)-tris(1-phenyl-1-H-benzimidazolyl)(TPBi), and bis(2-methyl-8-quinolinoleate)-4-(phenylphenolate)aluminum(BAlq). Some examples of the host materials exhibiting better bipolar transport properties are bipolar transport materials such as 4,4'-bis(9-carbazoyl)-biphenyl(CBP).

Some examples of the blue fluorescent luminescent materials are fluorescent luminescent materials emitting blue light such as 2,5,8,11-tetra-tert-butylperylene(TBPe), bis[4-

(9,9-dimethyl-9,10-dihydroacridine)phenyl]sulfone (DMAC-DPS), perylene, and 4,5-bis(carbazole-9-yl)-1,2-dicyanobenzene(2CzPN).

Some examples of the green fluorescent luminescent materials are: 3-(2-benzothiazolyl)-7-(diethylamino)coumarin (coumarin6), 8-hydroxyquinoline aluminum(Alq3), 1,2,3,5-tetrakis(carbazole-9-yl)-4,6-dicyanobenzene(4Cz-IPN), 1,2,3,4-tetrakis(carbazole-9-yl)-5,6-dicyanobenzene (4CzPN), and PXZ-DPS represented by the following formula:

[Chemical Formula 1]

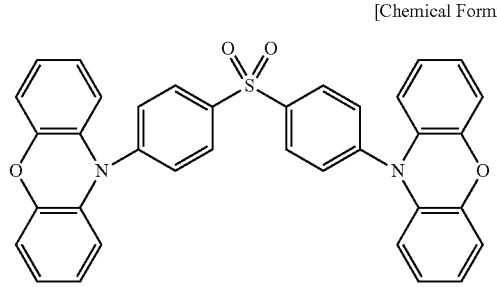

These materials are preferably used.

Some examples of the red fluorescent luminescent materials are: tetraphenyl-dibenzo-periflanthen (DBP), and (E)-2-{2-[4-(dimethylamino)styryl]-6-methyl-4H-pyran-4-ylidene}malononitrile (DCM).

In addition, it is preferable that the blue fluorescent luminescent materials and the red fluorescent luminescent materials be thermally activated delayed fluorescence (TADF) materials. In addition, the green fluorescent luminescent materials may be TADF materials.

A TADF material is a material in which a minimum excited singlet state can be generated by reverse intersystem crossing from minimum excited triplet state by thermal activation. In addition, a TADF material is a delayed fluorescent material that has an extremely small energy difference $\Delta E_{ST}$ between the $S_1$ level and the $T_1$ level. Use of a delayed fluorescent material that has an extremely small energy difference $\Delta E_{ST}$ between the $S_1$ level and the $T_1$ level as the luminescent material makes the thermal energy to cause reverse intersystem crossing from the $T_1$ level to the $S_1$ level. Use of the delayed fluorescence by the TADF material allows even the fluorescence emission to enhance the internal quantum efficiency even up to 100% theoretically. A smaller $\Delta E_{ST}$ results in the easier occurrence of a reverse intersystem crossing from the minimum excited triplet state to the minimum excited singlet state. An energy difference $\Delta E_{ST}$ of 0.3 eV or smaller allows a reverse intersystem crossing to occur relatively easily even at the room temperature.

Some examples of the TADF materials emitting blue light are 2CzPN and DMAC-DPS mentioned above. Some examples of the TADF materials emitting green light are 4CzIPN, 4CzPN, and PXZ-DPS mentioned above.

Some examples of the TADF materials emitting red light are PPZ-DPO represented by the following formula:

[Chemical Formula 2]

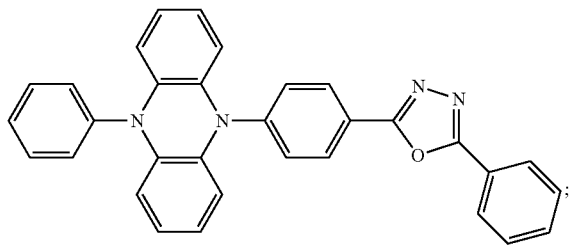

PPZ-DPS represented by the following formula:

[Chemical Formula 3]

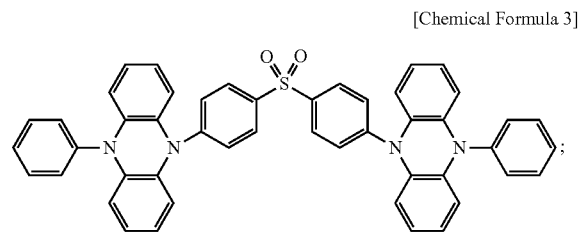 [SMILES: O=S(=O)(c1ccc(N2c3ccccc3N(c3ccccc3)c3ccccc32)cc1)c1ccc(N2c3ccccc3N(c3ccccc3)c3ccccc32)cc1]

and 4CzTPN-Ph represented by the following formula:

[Chemical Formula 4]

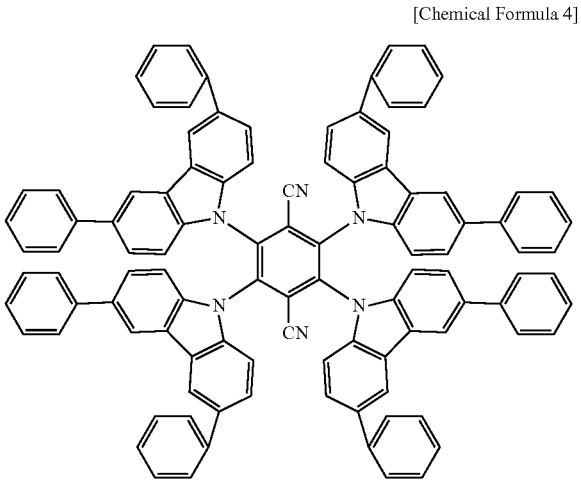 [SMILES: N#Cc1c(-n2c3ccc(-c4ccccc4)cc3c3cc(-c4ccccc4)ccc32)c(-n2c3ccc(-c4ccccc4)cc3c3cc(-c4ccccc4)ccc32)c(C#N)c(-n2c3ccc(-c4ccccc4)cc3c3cc(-c4ccccc4)ccc32)c1-n1c2ccc(-c3ccccc3)cc2c2cc(-c3ccccc3)ccc21]

These materials are preferably used.

Hole Injection Layer 31 and Hole Transport Layer 32

The hole injection layer 31 includes a hole-injection material and has a function to increase the hole injection efficiency to the light-emitting layer 34. The hole injection layer 31 and the hole transport layer 32 may be formed as mutually independent layers or may be integrated together as a hole injection-cum-transport layer. It is not necessary that both the hole injection layer 31 and the hole transport layer 32 be provided. Only one of the hole injection layer 31 or the hole transport layer 32 (e.g., only the hole transport layer 32) may be provided.

A known material can be used as a material for the hole injection layer 31, the hole transport layer 32, or the hole injection-cum-transport layer, that is, as a hole-injection material or as a hole-transport material.

Examples of the material include open chain or heterocyclic conjugated monomers, oligomers, or polymers of naphthalene, anthracene, azatriphenylene, fluorenone, hydrazone, stilbene, triphenylene, benzine, styrylamine, triphenylamine, porphyrins, triazole, imidazole, oxadiazole, oxazole, polyarylalkane, phenylenediamine, arylamine, and derivative thereof, a thiophene-based compound, a polysilane-based compound, a vinyl carbazole-based compound, and an aniline-based compound. Specifically, N,N'-di(naphthalen-1-yl)-N,N'-diphenyl-benzidine (α-NPD), 2,3,6,7,10, 11-hexacyano-1,4,5,8,9,12-hexaazatriphenylene (HAT-CN), 1,3-bis(carbazol-9-yl)benzene (mCP), di[4-(N,N-ditolyl-amino)-phenyl]cyclohexane (TAPC), 9,10-diphenylanthracene-2-sulfonate (DPAS), N,N'-diphenyl-N,N'-(4-(di(3-tolyl)amino)phenyl)-1,1'-biphenyl-4,4'-diamine (DNTPD), iridium (III) tris[N,N'-diphenylbenzimidazol-2-ylidene-C2, C2'](Ir(dpbic)$_3$), 4,4',4"'-tris-(N-carbazolyl)-triphenylamine (TCTA), 2,2-bis(p-trimellitic oxyphenyl)propanoic anhydride (BTPD), bis[4-(p,p-ditolylamino)phenyl]diphenylsilane (DTASi), or the like is used.

For the hole injection layer 31, the hole transport layer 32, or the hole injection-cum-transport layer, an intrinsic hole-injection material or an intrinsic hole-transport material that is not doped with an impurity may be used. Alternatively, the material may be doped with an impurity to enhance the electrical conductivity, or for the like reasons.

To obtain highly-efficient light emission, it is desirable that the excitation energy be trapped within the light-emitting layer unit 33, in particular within the light-emitting layer 34 in the light-emitting layer unit 33. Hence, it is desirable to use, as the hole-injection material and the hole-transport material, a material having an $S_1$ level and a $T_1$ level that are excitation levels higher than the $S_1$ level and the $T_1$ level of the luminescent material in the light-emitting layer 34. Hence, it is more preferable to select a material having a high excitation level and a high hole mobility as the hole-injection material and the hole-transport material.

Electron Transport Layer 35 and Electron Injection Layer 36

The electron injection layer 36 includes an electron-injection material and has a function to increase the electrode injection efficiency to the light-emitting layer 34.

The electron transport layer 35 includes an electron-transport material and has a function to increase the electron transport efficiency to the light-emitting layer 34.

The electron injection layer 36 and the electron transport layer 35 may be formed as mutually independent layers or may be integrated together as an electron injection-cum-transport layer. It is not necessary that both the electron injection layer 36 and the electron transport layer 35 be provided. Only one of the electron injection layer 36 or the electron transport layer 35, for example, only the electron transport layer 35 may be provided. Needless to say, neither the electron injection layer 36 nor the electron transport layer 35 may be provided.

As a material for the electron injection layer 36, the electron transport layer 35, or the electron injection-cum-transport layer, that is, a material used as the electron-injection material or the electron-transport material, a known material can be used.

Some examples of such materials include quinoline, perylene, phenanthroline, bisstyryl, pyrazine, triazole, oxazole, oxadiazole, fluorenone, and derivatives and metal complexes thereof; and lithium fluoride (LiF).

More specific examples thereof include bis[(2-diphenylphosphoryl)phenyl]ether (DPEPO), 4,7-diphenyl-1,10-phenanthroline (Bphen), 3,3'-bis(9H-carbazole-9-yl)biphenyl (mCBP), 2,9-dimethyl-4,7-diphenyl-1,10-phenanthroline (BCP), 1,3,5-tris(N-phenylbenzoimidazole-2-yl)benzene (TPBI), 3-phenyl-4(1'-naphthyl)-5-phenyl-1,2,4-triazole (TAZ), 1,10-phenanthroline, Alq(tris(8-hydroxyquinoline) aluminum), LiF, and the like.

Protection Layer 24

The protection layer 24 is made from a transparent insulating material or a transparent conductive material. Some examples of the materials for the protection layer 24 include: inorganic insulating materials such as silicon nitride (SiN), silicon oxide (SiO), silicon oxynitride (SiON), and aluminum oxide ($Al_2O_3$); and conductive materials such as ITO. Note that the protection layer 24 may have a layered structure including both an inorganic insulating layer and an organic insulating layer. Some examples of organic insulating materials that can be used for the organic insulating layer include polysiloxane, silicon oxide carbide (SiOC), acrylate, polyurea, parylene, polyimide, and polyamide.

The thickness of the protection layer 24 is not limited to a particular thickness and may be set, appropriately depending on the material for the protection layer, to a thickness that allows the protection layer 24 to prevent external oxygen and moisture from infiltrating into the organic EL element 20.

Sealing Substrate 40

An insulating substrate, such as a glass substrate and a plastic substrate, is used as the sealing substrate 40. In a case where the organic EL display apparatus 1 is a top-emitting organic EL display apparatus as in the case of the present embodiment, a transparent insulating substrate is used as sealing substrate 40.

Note that the insulating substrate 11 and the sealing substrate 40 may be flexible insulating films. Use of a flexible substrate as each of the insulating substrate 11 and the sealing substrate 40 allows the organic EL display apparatus 1 to be a flexible display apparatus or a bendable display apparatus.

Note that an unillustrated gap spacer may be provided between the TFT substrate 10 and the sealing substrate 40. Thus, the sealing substrate 40 is prevented from hitting the TFT substrate 10, and thus the organic EL element 20 is prevented from being damaged by the hitting.

Production Method of Organic EL Display Apparatus 1

Next, a method of manufacturing the organic EL display apparatus 1 is described below with reference mainly to FIG. 1, FIG. 4, and FIGS. 5A to 5C.

A manufacturing process of the organic EL display apparatus 1 according to the present embodiment includes: a TFT substrate production step for producing the TFT substrate 10 described above; an organic EL element production process for forming the organic EL element 20 on the TFT substrate 10; and a sealing process for sealing the organic EL element 20 having been produced in the organic EL element production process.

The organic EL element production process includes for example, an anode electrode formation process, a hole injection layer formation process, a hole transport layer formation process, a red light-emitting layer formation process, a blue light-emitting layer formation process, a green light-emitting layer formation process, an electron transport layer formation process, an electron injection layer formation process, a cathode electrode formation process, and a protection layer formation process.

In the present embodiment, the processes included in the organic EL element production process are performed in this order. Hence, in the present embodiment, as illustrated in FIG. 4, the reflective electrode 21a, the light-transmissive electrode 21b, the hole injection layer 31, the hole transport layer 32, the red light-emitting layer 34R, the blue light-emitting layer 34B, the green light-emitting layer 34G, the electron transport layer 35, the electron injection layer 36, the second electrode 23, and the protection layer 24 are formed on and over the TFT substrate 10 in this order from the TFT substrate 10 side.

Each of the above-mentioned processes is described below.

Firstly, in the TFT substrate production process, by a publicly known technique, a photosensitive resin is coated on the insulating substrate 11 where the TFTs 12 and the wiring lines 14 have already been formed. Then, a patterning is performed by the use of a photolithography technique to form, on the insulating substrate 11, the interlayer insulating film 13 serving as a flattening film (level-difference compensation film).

The interlayer insulating film 13 may be made from an acrylic resin or a polyimide resin, for example. The film thickness of the interlayer insulating film 13 is not particularly limited as long as the interlayer insulating film 13 can compensate the level differences caused by the TFTs 12.

Next, the contact hole 13a allowing the first electrode 21 serving as an anode electrode to be electrically connected to the TFTs 12 is formed in the interlayer insulating film 13. Thus, the TFT substrate 10 is produced.

Subsequently, on the TFT substrate 10 thus formed, the organic EL element 20 is formed (organic EL element production process).

In the organic EL element production process, firstly, the first electrode 21 serving as an anode electrode is formed on the TFT substrate 10. The anode electrode formation process according to the present embodiment includes a reflective electrode formation process for forming the reflective electrode 21a on the TFT substrate 10; and a light-transmissive electrode formation process for forming the light-transmissive electrode 21b on the reflective electrode 21a.

Hence, in the anode electrode formation process, firstly, on the TFT substrate 10, a predetermined-thickness reflective electrode material is pattern-formed as the reflective electrode 21a in the first electrode 21.

To form the reflective electrode 21a, a film of a reflective electrode material is formed by, for example, a sputtering technique, and then an unillustrated resist pattern is formed for each subpixel 3 by a photolithography technique. Then, the layer of the reflective electrode material is etched by the use of the resist pattern as a mask, followed by the peeling off of the resist pattern and washing. Thus, the patterning of reflective electrodes 21a as separated for individual subpixels 3 is completed. Alternatively, the film is pattern-formed by, for example, a printing technique or a vapor deposition technique using a vapor deposition mask. As the vapor deposition technique, for example a vacuum vapor deposition technique, a chemical vapor deposition (CVD) technique, or a plasma CVD technique may be used.

The thickness of the reflective electrode 21a may be set in a similar manner to a practice of related art and is not particularly limited. An exemplar thickness of the reflective electrode 21a made from Ag is 100 nm.

Next, as the light-transmissive electrode 21b in the first electrode 21, a predetermined-thickness light-transmissive electrode material is pattern-formed on the reflective electrode 21a.

It is preferable that the distance between the reflective electrode 21a and the second electrode 23 serving as the cathode electrode be set to a distance allowing the light emitted from each subpixel 3 to increase the intensity of the peak wavelength of the light of the wavelength range of each color.

As illustrated in FIG. 8, the blue fluorescent luminescent material has a peak wavelength (first peak wavelength) of approximately 470 nm, the green fluorescent luminescent material has a peak wavelength (second peak wavelength) of approximately 520 nm, and the red fluorescent luminescent material has a peak wavelength (third peak wavelength) of approximately 590 nm.

The organic EL element 20 according to the present embodiment is an organic EL element of the microcavity (microresonator) type. In the microcavity-type organic EL element, the emitted light is reflected multiple times and resonated between the anode electrode and the cathode electrode, which results in a steep light emission spectrum and an increased light emission intensity at a particular wavelength.

An exemplar method of introducing such a resonance structure (microcavity structure) into an organic EL element is known. The known method is changing, for each luminescent color, the distance between the two resonance surfaces (cavity length), that is, the optical path length, in the organic EL element.

In the present embodiment, the thickness of the light-transmissive electrode 21b is set individually for each subpixel 3. Thus, the cavity length is changed individually for each subpixel 3. The microcavity effect thus obtained helps enhance the chromaticity of the emitted light and the luminous efficiency.

Hence, in the present embodiment, a part of the light emitted from the luminescent material of each subpixel 3 is emitted directly to the outside, but another part thereof is emitted to the outside after the multiple reflections. To put it differently, the light emitted to the outside from each subpixel 3 includes: the light emitted from the luminescent material, then passing through the light-transmissive electrode (i.e., the second electrode 23 in the present embodiment) disposed on the opposite side of the organic EL layer 22 from the reflective electrode, and then let out to the outside; and the light emitted from the luminescent material, then reflected multiple times between the anode electrode and the cathode electrode (strictly speaking, between the reflective electrode and the light-transmissive electrode, or in the present embodiment, between the reflective electrode 21a in the first electrode 21 and the second electrode 23), then passing through the light-transmissive electrode (i.e., the second electrode 23 in the present embodiment) disposed on the opposite side from the reflective electrode, and let out to the outside.

Hence, while in the subpixel 3B, the light emitted from the blue light-emitting layer 34B is let out to the outside, the light that is let out to the outside includes the light obtained by the emission from the blue light-emitting layer 34B (i.e., the light emitted from the blue fluorescent luminescent material) followed by multiple reflections between the anode electrode and the cathode electrode in the subpixel 3B. In addition, while in the subpixel 3G, the light emitted from the green light-emitting layer 34G is let out to the outside, the light that is let out to the outside includes the light obtained by the emission from the green light-emitting layer 34G (i.e., the light emitted from the green fluorescent luminescent material) followed by multiple reflections between the anode electrode and the cathode electrode in the subpixel 3G. In addition, while in the subpixel 3R, the light emitted from the red light-emitting layer 34R is let out to the outside, the light that is let out to the outside includes the light obtained by the emission from the red light-emitting layer 34R (i.e., the light emitted from the red fluorescent luminescent material) followed by multiple reflections between the anode electrode and the cathode electrode in the subpixel 3R.

In the subpixel 3B, the thickness of the light-transmissive electrode 21b is determined to allow the distance between the reflective electrode 21a and the second electrode 23 to be an optimal thickness for the extraction (i.e., letting out) of the light having a wavelength within the wavelength range of blue light (i.e., a distance allowing the intensity of the peak wavelength of the blue fluorescent luminescent material to be increased). Likewise, in the subpixel 3G, the thickness of the light-transmissive electrode 21b is determined to allow the distance between the reflective electrode 21a and the second electrode 23 to be an optimal thickness for the extraction (i.e., letting out) of the light having a wavelength within the wavelength range of green light (i.e., a distance allowing the intensity of the peak wavelength of the green fluorescent luminescent material to be increased). In the subpixel 3R, the thickness of the light-transmissive electrode 21b is determined to allow the distance between the reflective electrode 21a and the second electrode 23 to be an optimal thickness for the extraction (i.e., letting out) of the light having a wavelength within the wavelength range of red light (i.e., a distance allowing the intensity of the peak wavelength of the red fluorescent luminescent material to be increased).

Note that the method for changing the thickness of the light-transmissive electrode 21b in each subpixel 3 is not particularly limited. A vapor deposition technique, a printing technique, or the like technique may be used for forming a film of the light-transmissive electrode material into a thickness desired for each subpixel 3. Still alternatively, a film of the light-transmissive electrode material is firstly formed by a sputtering technique or the like technique, then the film is patterned by a photolithography technique, and then the thickness of each layer made from the light-transmissive electrode material is adjusted to a desirable thickness by an ashing technique or the like technique.

In this way, on the TFT substrate 10, the first electrodes 21 having different layer thicknesses for individual subpixels 3 are formed in a matrix shape.

Next, in a similar manner to the formation of the interlayer insulating film 13, the bank 15 is pattern-formed to cover the end portions of the first electrode 21. By the processes described thus far, the first electrodes 21 serving as the anode electrodes are formed as being separated for individual subpixels 3 by the bank 15.

Next, TFT substrate 10 having been subjected to the processes described above is subjected to a low-pressure baking for dehydration and to an oxygen plasma treatment for washing the surfaces of the first electrodes 21.

Next, in a similar manner to the procedure of related art, the material for the hole injection layer 31 and the material for the hole transport layer 32 are vapor-deposited in this order, by the use of, for example, an open mask or the like, on the entire display region 1a on the TFT substrate 10 where the first electrodes 21 have been formed. As described earlier, none of the hole injection layer 31 and the hole transport layer 32 are an indispensable layer. The layer thickness of the hole injection layer 31 and that of the hole transport layer 32 may be determined in a similar manner to the cases of related art and are not particularly limited.

Next, the red light-emitting layer 34R is formed to cover the hole transport layer 32 (red light-emitting layer formation process). As illustrated in FIG. 4 and FIG. 5A, the red light-emitting layer 34R is formed as a single common light-emitting layer across a plurality of pixels 2. Hence, the material for the red light-emitting layer 34R is not formed by a separately patterning vapor deposition technique but is vapor-deposited on the entire display region 1a on the TFT substrate 10 by the use of, for example, an open mask as a vapor deposition mask for the red light-emitting layer formation.

Note that the vapor deposition mask for the red light-emitting layer formation may be a vapor deposition mask for fixed-mask vapor deposition having the same size as the size of the TFT substrate 10. Alternatively, the vapor deposition mask for the red light-emitting layer formation may be a vapor deposition mask for scan-vapor deposition to be used in the vapor deposition performed by scanning the film target substrate. The scanning is performed by relatively moving at least one of a vapor deposition unit and the film target substrate (i.e., the TFT substrate 10) in relation to the other one. The vapor deposition unit includes: a vapor deposition source storing a vapor deposition material and a vapor deposition mask having a smaller size than the size of the TFT substrate 10.

Next, as illustrated in FIG. 1, FIG. 4, and FIG. 5B, the blue light-emitting layer 34B is formed on the red light-emitting layer 34R (blue light-emitting layer formation process). As illustrated in FIG. 4 and FIG. 5B, the blue light-emitting layer 34B is formed as a common layer that is common to the mutually adjacent subpixels 3B and 3G. Hence, the blue light-emitting layers 34B are formed on the red light-emitting layer 34R in a stripe pattern, that is, in straight lines each of which extends in the Y-axis direction, that is, in the column direction. Hence, as illustrated in FIG. 5B, after the blue light-emitting layer formation process, in the display region 1a, the blue light-emitting layers 34B and the red light-emitting layers 34R are alternately arranged in the X-axis direction, that is, in the row direction in a plan view (e.g., when viewed from above the TFT substrate 10).

In the blue light-emitting layer formation process, the material for the blue light-emitting layer 34B is vapor-deposited by the use of a vapor deposition mask for blue light-emitting layer formation. In the vapor deposition mask for blue light-emitting layer formation, openings each of which is formed across mutually adjacent subpixels 3B and 3G allowing the blue light-emitting layer 34B to be formed across the mutually adjacent subpixels 3B and 3G are formed. Note that like the vapor deposition mask for red light-emitting layer formation, the vapor deposition mask for blue light-emitting layer formation may be a vapor deposition mask for fixed-mask vapor deposition or may be a vapor deposition mask for scan vapor deposition.

Next, as illustrated in FIG. 1, FIG. 4, and FIG. 5C, the green light-emitting layer 34G is formed on the blue light-emitting layer 34B (green light-emitting layer formation process). As illustrated in FIG. 4 and FIG. 5C, the green light-emitting layer 34G is formed only for each of the subpixels 3G. Hence, the green light-emitting layers 34G are formed in some portions on the blue light-emitting layer 34B by a separately patterning vapor deposition technique, for example, in straight lines each of which extends in the Y-axis direction. Hence, as illustrated in FIG. 5C, after the green light-emitting layer formation process, in the display region 1a, the blue light-emitting layers 34B and the green light-emitting layers 34G, and the red light-emitting layers 34R are alternately arranged in this order in the X-axis direction when viewed from above.

In the green light-emitting layer formation process, the material for the green light-emitting layer 34G is vapor deposited by the use of a vapor deposition mask for green light-emitting layer formation. In the vapor deposition mask for green light-emitting layer formation, openings are formed only for the subpixels 3G allowing the green light-emitting layers 34G to be formed only for the subpixels 3G. Note that the vapor deposition mask for green light-emitting layer formation also may be a vapor deposition mask for fixed-mask vapor deposition or may be a vapor deposition mask for scan vapor deposition.

Then, in a similar manner to the procedure of related art, the material for the electron transport layer 35 and the material for the electron injection layer 36 are vapor-deposited in this order, by the use of, for example, an open mask or the like, on the entire display region 1a on the TFT substrate 10 where the light-emitting layers 34 of the above-mentioned individual colors have been formed. As described earlier, none of the electron transport layer 35 and the electron injection layer 36 are an indispensable layer. The layer thickness of the electron transport layer 35 and that of the electron injection layer 36 may be determined in a similar manner to the cases of related art and are not particularly limited.

Next, the second electrode 23 serving as the cathode electrode is formed on the entire display region 1a on the TFT substrate 10 to cover the electron injection layer 36. The second electrode 23 may be formed by: vapor deposition techniques such as a vacuum vapor deposition technique, a CVD technique, and a plasma CVD technique; a sputtering technique; a printing technique; or the like.

Then, the material for the protection layer 24 is vapor-deposited on the entire display region 1a on the TFT substrate 10 to cover the second electrode 23. In this way, the organic EL elements 20 are formed on the TFT substrate 10.

Then, as illustrated in FIG. 4, by performing the sealing process, the TFT substrate 10 with the organic EL elements 20 and the sealing substrate 40 are bonded together with an unillustrated filler layer and a sealing member disposed in between. Thus, the organic EL display apparatus 1 according to the present embodiment is obtained. Note that the method of sealing the organic EL elements 20 is not limited to the above-described method. Alternatively, publicly-known sealing techniques of various kinds may be employed.

Display Method of Organic EL Display Apparatus 1

Next, a display method for making the organic EL display apparatus 1 according to the present embodiment display images is described below with reference to FIG. 1, FIGS. 2A to 2C, and FIG. 4.

As described earlier, the organic EL display apparatus 1 includes a plurality of subpixels 3 each of which includes an organic EL element 20 including a light-emitting layer 34 of the corresponding color. The organic EL display apparatus 1 achieves the displaying of color images by selectively making the organic EL elements 20 in the individual subpixels 3 at desired luminance by the use of color TFTs 12. Light emission in each subpixel 3 is described below.

The organic EL display apparatus 1 according to the present embodiment is an active matrix organic EL display apparatus and has a display region where a plurality of pixels 2 are arranged in a matrix shape.

The organic EL display apparatus 1 according to the present embodiment differs from an organic EL display apparatus of related art with a pixel arrangement known as the RGB-stripe arrangement in that the subpixels 3B, 3G, and 3R have different layer structures from one another as illustrated in FIG. 1 and FIG. 4.

In the organic EL display apparatus 1 according to the present embodiment, as illustrated in FIG. 4, the holes ($h^+$) and the electrons ($e^-$) having been injected into the organic EL layer 22 respectively from the first electrode 21 and the second electrode 23 are recombined together in the blue light-emitting layer 34B in the subpixel 3B, and thus excitons are generated there as illustrated in FIG. 1 and FIG. 2A. The excitons thus generated emit light when decayed back to the ground state. As a result, the subpixel 3B achieves almost 100% blue light emission (blue fluorescence emission). In the subpixel 3B, the red light-emitting layer 34R is formed. The red luminescent material serving as the luminescent material included in the red light-emitting layer 34R has a lower energy level than the blue luminescent material. As described earlier, the light emission spectrum of the blue luminescent material and the absorption spectrum of the red luminescent material are separated from each other in terms of the wavelength. There is little, or ideally no overlapping between these two spectra. Hence, no direct Förster transfer occurs from the $S_1$ level of the blue luminescent material to the $S_1$ level of the red luminescent material. Consequently, in the subpixel 3B, the energy transfer that would otherwise be caused by the Förster transfer does not occur from the blue light-emitting layer 34B to the red light-emitting layer 34R. Accordingly, as described earlier, subpixel 3B achieves almost 100% blue light emission (blue fluorescence emission) in the blue light-emitting layer 34B by adjusting the carrier mobilities of the blue light-emitting layer 34B and those of the red light-emitting layer 34R to generate excitons in blue light-emitting layer 34B within the subpixel 3B.

Consequently, in the present embodiment, despite the configuration of the subpixel 3B including both the red light-emitting layer 34R and the blue light-emitting layer 34B, the color mixing in the subpixel 3B is suppressed.

In the subpixel 3G, depending on the carrier balance among the light-emitting layers 34, especially the carrier balance between the blue light-emitting layer 34B and the green light-emitting layer 34G, the holes and the electrons having been injected into the organic EL layer 22 respectively from the first electrode 21 and the second electrode 23 are recombined together either in the blue light-emitting layer 34B as in the case of the subpixel 3B or in the green light-emitting layer 34G, and thus excitons are generated in their respective locations.

As illustrated in FIG. 1 and FIG. 4, the subpixel 3G has a configuration where the blue light-emitting layer 34B, the green light-emitting layer 34G, and the red light-emitting layer 34R are layered. In the subpixel 3G, the distance DGR between the green light-emitting layer 34G and the red light-emitting layer 34R is greater than the Förster radius. The red light-emitting layer 34R is located closer to one of the electrodes (the first electrode 21 in the present embodiment) than the blue light-emitting layer 34B and the green light-emitting layer 34G. The light emission spectrum of the blue luminescent material and the absorption spectrum of the red luminescent material are separated from each other in terms of wavelength, and there is little, or ideally no overlapping between the two spectra. Hence, no energy transfer occurs from any of the blue light-emitting layer 34B and the green light-emitting layer 34G to the red light-emitting layer 34R. On the other hand, the $S_1$ level of the green fluorescent luminescent material is lower than the $S_1$ level of the blue fluorescent luminescent material. The distance DBG between the blue light-emitting layer 34B and the green light-emitting layer 34G is not greater than the Förster radius. The red light-emitting layer 34R is closer to one of the electrodes (the first electrode 21 in the present embodiment) than the blue light-emitting layer 34B and the green light-emitting layer 34G. The red light-emitting layer 34R is not located between the blue light-emitting layer 34B and the green light-emitting layer 34G. Hence, in the subpixel 3G, either the green light-emitting layer 34G or the blue light-emitting layer 34B can generate excitons. In the subpixel 3G, in a case where excitons are generated in the green light-emitting layer 34G, light is emitted when the excitons generated in the green light-emitting layer 34G are decayed back to the ground state. Hence, the subpixel 3G achieves almost 100% green light emission (green fluorescence emission) in the green light-emitting layer 34G. In this case, use of a TADF material as the green fluorescent luminescent material causes reverse intersystem crossing to convert upwardly the excitons with a 75% $T_1$ level generated in the green light-emitting layer 34G to the $S_1$ level. Hence, the luminous efficiency in the subpixel 3G can be improved to a great degree. Although the subpixel 3G has a configuration including the red light-emitting layer 34R whose luminescent material is a red luminescent material with a lower energy level than the energy level of the green luminescent material, the blue light-emitting layer 34B having a greater layer thickness than the Förster radius is formed between the green light-emitting layer 34G and the red light-emitting layer 34R. Hence, the energy transfer that would otherwise be caused by the Förster transfer does not occur from the green light-emitting layer 34G to the red light-emitting layer 34R.

FIG. 1 and FIG. 2B illustrate an exemplar case where excitons are generated in the blue light-emitting layer 34B. As described earlier, the $S_1$ level of the green fluorescent luminescent material is lower than the $S_1$ level of the blue fluorescent luminescent material. The blue light-emitting layer 34B and the green light-emitting layer 34G are mutually adjacent, and a part of the PL emission spectrum of the blue fluorescent luminescent material overlaps a part of the absorption spectrum of the green fluorescent luminescent material.

Hence, as illustrated in FIG. 1 and FIG. 2B, in the subpixel 3G, in a case where excitons are generated in the blue light-emitting layer 34B, the Förster transfer from the $S_1$ level of the blue fluorescent luminescent material to the $S_1$ level of the green fluorescent luminescent material does occur. In contrast, as described earlier, the PL emission spectrum of the blue luminescent material and the absorption spectrum of the red luminescent material are separated in terms of wavelength. Hence, no Förster transfer occurs from the $S_1$ level of the blue luminescent material to the $S_1$ level of the red luminescent material. Accordingly, even in a case where excitons are generated in the blue light-emitting layer 34B within the subpixel 3G, the subpixel 3G achieves almost 100% green light emission (green fluorescence emission). In this case, use of a TADF material as the blue fluorescent luminescent material causes reverse intersystem crossing to convert upwardly the excitons with a 75% $T_1$ level generated in the blue light-emitting layer 34B to the $S_1$ level. Hence, the luminous efficiency in the subpixel 3B and the luminous efficiency in the subpixel 3G can be improved to a great degree.

Consequently, in the present embodiment, despite the configuration of the subpixel 3G including both the blue light-emitting layer 34B and the green light-emitting layer 34G, the color mixing in the subpixel 3G is suppressed.

In the subpixel 3R, the light-emitting layer includes only the red light-emitting layer 34R. In the subpixel 3R, excitons are generated in the red light-emitting layer 34R, and the subpixel 3R achieves almost 100% red light emission (red fluorescence emission). In this case, use of a TADF material as the red fluorescent luminescent material causes reverse intersystem crossing to convert upwardly the excitons with a 75% $T_1$ level generated in the red light-emitting layer 34R to the $S_1$ level. Hence, the luminous efficiency in the subpixel 3R can be improved to a great degree.

Advantageous Effects

As has been described thus far, in the present embodiment, the red light-emitting layer 34R is formed as a common light-emitting layer that is common to the subpixel 3B, the subpixel 3G, and the subpixel 3R. In addition, the blue light-emitting layer 34B is formed as a common light-emitting layer that is common to the subpixel 3B and the subpixel 3G. Hence, while the productivity is enhanced by the use of the common light-emitting layers, light is emitted by the use of the occurrence or no occurrence of energy transfer between mutually adjacent light-emitting layers 34 that are adjacent each other in the layering direction.

According to the present embodiment, as described above, the red light-emitting layer 34R is formed in the entire display region 1a and thus is common to the subpixel 3B, the subpixel 3G, and the subpixel 3R. Hence, not all the light-emitting layers 34 have to be formed by the separately patterning vapor deposition technique. According to the present embodiment, the red light-emitting layer 34R is vapor-deposited in the entire display region 1a and thus is common to all the subpixels 3 including the subpixels 3B, subpixels 3G, and the subpixels 3R. This reduces the number of separate-patterning vapor-deposition sessions using different vapor deposition masks.

In addition, according to the present embodiment, as described earlier, the red light-emitting layer 34R and the blue light-emitting layer 34B are layered in the subpixel 3B, but the blue light-emitting layer 34B achieves almost 100% light emission. In the subpixel 3G, the red light-emitting layer 34R, the blue light-emitting layer 34B, and the green light-emitting layer 34G are layered, but the green light-emitting layer 34G achieves almost 100% light emission. In the subpixel 3R, only the red light-emitting layer 34R is formed as the light-emitting layer 34. The red light-emitting layer 34R achieves almost 100% light emission. In addition, according to the present embodiment, it is not necessary to form, separately, a color filter or a color conversion layer. Hence, according to the present embodiment, each subpixel 3 can obtain its own luminescent color with a high efficiency without causing any color mixing or color shift to take place. As a result, a higher resolution can be achieved easily. In addition, the present embodiment has a higher degree of freedom in selecting the carrier mobilities and in selecting the materials than in the cases of related art.

In addition, according to the present embodiment, the subpixel 3B, the subpixel 3G, and the subpixel 3R emit light having mutually different peak wavelengths. Hence, according to the present embodiment, unlike the case of the white CF technique, it is not necessary to make the blue light-emitting layer 34B, the green light-emitting layer 34G, and the red light-emitting layer 34R emit light simultaneously. Accordingly, the power consumption at the time of driving the display apparatus can be reduced.

In addition, according to the present embodiment, the unnecessity of any color filters that would otherwise have to be separately provided reduces the manufacturing cost and eliminates the possible energy loss that would otherwise be caused by the use of the color filters.

Hence, the present embodiment provides a display apparatus, along with a manufacturing method thereof, that is capable of: preventing color mixing or color shift from occurring in each subpixel; achieving a high efficiency in providing each luminescent color; and reducing the power consumption when driven and reducing the manufacturing cost from their respective counterparts of display apparatus of related art.

Modified Example

Note that the present embodiment has been described above based on a case where the display apparatus according to the present embodiment is an organic EL display apparatus. The display apparatus according to the present embodiment has only to be a display apparatus capable of performing PL light emission. Hence, the display apparatus according to the present embodiment is not limited to the illustrative case described above but may be, for example, an inorganic EL display apparatus or any other display apparatus that is not an EL display apparatus but that uses PL light emission. In addition, by the use of an inorganic material as each of the luminescent materials, inorganic layers may be formed instead of the organic layers.

In addition, in the present embodiment, the blue light-emitting layer 34B is formed as the first light-emitting layer, the green light-emitting layer 34G is formed as the second light-emitting layer, the red light-emitting layer 34R is formed as the third light-emitting layer. The present embodiment, however, is not limited to such an example. The combination of the first luminescent material in the first light-emitting layer, the second luminescent material in the second light-emitting layer, and the third luminescent material in the third light-emitting layer is not limited to the combination of the blue fluorescent luminescent material, the green fluorescent luminescent material, and the red fluorescent luminescent material. Any combination is allowable as long as: the second luminescent material emits light having a longer peak wavelength (second peak wavelength) than the peak wavelength (first peak wavelength) of the light emitted from the first luminescent material, the third luminescent material emits light having a longer peak wavelength (third peak wavelength) than the second peak wavelength, and the second luminescent material has an $S_1$ level that is lower than the $S_1$ level of the first luminescent material but that is higher than the $S_1$ level of the third luminescent material.

Second Embodiment

A description will be given of another embodiment of the disclosure, with reference to FIGS. 9A to 9C.

The present embodiment will be described about differences between the present embodiment and the first embodiment, and components having the same functions as those of the components described in the first embodiment are appended with the same reference signs, and the description thereof is omitted. Obviously, the same modifications as those of the first embodiment may also be applied to the present embodiment.

Schematic Configuration of Organic EL Display Apparatus 1 and Method for Manufacturing Same The organic EL display apparatus 1 according to the present embodiment has a configuration that is identical to the configuration of the organic EL display apparatus 1 according to the first embodiment except that a red phosphorescent luminescent material is used as a luminescent material of the red light-emitting layer 34R. Hence, FIG. 4 can be used as a cross-sectional view illustrating a schematic configuration of the organic EL display apparatus 1 according to the present embodiment. In addition, FIG. 1 can be used as a cross-sectional view illustrating a schematic configuration of the light-emitting layer unit 33 of the organic EL display apparatus 1 according to the present embodiment, and FIG. 3 can be used as a schematic plan view illustrating the pixel arrangement of the organic EL display apparatus 1 according to the present embodiment.

In addition, a method for manufacturing the organic EL display apparatus 1 according to the present embodiment is identical to the method of manufacturing the organic EL display apparatus 1 according to the first embodiment except that a red phosphorescent luminescent material is used as a luminescent material of the red light-emitting layer 34R.

Some examples of the red phosphorescent luminescent materials are tris(1-phenylisoquinoline)iridium (III) (Ir(piq)3), and bis(2-benzo[b]thiophene-2-yl-pyridine)(acetylacetonate)iridium (III) (Ir(btp)2(acac)).

As illustrated in FIG. 6 in the first embodiment, the $S_1$ level of the green luminescent material ($S_1(2)$) is lower than the $S_1$ level of the blue luminescent material ($S_1(1)$) whereas the $S_1$ level of the red luminescent material ($S_1(3)$) is lower than $S_1$ level of the green luminescent material ($S_1(2)$). To put it differently, the $S_1$ level of the green fluorescent luminescent material is lower than the $S_1$ level of the blue fluorescent luminescent material whereas the $S_1$ level of the red phosphorescent luminescent material ($S_1(3)$) is lower than the $S_1$ level of the green fluorescent luminescent material ($S_1(2)$).

Note that as the $T_1$ level represents a lower energy than the $S_1$ level, the absorption spectrum of the red phosphorescent luminescent material has a longer wavelength than the wavelength of the absorption spectrum of the red fluorescent luminescent material. The wavelength of the absorption spectrum of the red phosphorescent luminescent material is close to the wavelength of the absorption spectrum of the red fluorescent luminescent material. Hence, as in the cases where fluorescence materials are used as both the green luminescent material and the red luminescent material as in the first embodiment, it is preferable that the PL emission spectrum of the blue luminescent material (blue fluorescent luminescent material in the present embodiment) and the absorption spectrum of the red luminescent material (red phosphorescent luminescent material in the present embodiment) have little, or ideally no overlapping with each other.

Hence, also in the present embodiment, the PL emission spectrum of the blue luminescent material (blue fluorescent luminescent material in the present embodiment) and the absorption spectrum of the red luminescent material (red phosphorescent luminescent material in the present embodiment) have little, or ideally no overlapping with each other, and the layer thickness of the blue light-emitting layer 34B is greater than the Förster radius. Hence, no energy transfer occurs from either the blue luminescent material or the green luminescent material to the red luminescent material.

On the other hand, also in the present embodiment, it is preferable that a part of the PL emission spectrum of the blue luminescent material (the blue fluorescent luminescent material in the present embodiment) overlap a part of the absorption spectrum of the green luminescent material (the green fluorescent luminescent material in the present embodiment). The overlapping between a part of the PL emission spectrum of the blue luminescent material (the blue fluorescent luminescent material in the present embodiment) and a part of the absorption spectrum of the green luminescent material (the green fluorescent luminescent material in the present embodiment) allows the energy transfer from the blue luminescent material to the green luminescent material to occur more easily.

Display Method of Organic EL Display Apparatus 1

Next, a display method for making the organic EL display apparatus 1 according to the present embodiment display images is described below with reference to FIG. 1, and FIGS. 9A to 9C.

Figure 9A:
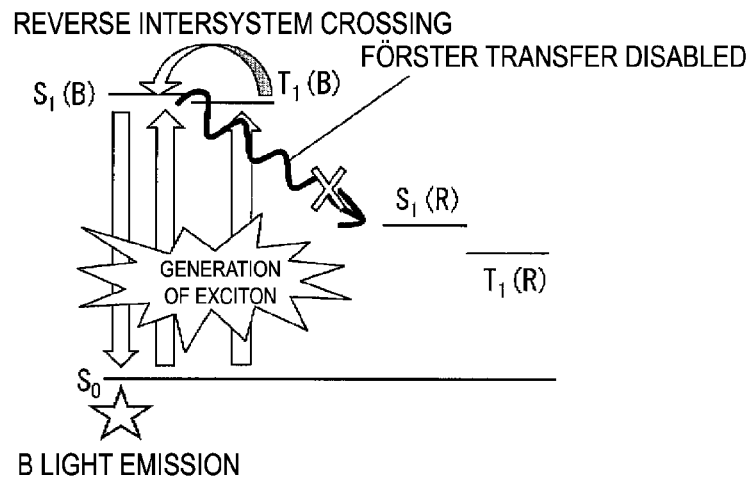
FIG. 9A is a diagram illustrating a principle of light emission in a blue subpixel of the organic EL display apparatus according to a second embodiment of the disclosure.

FIG. 9A is a diagram illustrating a principle of light emission in the subpixel 3B of the organic EL display apparatus 1 according to the present embodiment. FIG. 9B is a diagram illustrating a principle of light emission in the subpixel 3G of the organic EL display apparatus 1 according to the present embodiment. FIG. 9C is a diagram illustrating a principle of light emission in the subpixel 3R of the organic EL display apparatus 1 according to the present embodiment.

The subpixels 3B and 3G of the organic EL display apparatus 1 according to the present embodiment have layering structures that are identical to their respective counterparts of the subpixels 3B and 3G of the organic EL display apparatus 1 according to the first embodiment. Also in the present embodiment, as in the first embodiment, a part of the PL emission spectrum of the blue fluorescent luminescent material overlaps a part of the absorption spectrum of the green fluorescent luminescent material. In addition, the distance $D_{BG}$ between the blue light-emitting layer 34B and the green light-emitting layer 34G is not greater than the Förster radius. In addition, as described above, the PL emission spectrum of the blue fluorescent luminescent material and the absorption spectrum of the red phosphorescent luminescent material have little, or ideally no overlapping with each other, and the layer thickness of the blue light-emitting layer 34B is greater than the Förster radius.

Figure 9B:
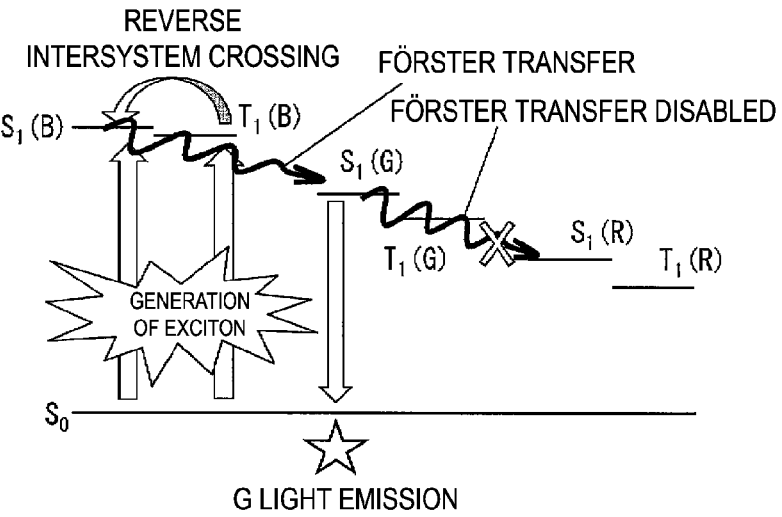
FIG. 9B is a diagram illustrating a principle of light emission in a green subpixel of the organic EL display apparatus according to the second embodiment of the disclosure.
Figure 9C:
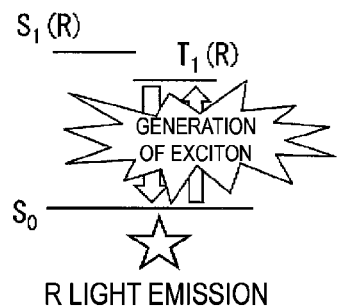
FIG. 9C is a diagram illustrating a principle of light emission in a red subpixel of the organic EL display apparatus according to the second embodiment of the disclosure.

Hence, despite the use of the red phosphorescent luminescent material as the red luminescent material in the present embodiment, as illustrated in FIG. 9A and FIG. 9B, the subpixels 3B and 3G of the organic EL display apparatus 1 according to the present embodiment are based on a principle of light emission that is identical to the principle of light emission illustrated in FIG. 1, FIG. 2A, and FIG. 2B, on which the subpixels 3B and 3G of the organic EL display apparatus 1 according to the first embodiment are based. Hence, the red luminescent material or the red fluorescent luminescent material in the first embodiment may be replaced with the red luminescent material (red phosphorescent luminescent material) in the present embodiment. Accordingly, no description is provided in the present embodiment concerning the principle of light emission in the subpixels 3B and 3G.

In addition, in the subpixel 3R, the light-emitting layer includes only the red light-emitting layer 34R whose luminescent material is the red phosphorescent luminescent material. In the subpixel 3R, triplet excitons are generated in the red light-emitting layer 34R, and light is emitted when the triplet excitons in the phosphorescent luminescent material are decayed back to the ground state. As a result, the subpixel 3R achieves almost 100% red light emission (red phosphorescent light emission in the present embodiment).

Advantageous Effects

As has been described thus far, also in the present embodiment as in the first embodiment, the red light-emitting layer 34R is formed as a common light-emitting layer that is common to the subpixel 3B, the subpixel 3G, and the subpixel 3R. In addition, the blue light-emitting layer 34B is formed as a common light-emitting layer that is common to the subpixel 3B and the subpixel 3G. Hence, while the productivity is enhanced by the use of the common light-emitting layers, light can be emitted by the use of the occurrence or no occurrence of energy transfer between mutually adjacent light-emitting layers 34 that are adjacent each other in the layering direction. Accordingly, the present embodiment can also obtain similar advantageous effects to those of the first embodiment.

Third Embodiment

A description will be given of yet another embodiment of the disclosure, with reference mainly to FIG. 10.

The present embodiment will be described about differences between the present embodiment and the first and second embodiments, and components having the same functions as those of the components described in the first and second embodiments are denoted by the same reference signs, and the description thereof is omitted. Obviously, similar modifications to those of the first and second embodiments may also be applied to the present embodiment.

Figure 10:
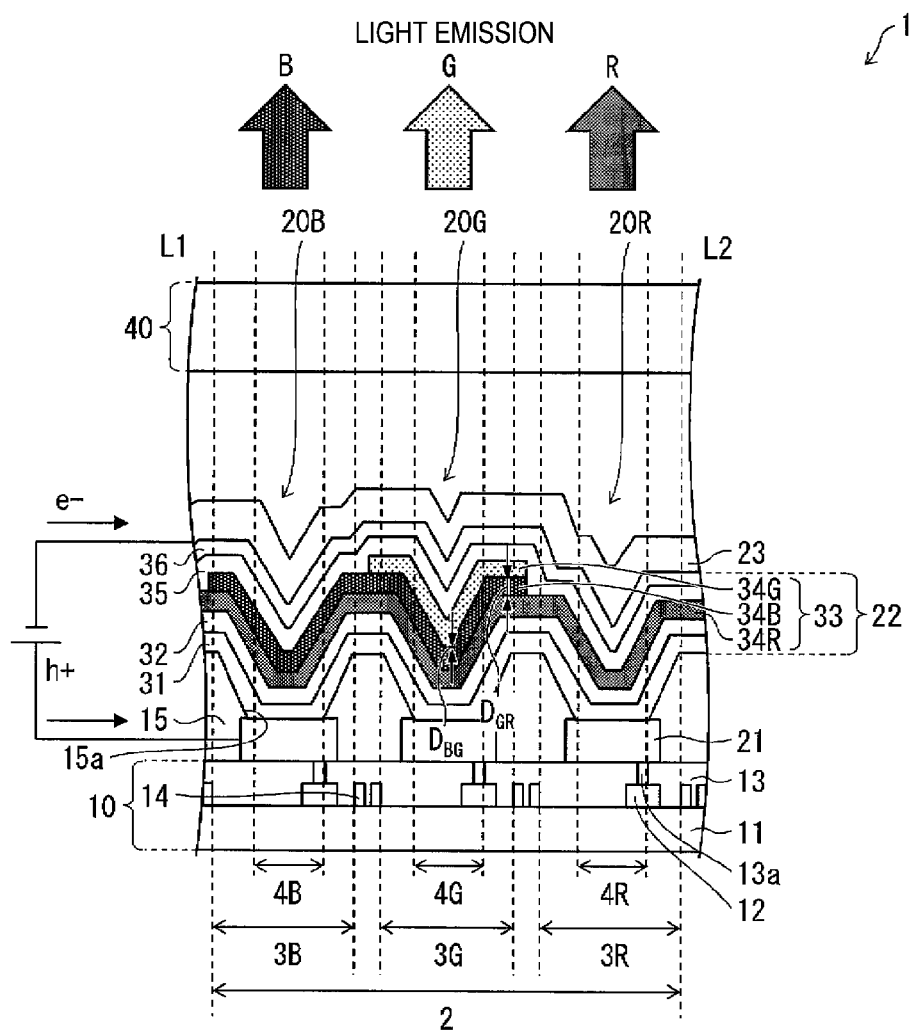
FIG. 10 is a cross-sectional view illustrating an exemplar schematic configuration of an organic EL display apparatus according to a third embodiment of the disclosure.

Schematic Configuration of Organic EL Display Apparatus 1 and Method for Manufacturing Same FIG. 10 is a cross-sectional view illustrating an example of a schematic configuration of the organic EL display apparatus 1 according to the present embodiment. Note that the cross-sectional view of FIG. 10 illustrates an example of a schematic configuration of a single pixel area of the organic EL display apparatus 1 and corresponds to a cross section taken along the line L1-L2 in FIG. 3.

The organic EL display apparatus 1 according to the present embodiment is a bottom-emitting organic EL display apparatus where the light emitted from the light-emitting layer unit 33 is extracted through the first electrode 21, that is, through the TFT substrate 10.

In a case where the organic EL display apparatus 1 is a bottom-emitting organic EL display apparatus, an insulating substrate having a light-transmitting property, which is called a transparent substrate or a light-transmitting substrate, such as a glass substrate and a plastic substrate, is used as the insulating substrate 11.

In addition, in the case where the organic EL display apparatus 1 is a bottom-emitting organic EL display apparatus, the light emitted from the light-emitting layer unit 33 is extracted through the light-transmissive electrode either directly or after being reflected by a reflective electrode. Hence, in the present embodiment, as described above, the first electrode 21 located on the TFT substrate 10 side is a light-transmissive electrode and the second electrode 23 is a reflective electrode. As the materials for the light-transmissive electrode and the reflective electrode, the light-transmissive electrode materials and the reflective electrode materials illustrated in the first embodiment, for example, can be used.

The organic EL display apparatus 1 according to the present embodiment is identical to the organic EL display apparatuses 1 according to the first and second embodiments except that the first electrode 21 is a light-transmissive electrode, and that instead of forming the protection layer 24, a reflective electrode having a greater layer thickness than that of the second electrode 23 (semi-transparent electrode) in the organic EL display apparatus 1 according to the first embodiment is used as the second electrode 23. In the present embodiment, for example, the first electrodes 21 (anode electrode) in all the subpixels 3B, 3G, and 3R are ITO electrodes with a layer thickness of 100 nm, and the second electrode 23 (cathode electrode) is an Al electrode with a layer thickness of 100 nm.

In the present embodiment, as illustrated in FIG. 10, the first electrode 21 including a light-transmissive electrode, the hole injection layer 31, the hole transport layer 32, the blue light-emitting layer 34B, the green light-emitting layer 34G, the red light-emitting layer 34R, the electron transport layer 35, the electron injection layer 36, and the second electrode 23 including a reflective electrode are formed on and over the TFT substrate 10 in this order from the TFT substrate 10 side.

Advantageous Effects

According to the present embodiment, the displaying based on a similar principle to the one in the first and second embodiments can be performed. To put it differently, by setting the conditions other than the ones described above to the same conditions employed in any one of the first and second embodiments, each subpixel 3 can obtain, based on the same principle as that of the above-mentioned one of the first and second embodiments, its own luminescent color with a high efficiency without causing any color mixing or color shift to take place. As a result, a higher resolution can be achieved easily.

Hence, according to the present embodiment, the bottom-emitting organic EL display apparatus 1 having similar effects to those obtained in the first and second embodiments can be provided.

In addition, in a case where the organic EL display apparatus 1 has a bottom-emitting structure as described above, only a weaker microcavity effect can be obtained. Hence, even if the optical path length (cavity length) of the organic EL element 20 in each subpixel 3 is changed, the color level and the luminous efficiency of the organic EL element 20 in each subpixel 3 are less likely to change. Hence, the color level and the luminous efficiency of the organic EL element 20 in each subpixel 3 are less likely to change so that it is not necessary to make the second electrode 23 have a layered structure including a reflective electrode and a light-transmissive electrode serving as a layer-thickness adjustment layer (optical-path-length adjustment layer) as in the case of the first electrode 21 according to the first embodiment. In addition, it is not necessary to change the optical path length of the organic EL element 20 in each subpixel 3 by, for example, changing the layer thickness of the light-transmissive electrode or to vary, from one subpixel 3 to another, the layer thickness of the organic EL layer 22 located between the first electrode 21 and the second electrode 23.

Hence, according to the present embodiment, as described above, even in a case where each of the layers included in the organic EL display apparatus 1 has a uniform layer thickness, no problem arises. Hence, the organic EL display apparatus 1 can be manufactured in a simpler process than the manufacturing process of an organic EL display apparatus having a top-emitting structure.

Fourth Embodiment

A description will be given of yet another embodiment of the disclosure, with reference mainly to FIG. 10 and FIGS. 11A to 11C.

The present embodiment will be described about differences between the present embodiment and the first embodiment to the third embodiment, and components having the same functions as those of the components described in the first embodiment to the third embodiment are appended with the same reference signs, and the description thereof is omitted. Obviously, the same modifications as those of the first to the third embodiments may also be applied to the present embodiment.

Schematic Configuration and Light Emission Principle of Organic EL Display Apparatus 1

Figure 11:
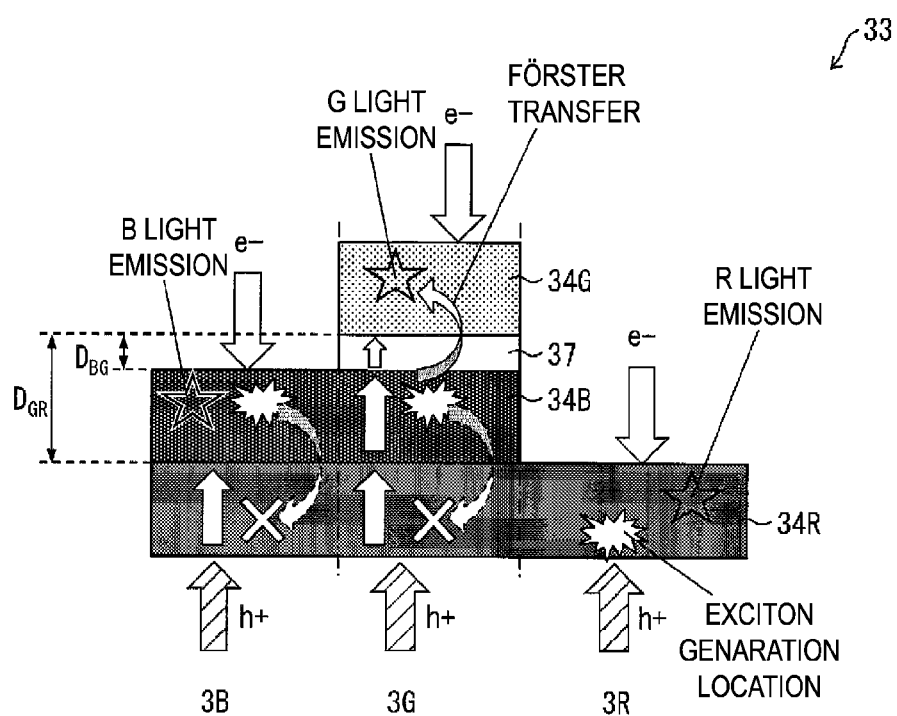
FIG. 11 is a diagram illustrating a schematic configuration of a light-emitting layer unit of an organic EL display apparatus and illustrating a principle of light emission by the light-emitting layer unit according to a fourth embodiment of the disclosure.
Figure 12:
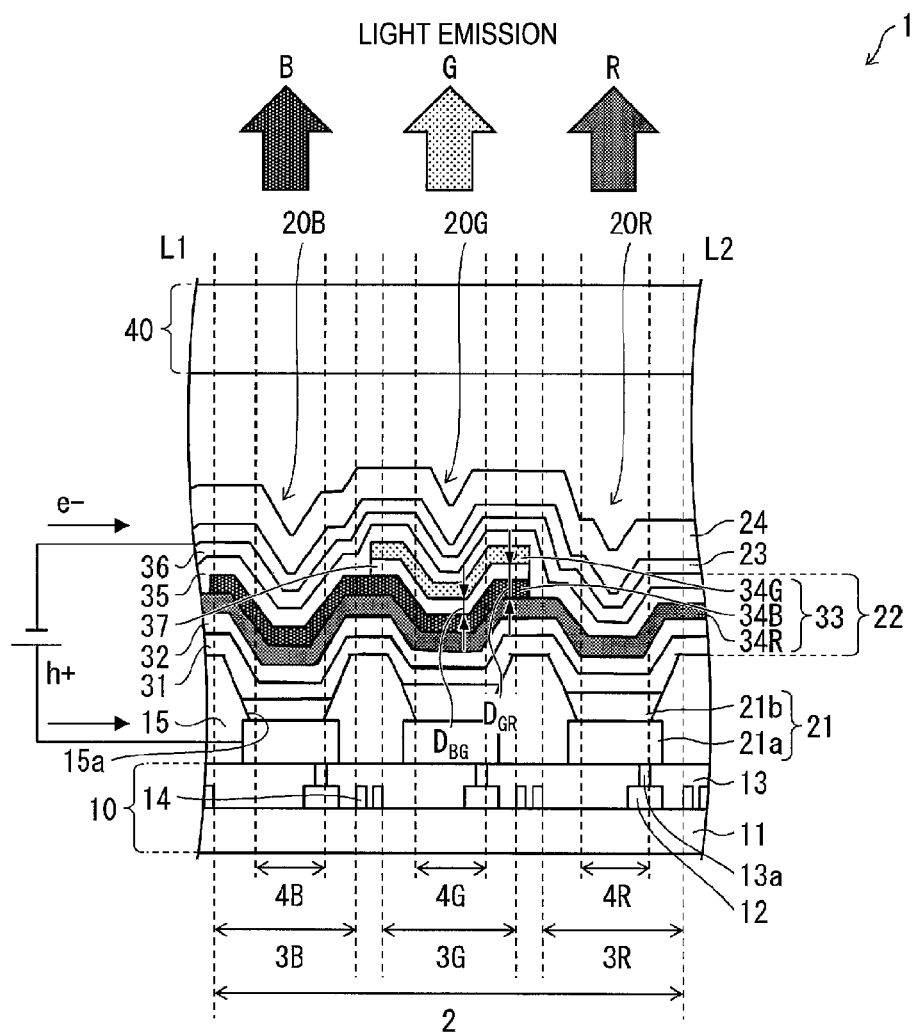
FIG. 12 is a cross-sectional view illustrating an example of a schematic configuration of an organic EL display apparatus according to the fourth embodiment of the disclosure.

FIG. 11 is a diagram illustrating a schematic configuration of the light-emitting layer unit 33 of the organic EL display apparatus 1 and illustrating a principle of light emission by the light-emitting layer unit 33 according to the present embodiment. FIG. 12 is a cross sectional view illustrating an example of a schematic configuration of the organic EL display apparatus 1 according to the present embodiment. Note that the cross-sectional view of FIG. 12 illustrates an example of a schematic configuration of a single pixel area of the organic EL display apparatus 1 and corresponds to a cross section taken along the line L1-L2 in FIG. 3.

Suppose a case where, near the interface where two mutually adjacent light-emitting layers 34 are in a direct contact with each other, a Dexter transfer, which is an energy transfer of the 75% excitons generated to the triplet level to the triplet level of the adjacent light-emitting layer 34, occurs. In this case, the excitons are inactivated thermally without causing light emission.

Hence, in the present embodiment, it is preferable that, as illustrated in FIG. 11 and FIG. 12, a blocking layer 37 containing no luminescent material be formed between the blue light-emitting layer 34B and the green light-emitting layer 34G in each subpixel 3G in the configuration of, for example, the first embodiment.

As described above in the first embodiment, the distance, in the subpixel 3G, between the blue light-emitting layer 34B and the green light-emitting layer 34G (i.e., the distance DBG between the mutually opposing surfaces of the layers 34B and 34G) is not greater than the Förster radius. Hence, the blocking layer 37 has a thickness that is not greater than the Förster radius. Hence, the Förster transfer from the blue fluorescent luminescent material to the green fluorescent luminescent material in the subpixel 3G is not blocked, but the Dexter transfer there is blocked.

Hence, by forming the thin blocking layer 37 between the blue light-emitting layer 34B and the green light-emitting layer 34G in the subpixel 3G, the luminous efficiency of the green light-emitting layer 34G in the subpixel 3G can be improved.

To ensure the Förster transfer, it is preferable that the layer thickness of the blocking layer 37 be as small as possible. Specifically, the layer thickness is preferably 10 nm or smaller, and is more preferably 5 nm or smaller.

As described in the first embodiment, it is commonly understood that Förster radius ranges from 1 to 10 nm, approximately. Hence, the distance between the surface located on the opposite side of the blue light-emitting layer 34B from the surface facing the green light-emitting layer 34G and the surface of the green light-emitting layer 34G facing the blue light-emitting layer 34B is preferably not greater than 10 nm.

In the above-described case where the blocking layer 37 is formed between the blue light-emitting layer 34B and the green light-emitting layer 34G, both the blue light-emitting layer 35B and the blocking layer 37 exist between the green light-emitting layer 34G and the red light-emitting layer 34R. Hence, in the present embodiment, as long as the total layer thickness of both the layer thickness of the blue light-emitting layer 34B and the layer thickness of the blocking layer 37 is at least 15 nm, the distance DGR between the green light-emitting layer 34G and the red light-emitting layer 34R is at least 15 nm. Accordingly, it is not necessary to form the blue light-emitting layer 34B with a layer thickness of 15 nm or thicker.

To allow the carriers to flow from the blue light-emitting layer 34B towards the green light-emitting layer 34G, the blocking layer 37 preferably exhibits good hole transport properties or good bipolar transport properties as the entire blocking layer 37 as illustrated in FIG. 11, for example. In a case where a material exhibiting good bipolar transport properties is used for the blocking layer 37, the material is either a material that exhibits good bipolar transport properties as in the case with bipolar transport materials or a combination of two or more kinds of materials that exhibit good bipolar transport properties when combined.

The organic EL display apparatus 1 according to the present embodiment has a configuration that is identical to the corresponding configuration according to the first embodiment except the above-mentioned points. In addition, the principle of light emission in the present embodiment is the same as that in the first embodiment.

Production Method of Organic EL Display Apparatus 1

A method for manufacturing the organic EL display apparatus 1 according to the present embodiment is identical to the method of manufacturing the organic EL display apparatus 1 according to the first embodiment except that a blocking layer formation process for forming the blocking layer 37 is additionally included between the blue light-emitting layer formation process and the green light-emitting layer formation process in the first embodiment.

Note that in the example illustrated in FIG. 11 and FIG. 12, the blocking layer 37 is formed only in the subpixels 3G. Hence, in the method of manufacturing the organic EL display apparatus 1 illustrated in FIG. 11 and FIG. 12, the blocking layer 37 and the green light-emitting layer 34G can be formed, for example, consecutively by the use of the same vapor deposition mask. Hence, in the green light-emitting layer formation process, the green light-emitting layer 34G having the identical pattern to the pattern of the blocking layer 37 when viewed from above is formed on the blocking layer 37. The present embodiment, however, is not limited to this method. Alternatively, separate vapor deposition masks each of which has an identical opening pattern to the other's and each of which is dedicated to each of the blocking layer 37 and the green light-emitting layer 34G may be used to pattern-form the blocking layer 37 and the green light-emitting layer 34G.

Advantageous Effects

As has been described thus far, the organic EL display apparatus 1 according to the present embodiment has a configuration that is identical to the configuration of the organic EL display apparatus 1 according to the first embodiment except that the blocking layer 37 is formed between the blue light-emitting layer 34B and the green light-emitting layer 34G in each subpixel 3G. In addition, the organic EL display apparatus 1 according to the present embodiment performs light emission based on the same principle as that in the first embodiment. Accordingly, the present embodiment can also obtain similar advantageous effects to those of the first embodiment.

In addition, according to the present embodiment, the formation of the blocking layer 37 does not block the Förster transfer from the blue fluorescent luminescent material to the green fluorescent luminescent material but does block the Dexter transfer there. Hence, the luminous efficiency of the green light-emitting layer 34G in the subpixel 3G can be improved.

Modified Example

Note that the foregoing description is based on an example modified from the organic EL display apparatus 1 according to the first embodiment, but the present embodiment is not limited to such modifications. Alternatively, as described earlier, the present embodiment may be modified in a similar manner to the first to third embodiments.

The blocking layer 37 is configured to block the Dexter transfer from the blue fluorescent luminescent material to the green fluorescent luminescent material in the subpixel 3G. Hence as illustrated in FIG. 11 and FIG. 12, it is not necessary to provide the blocking layer 37 in the subpixels 3 other than the subpixels 3G. What is necessary is providing the blocking layer 37 between the blue light-emitting layer 34B and the green light-emitting layer 34G in each subpixel 3G. The present embodiment, however, is not limited to such a configuration. Alternatively, the blocking layer 37 may be formed as a common layer that is common to the subpixels 3B and the subpixels 3G. In this case, the blue light-emitting layer 34B and the blocking layer 37 may be formed consecutively by the use of, for example, the same vapor deposition mask, or by the use of separate vapor deposition masks having an identical pattern and dedicated individually to these layers 34B and 37.

In addition, like the red light-emitting layer 35R, the blocking layer 37 may be formed in the entire display region 1a as a common layer that is common to the subpixels 3B, 3G, and 3R in all the pixels 2. In this case, the blocking layer 37 may be formed by the use of the same open mask as the vapor deposition mask.

Fifth Embodiment

A description will be given of yet another embodiment of the disclosure, with reference mainly to FIG. 13 and FIG. 14.

The present embodiment will be described about differences between the present embodiment and the first embodiment to the fourth embodiment, and components having the same functions as those of the components described in the first embodiment to the fourth embodiment are appended with the same reference signs, and the description thereof is omitted. Obviously, the same modifications as those of the first to fourth embodiments may also be applied to the present embodiment.

Figure 13:
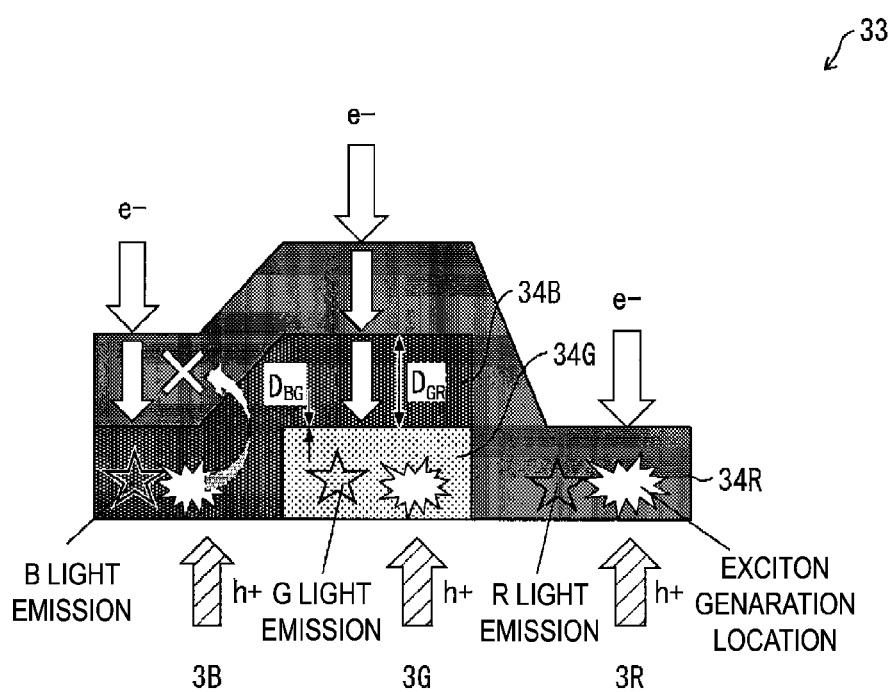
FIG. 13 is a diagram illustrating a schematic configuration of a light-emitting layer unit of an organic EL display apparatus and illustrating a principle of light emission by the light-emitting layer unit according to a fifth embodiment of the disclosure.

FIG. 13 is a diagram illustrating a schematic configuration of the light-emitting layer unit 33 of the organic EL display apparatus 1 and illustrating a principle of light emission by the light-emitting layer unit 33 according to the present embodiment. FIG. 14 is a cross sectional view illustrating an example of a schematic configuration of the organic EL display apparatus 1 according to the present embodiment. Note that the cross-sectional view of FIG. 14 illustrates an example of a schematic configuration of a single pixel area of the organic EL display apparatus 1 and corresponds to a cross section taken along the line L1-L2 in FIG. 3.

Figure 14:
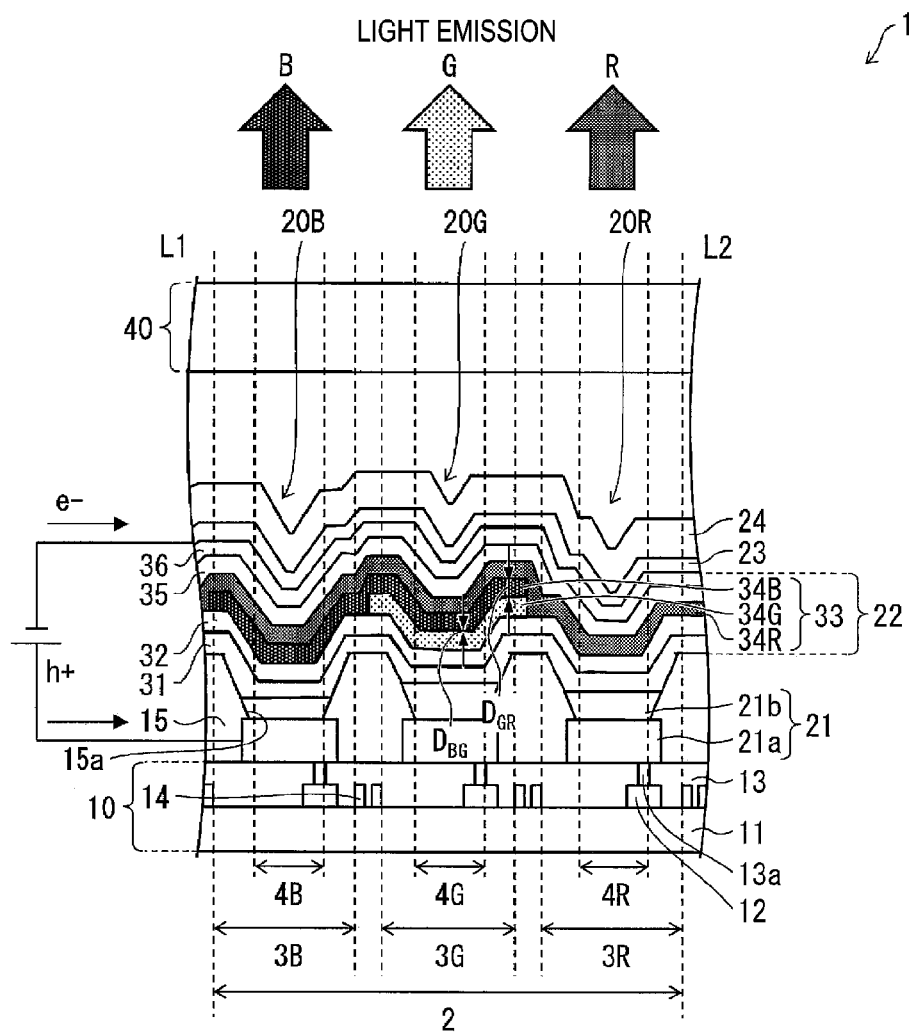
FIG. 14 is a cross-sectional view illustrating an example of a schematic configuration of an organic EL display apparatus according to the fifth embodiment of the disclosure.

Schematic Configuration of Organic EL Display Apparatus 1 and Method for Manufacturing Same As illustrated in FIG. 13 and FIG. 14, the organic EL display apparatus 1 according to the present embodiment has a configuration where the light-emitting layer unit 33 is provided between the first electrode 21 and the second electrode 23; and in the light-emitting layer unit 33, the red light-emitting layer 34R, the green light-emitting layer 34G, and the blue light-emitting layer 34B are layered in this order from the first electrode 21 side. To put it differently, in the present embodiment, the layers in the light-emitting layer unit 33 are layered in the reverse order from the corresponding orders in the first to fourth embodiments.

Hence, in the present embodiment, as illustrated in FIG. 13, for example, an electron-transport material is used as the material having the highest content percentage of all the materials in the blue light-emitting layer 34B, or preferably electron-transport materials are used as all the materials for the blue light-emitting layer 34R. In addition, either a bipolar transport material or an electron-transport material is used as the material having the highest content percentage of all the materials in the red light-emitting layer 34R, or preferably bipolar transport materials or electron-transport materials are used as all the materials for the red light-emitting layer 34R.

The carrier mobilities of each material for the green light-emitting layer 34G are not particularly limited, but for the reasons described in the first embodiment, it is preferable that the material having the highest combination ratio of all the materials for the green light-emitting layer 34G or preferably all the materials for the green light-emitting layer 34G be either a material or materials exhibiting electron transport properties or bipolar transport properties, and it is more preferable that such a material or materials be an electron-transport material or electron-transport materials. The organic EL display apparatus 1 according to the present embodiment has a configuration that is identical to the corresponding configuration of the organic EL display apparatus 1 according to the first embodiment except the above-mentioned points.

In addition, a method for manufacturing the organic EL display apparatus 1 according to the present embodiment is identical to, for example, the method of manufacturing the organic EL display apparatus 1 according to the first embodiment except that the green light-emitting layer formation process, the blue light-emitting layer formation process, and the red light-emitting layer formation process are performed in this order.

Display Method of Organic EL Display Apparatus 1

Hence, in the present embodiment, the light emission is performed in a similar manner to the light emission in the first embodiment. To put it differently, as illustrated in FIG. 13, in the subpixel 3B, excitons are generated in the blue light-emitting layer 34B as in the case of the first embodiment. For the reasons described in the first embodiment, in the subpixel 3B, the energy transfer that would otherwise be caused by the Förster transfer does not occur from the blue light-emitting layer 34B to the red light-emitting layer 34R. Hence, the subpixel 3B achieves almost 100% blue light emission (blue fluorescence emission).

In the subpixel 3G, depending on the carrier balance among the light-emitting layers 34, especially the carrier balance between the blue light-emitting layer 34B and the green light-emitting layer 34G, the holes and the electrons are recombined together either in the blue light-emitting layer 34B as in the case of the subpixel 3B or in the green light-emitting layer 34G, and thus excitons are generated in their respective locations.

FIG. 13 illustrates an exemplar case where excitons are generated in the green light-emitting layer 34G. Also in the present embodiment, for the reasons described in the first embodiment, the energy transfer that would otherwise be caused by the Förster transfer does not occur from either the green light-emitting layer 34G or the blue light-emitting layer 34B to the red light-emitting layer 34R. Hence, in a case where excitons are generated in the green light-emitting layer 34G, light is emitted when the excitons generated in the green light-emitting layer 34G are decayed back to the ground state. Hence, the subpixel 3G achieves almost 100% green light emission (green fluorescence emission) in the green light-emitting layer 34G. In this case, use of a TADF material as the green fluorescent luminescent material renders similar effects to those described in the first embodiment.

Also in the present embodiment, in a case where in each subpixel 3G, excitons are generated in the blue light-emitting layer 34B, the distance $D_{BG}$ between the green light-emitting layer 34G and the blue light-emitting layer 34B that is not greater than the Förster radius allows the Förster transfer to occur from the $S_1$ level of the blue fluorescent luminescent material to the $S_1$ level of the green fluorescent luminescent material. As a result, the subpixel 3G achieves almost 100% green light emission (green fluorescence emission). Also in the present embodiment, the blue light-emitting layer 34B is formed between the green light-emitting layer 34G and the red light-emitting layer 34R. Hence, as described in the first embodiment, no energy transfer occurs from the green light-emitting layer 34G to the red light-emitting layer 34R in the subpixel 3G. In this case, use of a TADF material as the blue fluorescent luminescent material renders similar effects to those described in the first embodiment.

In the subpixel 3R, excitons are generated in the red light-emitting layer 34R, and the subpixel 3R achieves almost 100% red light emission (red fluorescence emission). In this case, use of a TADF material as the red fluorescent luminescent material renders similar effects to those described in the first embodiment.

Advantageous Effects

Accordingly, the present embodiment can also obtain similar advantageous effects to those of the first embodiment. In cases of related art, a change in the layering order or in the carrier mobilities may cause color mixing. In the present embodiment, however, despite the fact that the order of layering the light-emitting layers 34 is changed from the order in the first to the fourth embodiments, each subpixel 3 can obtain its own luminescent color with a high efficiency without causing any color mixing or color shift to take place. In addition, a higher degree of freedom in selecting the carrier mobilities than in the cases of related art can be obtained also in the present embodiment. Based on the results described above, the organic EL display apparatus 1 has a higher degree of freedom in the layering order of the light-emitting layers 34 in the light-emitting layer unit 33 and in the selection of materials than in the cases of related art.

Note that the foregoing description of the present embodiment is based on an example modified from the organic EL display apparatus 1 according to the first embodiment, but the present embodiment is not limited to such modifications. Alternatively, as described earlier, the present embodiment may be modified in a similar manner to the first to fourth embodiments, and effects that are similar to those obtained in the first to fourth embodiments can be obtained by the modifications. For example, use of a red phosphorescent luminescent material as the luminescent material of the red light-emitting layer 34R generates triplet excitons in the red light-emitting layer 34R, and the subpixel 3R achieves almost 100% red phosphorescent light emission.

Sixth Embodiment

A description follows regarding yet another embodiment of the disclosure, mainly with reference to FIGS. 15 to 18.

The present embodiment will be described about differences between the present embodiment and the first embodiment to the fifth embodiment, and components having the same functions as those of the components described in the first embodiment to the fifth embodiment are appended with the same reference signs, and the description thereof is omitted. Obviously, the same modifications as those of the first embodiment to the fifth embodiment may also be applied to the present embodiment.

Figure 15:
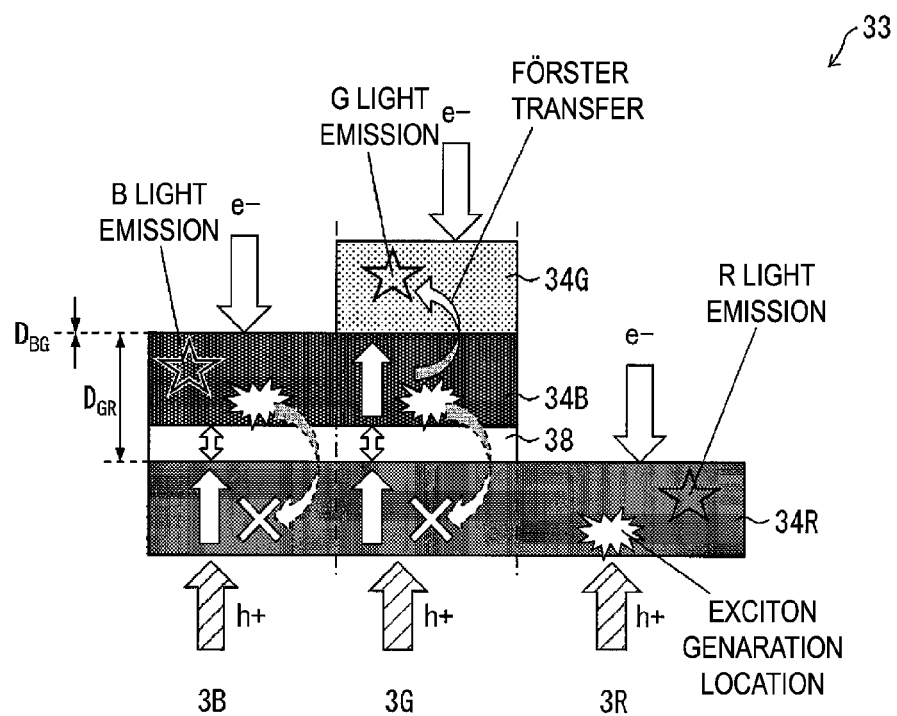
FIG. 15 is a diagram illustrating a schematic configuration of a light-emitting layer unit of an organic EL display apparatus and illustrating a principle of light emission by the light-emitting layer unit according to a sixth embodiment of the disclosure.
Figure 16:
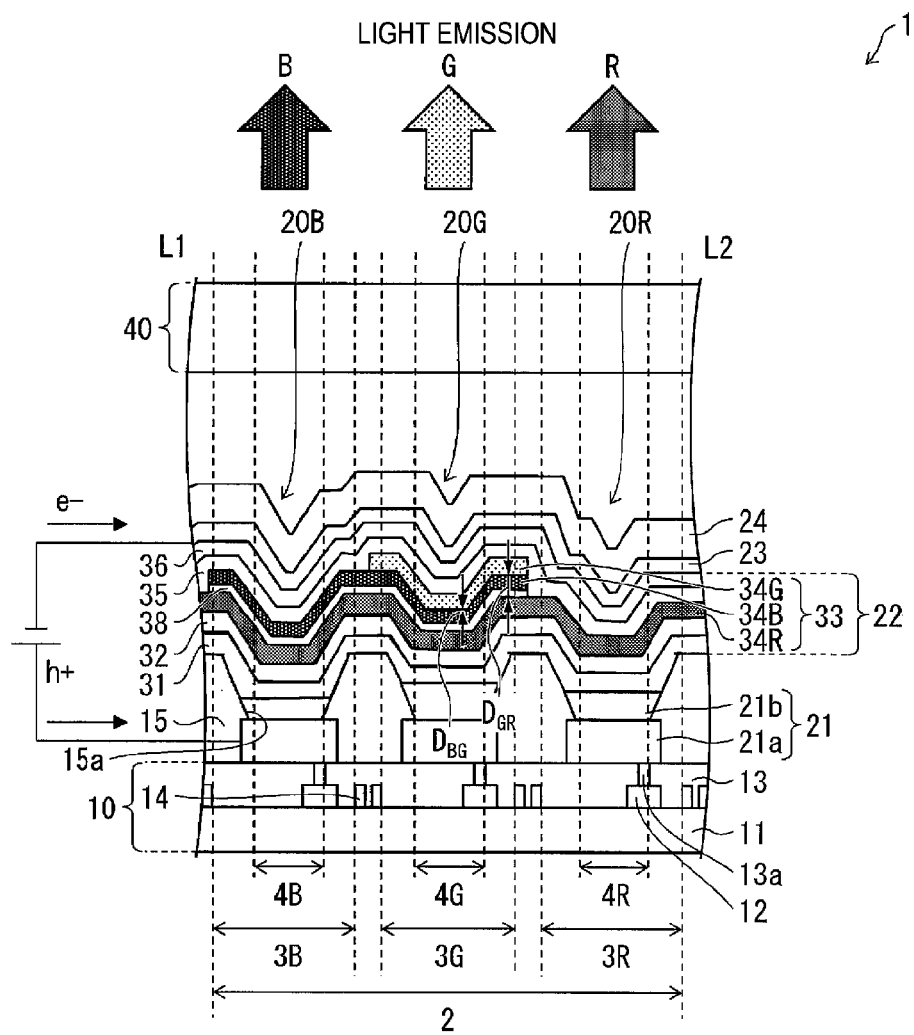
FIG. 16 is a cross-sectional view illustrating an exemplar schematic configuration of the organic EL display apparatus according to the sixth embodiment of the disclosure.

Schematic Configuration of Organic EL Display Apparatus 1 and Method for Manufacturing Same FIG. 15 is a diagram illustrating a schematic configuration of the light-emitting layer unit 33 of the organic EL display apparatus 1 and illustrating a principle of light emission by the light-emitting layer unit 33 according to the present modified example. FIG. 16 is a cross sectional view illustrating an example of a schematic configuration of the organic EL display apparatus 1 according to the present embodiment. Note that the cross-sectional view of FIG. 16 illustrates an example of a schematic configuration of a single pixel area of the organic EL display apparatus 1 and corresponds to a cross section taken along the line L1-L2 in FIG. 3.

As illustrated in FIG. 15 and FIG. 16, the organic EL display apparatus 1 according to the present embodiment has a configuration where in the organic EL display apparatus 1 according to the first embodiment, a separation layer 38 configured to block the Förster transfer is formed as an intermediate layer containing no luminescent material between the blue light-emitting layer 34B and the red light-emitting layer 34R in each of the subpixels 3B and 3G. The separation layer 38 is a layer configured to adjust the distance $D_{GR}$ between the green light-emitting layer 34G and the red light-emitting layer 34R in each subpixel 3G to make the distance $D_{GR}$ greater than the Förster radius. The separation layer 38 contains no material that causes Förster transfer from any of the green luminescent material, the blue luminescent material, and the red luminescent material.

Note that FIG. 15 and FIG. 16 illustrate an exemplar case where the separation layer 38 is formed between the blue light-emitting layer 34B and the red light-emitting layer 34R in each of the subpixels 3B and 3G as a common layer that is common to the subpixel 3B and the subpixel 3G.

The separation layer 38, however, has only to be formed between blue light-emitting layer 34B and the red light-emitting layer 34R at least in each subpixel 3G. The total layer thickness of the blue light-emitting layer 34B and the separation layer 38 must be greater than the Förster radius, and the distance DBG between the green light-emitting layer 34G and the blue light-emitting layer 34B must be equal to or smaller than the Förster radius. Hence, it is not necessary to form the separation layer 38 between the blue light-emitting layer 34B and the red light-emitting layer 34R in the subpixel 3B as illustrated in FIG. 15 and FIG. 16.

Figure 17:
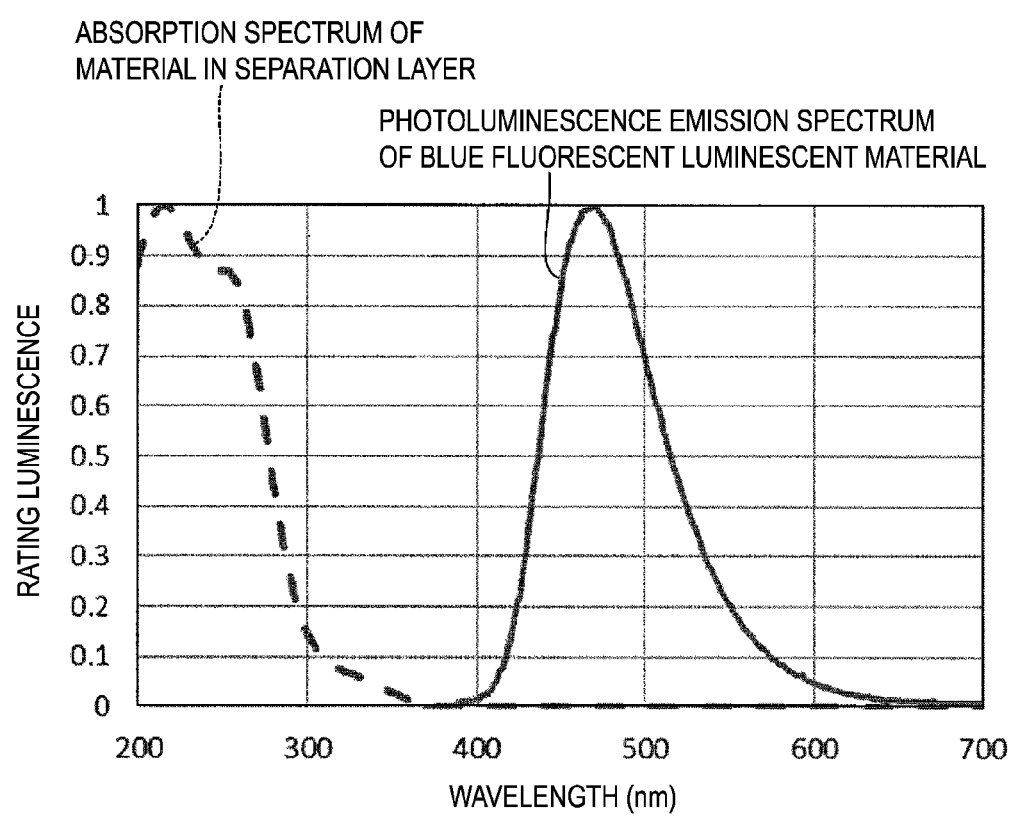
FIG. 17 is a graph showing both an exemplar photoluminescence emission spectrum of a blue fluorescent luminescent material used in the sixth embodiment of the disclosure and an exemplar absorption spectrum of a material in a separation layer used in the sixth embodiment of the disclosure.

FIG. 17 is a graph showing both an exemplar photoluminescence emission spectrum of a blue fluorescent luminescent material and an exemplar absorption spectrum of a material in the separation layer 38. FIG. 17 exhibits the PL emission spectrum of 2,5,8,11-tetra-tert-butylperylene (TBPe) as the PL emission spectrum of a blue fluorescent luminescent material, and FIG. 17 also exhibits the absorption spectrum of 2,9-dimethyl-4,7-diphenyl-1,10-phenanthroline (BCP) as the absorption spectrum of a material in the separation layer 38.

As illustrated in FIG. 17, it is preferable that there be no overlapping between the absorption spectrum of all the materials contained in the separation layer 38 (i.e., the materials for the separation layer 38) and the PL emission spectrum of the blue luminescent material (blue fluorescent luminescent material in the present embodiment) contained in the blue light-emitting layer 34B that is adjacent the separation layer 38 on the opposite side of the separation layer 38 from the red light-emitting layer 34R. As illustrated in FIG. 17, for example, BCP, which is a material for the separation layer 38, has no light emission spectrum in the visible range. Hence, its absorption spectrum is in the UV range but on the significantly shorter wavelength side. Accordingly, the absorption spectrum of BCP has no overlapping with the PL emission spectrum of, for example, TBPe, which is a blue fluorescent luminescent material (blue fluorescence dopant) contained in the blue light-emitting layer 34B.

The layer thickness of the separation layer 38 has only to be designed to render the total layer thickness of the blue light-emitting layer 34B and the separation layer 38 greater than the Förster radius. As described in the first embodiment, by separating the two mutually opposing surfaces of the two light-emitting layers 34 by at least 15 nm, even totally overlapping of the PL emission spectrum and the absorption spectrum of the luminescent materials of the two light-emitting layers 34 can cause no Förster transfer between the two light-emitting layers 34. Hence, it is preferable that the total layer thickness of the blue light-emitting layer 34B and the separation layer 38 be set to at least 15 nm.

The separation layer 38 alone may have a layer thickness of 15 nm or greater. Alternatively, the separation layer 38 may have a layer thickness that render the total layer thickness of the blue light-emitting layer 34B and the separation layer 38 at least 15 nm, but the layer thickness of the separation layer 38 alone may be smaller than 15 nm, for example, smaller than the Förster radius.

Note that as described above, the separation layer 38 is formed between the blue light-emitting layer 34B and the red light-emitting layer 34R in each of the subpixels 3B and 3G as a common layer that is common to the subpixel 3B and the subpixel 3G. In addition, the layer thickness of the separation layer 38 in the subpixel 3B is not smaller than the Förster radius, and more preferably not smaller than 15 nm. Consequently, no energy transfers from the blue light-emitting layer 34B to the separation layer 38. Hence, the Förster transfer between the blue light-emitting layer 34B and the red light-emitting layer 34R in the subpixel 3B can be prevented reliably.

The layer thickness of the separation layer 38 has only to be a thickness that can block the Förster transfer between the green light-emitting layer 34G and the red light-emitting layer 34R in the subpixel 3G, but a greater layer thickness of the separation layer 38 makes the organic EL display apparatus 1 thicker. Hence, for the purposes of suppressing the increase in the size of the organic EL display apparatus 1 and reducing the voltage required by the element, it is preferable that the layer thickness of the separation layer 38 be not greater than 50 nm, and it is more preferable that the layer thickness be not greater than 30 nm.

In the present embodiment, the total layer thickness of the blue light-emitting layer 34B and the separation layer 38 has only to be greater than the Förster radius as described above.

Hence, the layer thickness of the blue light-emitting layer 34B does not have to be equal to 15 nm or greater as in the case of the first embodiment and is not particularly limited.

According to the present embodiment, by forming the separation layer 38 between the blue light-emitting layer 34B and the red light-emitting layer 34R, the layer thickness of the blue light-emitting layer 34B can be reduced down to 10 nm or even smaller. By reducing the layer thickness of the blue light-emitting layer 34B down to 10 nm or even smaller, the minimum distance from any position in the blue light-emitting layer 34B to the green light-emitting layer 34G can be reduced down to 10 nm or even smaller. Förster transfer can be made possible even for a molecule of the blue fluorescent luminescent material located on the opposite side of the blue light-emitting layer 34B from the green light-emitting layer 34G.

The separation layer 38 has only to allow the carriers to flow from the first electrode 21 and the second electrode 23 towards the blue light-emitting layer 34B. In the present embodiment, the separation layer 38 is made from a hole-transport material, but as illustrated in FIG. 15, it is preferable that the separation layer 38 as a whole exhibit good bipolar transport properties. In a case where a material exhibiting good bipolar transport properties is used for the separation layer 38, the material is either a material that exhibits good bipolar transport properties as in the case with bipolar transport materials or a combination of two or more kinds of materials that exhibit good bipolar transport properties when combined. Note that the matters concerning the carrier mobilities in the other layers are the same as described in the first embodiment.

The organic EL display apparatus 1 according to the present embodiment has a configuration that is identical to the corresponding configuration according to the first embodiment except the above-mentioned points. In addition, in the present embodiment, as described above, the blue light-emitting layer 34B and the separation layer 38 are formed between the green light-emitting layer 34G and the red light-emitting layer 34R, more specifically, the separation layer 38 is formed between the blue light-emitting layer 34B and the red light-emitting layer 34R. In addition, there is no overlapping between the light emission spectrum of the blue fluorescent luminescent material and the absorption spectrum of the material for the separation layer 38. The distance $D_{GR}$ between the green light-emitting layer 34G and the red light-emitting layer 34R is greater than the Förster radius. Hence, also in the present embodiment, no energy is transferred from the green light-emitting layer 34G to the red light-emitting layer 34R. Accordingly, the principle of light emission for the organic EL display apparatus 1 according to the present embodiment is the same as that in the first embodiment.

Production Method of Organic EL Display Apparatus 1

A method for forming the organic EL display apparatus 1 according to the present embodiment is identical to the method of manufacturing the organic EL display apparatus 1 according to the first embodiment except that a separation layer formation process for forming the separation layer 38 is additionally included between the red light-emitting layer formation process and the blue light-emitting layer formation process in the first embodiment.

Note that FIG. 15 and FIG. 16 illustrate an exemplar case where the separation layer 38 is formed between the blue light-emitting layer 34B and the red light-emitting layer 34R as a common layer that is common to the subpixel 3B and the subpixel 3G. Hence, in the method of manufacturing the organic EL display apparatus 1 illustrated in FIG. 15 and FIG. 16, the separation layer 38 and the blue light-emitting layer 34B can be formed, for example, consecutively by the use of the same vapor deposition mask. Hence, in the blue light-emitting layer formation process, the blue light-emitting layer 34B having the identical pattern to the pattern of the separation layer 38 when viewed from above is formed on the separation layer 38. The present embodiment, however, is not limited to this method. Alternatively, separate vapor deposition masks each of which has an identical opening pattern to the other's and each of which is dedicated to each of the separation layer 38 and the blue light-emitting layer 34B may be used to pattern-form the separation layer 38 and the blue light-emitting layer 34B.

Advantageous Effects

As has been described thus far, the organic EL display apparatus 1 according to the present embodiment has a configuration that is identical to the configuration of the organic EL display apparatus 1 according to the first embodiment except that the separation layer 38 containing no luminescent material is formed to block the Förster transfer between the green light-emitting layer 34G and the red light-emitting layer 34R, and that the total layer thickness of the separation layer 38 and the blue light-emitting layer 34B located between the green light-emitting layer 34G and the red light-emitting layer 34R is greater than the Förster radius. In addition, the organic EL display apparatus 1 according to the present embodiment performs light emission based on the same principle as that in the first embodiment. Accordingly, the present embodiment can also obtain similar advantageous effects to those of the first embodiment.

In addition, according to the present embodiment, by forming the separation layer 38 between the blue light-emitting layer 34B and the red light-emitting layer 34R as described above, the layer thickness of the blue light-emitting layer 34B can be reduced down to the Förster radius or even smaller. Hence, the luminous efficiency of the green light-emitting layer 34G in the subpixel 3G can be improved from the corresponding efficiency in the first embodiment.

Modified Example

Figure 18:
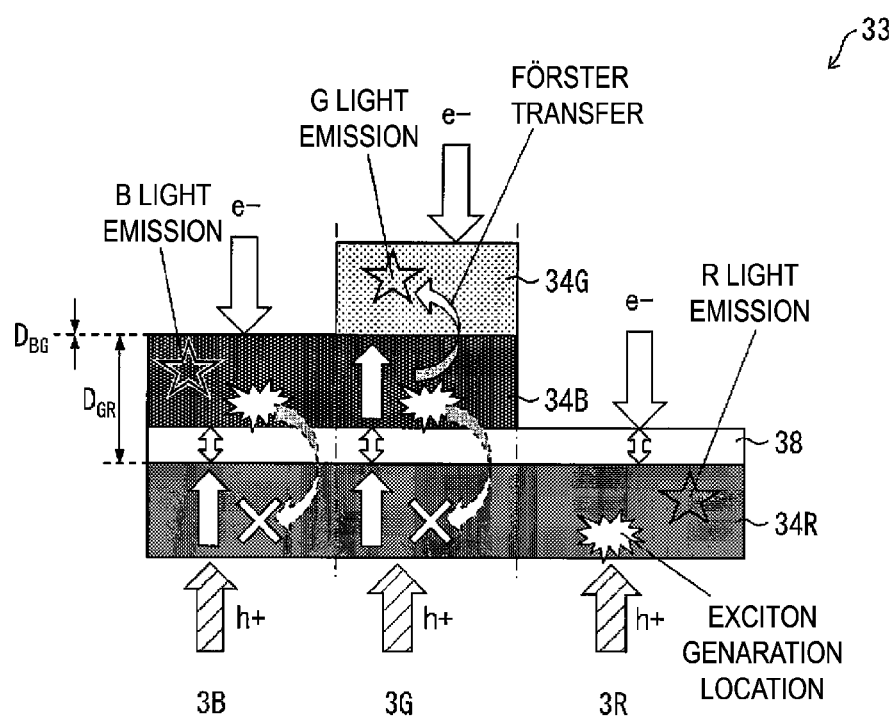
FIG. 18 is a diagram illustrating a schematic configuration of a light-emitting layer unit of an organic EL display apparatus and illustrating a principle of light emission by the light-emitting layer unit according to a modified example of the sixth embodiment of the disclosure.

FIG. 18 is a diagram illustrating a schematic configuration of the light-emitting layer unit 33 of the organic EL display apparatus 1 and illustrating a principle of light emission by the light-emitting layer unit 33 according to a modified example of the present embodiment.

The separation layer 38 has only to be formed between the blue light-emitting layer 34B and the red light-emitting layer 34R in each subpixel 3G, but as illustrated in FIG. 18, the separation layer 38 may be formed as a common layer that is common to the subpixels 3B, 3G, and 3R.

As illustrated in FIG. 18, the organic EL display apparatus 1 according to the present modified example has a configuration that is identical to the configuration of the organic EL display apparatus 1 illustrated in FIG. 16 and FIG. 17 except that the separation layer 38 is formed as a common layer that is common to the subpixels 3B, 3G, and 3R. As illustrated in FIG. 18, the principle of light emission for the organic EL display apparatus 1 according to the present modified example is the same as that in the case of the organic EL display apparatus 1 illustrated in FIG. 16.

In a case where the separation layer 38 is formed as a common layer that is common to the subpixels 3B, 3G, and 3R as described above, the separation layer 38 is like the red light-emitting layer 34R and can be formed not by a separately patterning vapor deposition technique but by the use of, for example, an open mask as the vapor deposition mask for separation layer formation. Thus, the separation layer 38 can be vapor-deposited on the entire surface of the display region 1a of the TFT substrate 10. In addition, the vapor deposition mask for forming the red light-emitting layer can be used in the film formation of the separation layer 38. The separation layer 38 and the red light-emitting layer 34R may be formed consecutively by the use of the vapor deposition mask for forming the red light-emitting layer.

In addition, the foregoing description of the present embodiment is based on an example modified from the organic EL display apparatus 1 according to the first embodiment, but the present embodiment is not limited to such modifications. Alternatively, as described earlier, the present embodiment may be modified in a similar manner to the first to fifth embodiments, and effects that are similar to those obtained in the first to fifth embodiments can be obtained by the modifications.

For example, though not illustrated, in the organic EL display apparatus 1 according to the fifth embodiment, the separation layer 38 may be formed between the blue light-emitting layer 34B and the red light-emitting layer 34R in the subpixel 3G. Also in this case, similar advantageous effects to those obtained by the present embodiment can be obtained.

Seventh Embodiment

A description will be given of yet another embodiment of the disclosure, with reference mainly to FIG. 19 to FIG. 21.

The present embodiment will be described about differences between the present embodiment and the first embodiment to the sixth embodiment, and components having the same functions as those of the components described in the first embodiment to the sixth embodiment are appended with the same reference signs, and the description thereof is omitted. Obviously, the same modifications as those of the first embodiment to the sixth embodiment may also be applied to the present embodiment.

Figure 19:
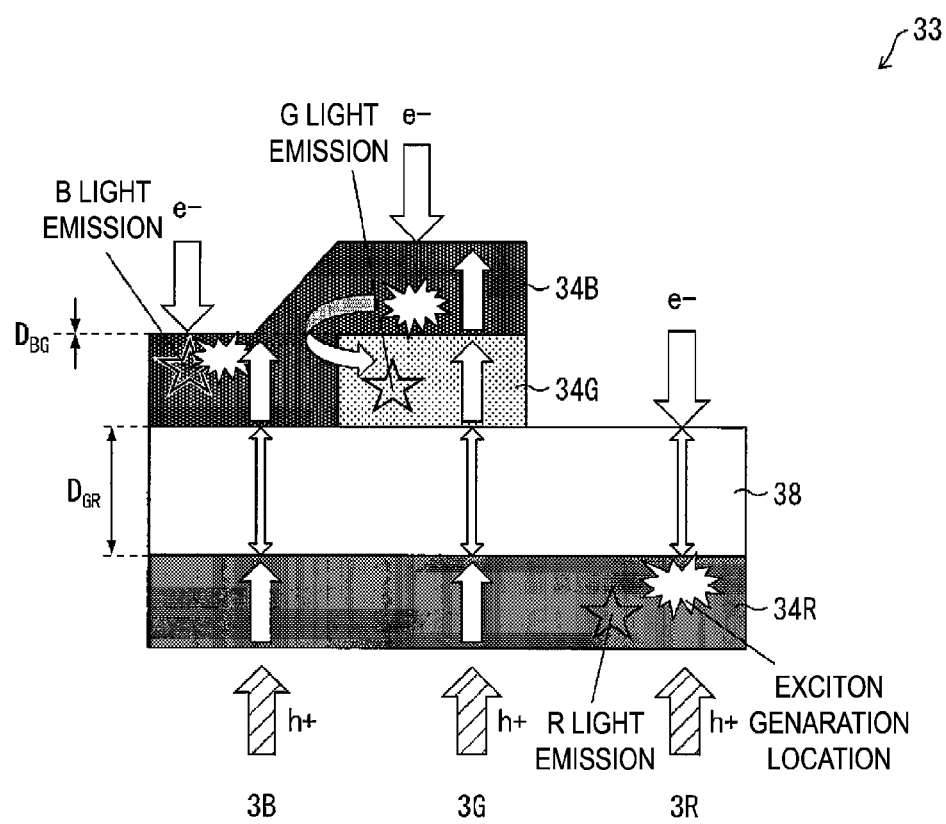
FIG. 19 is a cross-sectional view illustrating an exemplar schematic configuration of the organic EL display apparatus according to a seventh embodiment of the disclosure.

Schematic Configuration of Organic EL Display Apparatus 1 and Method for Manufacturing Same FIG. 19 is a diagram illustrating a schematic configuration of the light-emitting layer unit 33 of the organic EL display apparatus 1 and illustrating a principle of light emission by the light-emitting layer unit 33 according to the present modified example. FIG. 20 is a cross sectional view illustrating an example of a schematic configuration of the organic EL display apparatus 1 according to the present embodiment. Note that the cross-sectional view of FIG. 20 illustrates an example of a schematic configuration of a single pixel area of the organic EL display apparatus 1 and corresponds to a cross section taken along the line L1-L2 in FIG. 3.

Figure 20:
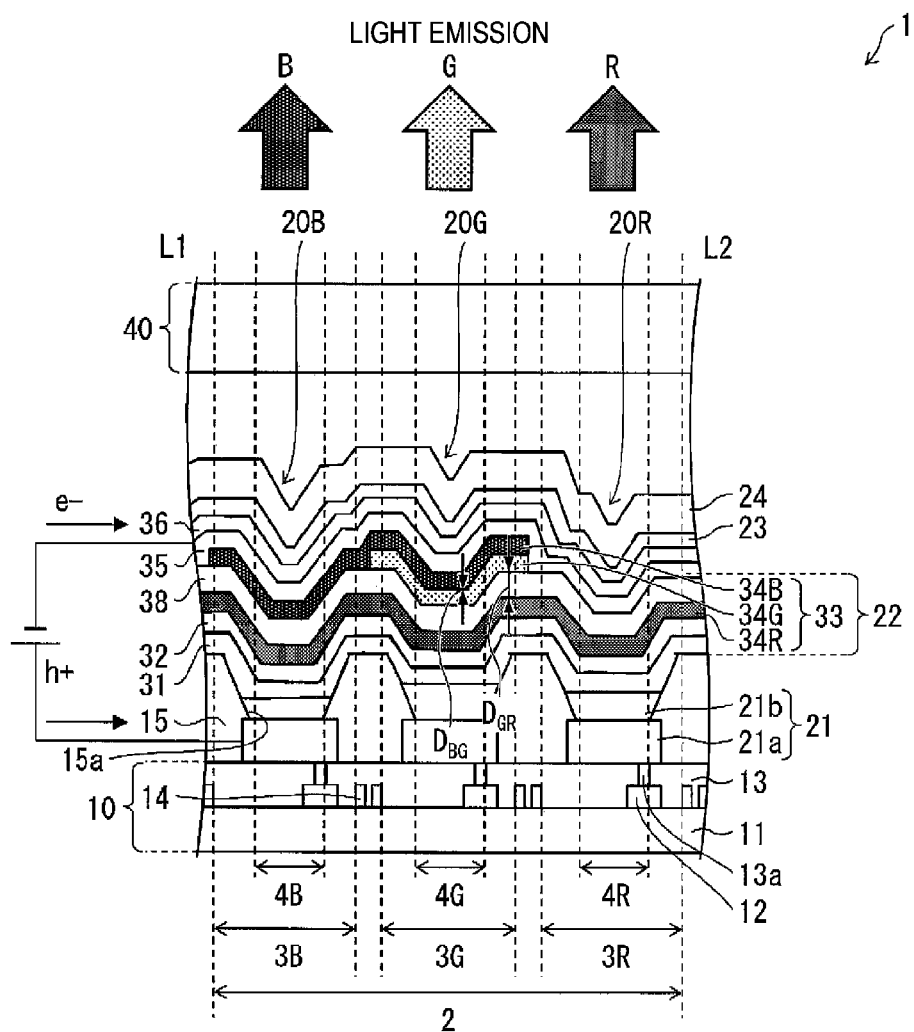
FIG. 20 is a cross sectional view illustrating an example of a schematic configuration of the organic EL display apparatus according to the present embodiment.

As illustrated in FIG. 19 and FIG. 20, the organic EL display apparatus 1 according to the present embodiment has a configuration where the light-emitting layer unit 33 is provided between the first electrode 21 and the second electrode 23; and in the light-emitting layer unit 33, the red light-emitting layer 34R, the separation layer 38, the green light-emitting layer 34G, and the blue light-emitting layer 34B are layered in this order from the first electrode 21 side. To put it differently, in the present embodiment, the green light-emitting layer 34G and the blue light-emitting layer 34B in the subpixel 3G are layered in the reverse order form the corresponding orders in the first to sixth embodiments.

Note that also in the present embodiment, the description of the example illustrated in FIG. 19 and FIG. 20 is based on a case where the separation layer 38 is formed as a common layer that is common to the subpixel 3B, the subpixel 3G, and the subpixel 3R. The separation layer 38, however, has only to be formed on the red light-emitting layer 34R in the subpixel 3G (however, between the red light-emitting layer 34R and the green light-emitting layer 34G in the present embodiment). Hence, it is not necessary to form the separation layer 38 on the red light-emitting layer 34R in the subpixel 3B or in the subpixel 3R.

In the present embodiment, the separation layer 38 is the only member that is formed between the green light-emitting layer 34G and the red light-emitting layer 34R in the subpixel 3G. Hence, the separation layer 38 alone needs to prevent the energy from being transferred from the green light-emitting layer 34G to the red light-emitting layer 34R.

Figure 21:
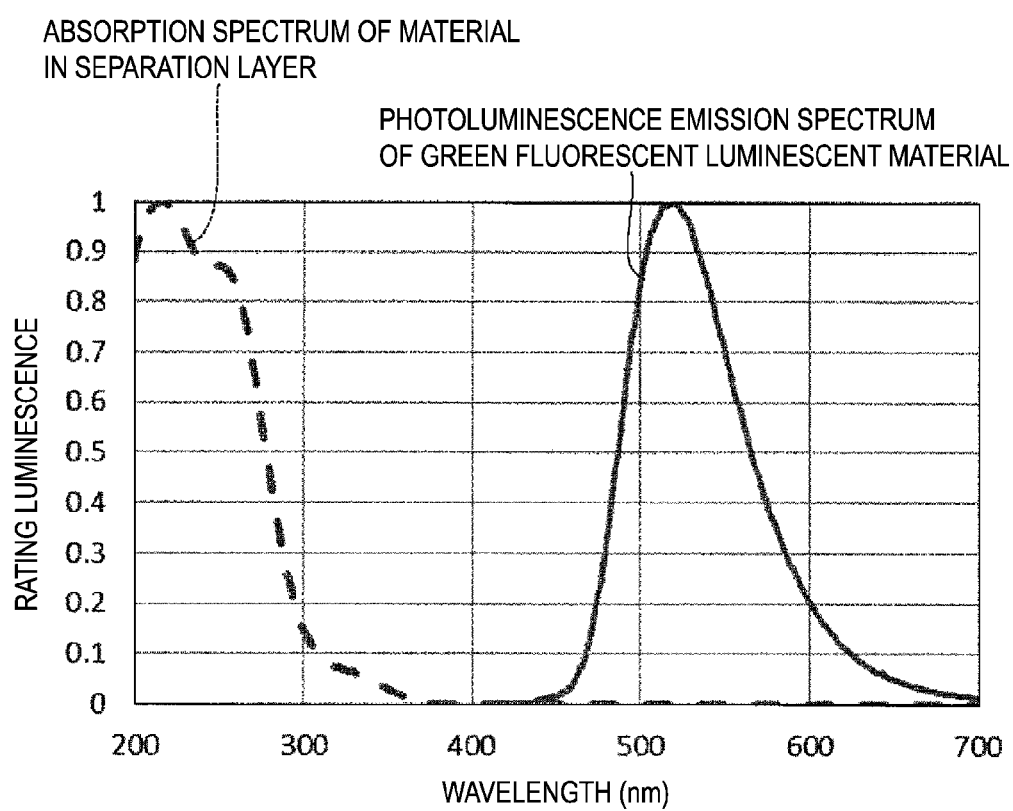
FIG. 21 is a graph showing both an exemplar photoluminescence emission spectrum of a green fluorescent luminescent material used in the seventh embodiment of the disclosure and an exemplar absorption spectrum of a material in a separation layer used in the seventh embodiment of the disclosure.

FIG. 21 is a graph showing both an exemplar photoluminescence emission spectrum of a green fluorescent luminescent material and an exemplar absorption spectrum of a material in the separation layer 38. FIG. 21 exhibits the PL emission spectrum of 2,3-(2-benzothiazolyl)-7-(diethylamino)coumarin (coumarin 6) as the PL emission spectrum of a green fluorescent luminescent material, and FIG. 21 also exhibits the absorption spectrum of 2,9-dimethyl-4,7-diphenyl-1,10-phenanthroline (BCP) as the absorption spectrum of a material for the separation layer 38.

As illustrated in FIG. 21, it is preferable that there be no overlapping between the absorption spectrum of all the materials contained in the separation layer 38 (i.e., the materials for the separation layer 38) and the PL emission spectrum of the green luminescent material (green fluorescent luminescent material in the present embodiment) contained in the green light-emitting layer 34G that is adjacent the separation layer 38 on the opposite side of the separation layer 38 from the red light-emitting layer 34R.

As illustrated in FIG. 21, for example, BCP, which is a material for the separation layer 38, has no light emission spectrum in the visible range. Hence, its absorption spectrum is in the UV range but on the significantly shorter wavelength side. Accordingly, the absorption spectrum of BCP has no overlapping with the PL emission spectrum of, for example, coumarin 6, which is a green fluorescent luminescent material (green fluorescence dopant) contained in the green light-emitting layer 34G.

In addition, as described in the sixth embodiment, it is preferable that there be no overlapping between the absorption spectrum of all the materials contained in the separation layer 38 (i.e., the materials for the separation layer 38) and the PL emission spectrum of the blue luminescent material (blue fluorescent luminescent material in the present embodiment) contained in the blue light-emitting layer 34B that is adjacent the separation layer 38 on the opposite side of the separation layer 38 from the red light-emitting layer 34R. As illustrated in FIG. 17, the PL emission spectrum of the blue fluorescent luminescent material, e.g., TBPe, has no overlapping with the absorption spectrum of BCP, a material for the separation layer 38.

In the present embodiment, to make the distance $D_{GR}$ between the red light-emitting layer 34R and the green light-emitting layer 34G greater than the Förster radius, the separation layer 38 is designed to have a layer thickness that is greater than the Förster radius, or more preferably that is at least 15 nm. As described in the first to the sixth embodiment, in a case where the two mutually opposing surfaces of the two light-emitting layers 34 are separated from each other by a distance that is greater than 15 nm, even totally overlapping of the PL emission spectrum and the absorption spectrum of the luminescent materials of the two light-emitting layers 34 can cause no Förster transfer between the two light-emitting layers 34.

Also in the present embodiment as in the sixth embodiment, the layer thickness of the separation layer 38 has only to be a thickness that can block the Förster transfer between the green light-emitting layer 34G and the red light-emitting layer 34R in the subpixel 3G, but a greater layer thickness of the separation layer 38 makes the organic EL display apparatus 1 thicker. Hence, for the purposes of suppressing the increase in the size of the organic EL display apparatus 1 and reducing the voltage required by the element, it is preferable that the layer thickness of the separation layer 38 be not greater than 50 nm, and it is more preferable that the layer thickness be not greater than 30 nm.

The layer thickness of the blue light-emitting layer 34B is not particularly limited, but for the reasons described in the sixth embodiment, it is preferable that the layer thickness be not greater than 10 nm. Also in the present embodiment, the distance $D_{BG}$ between the blue light-emitting layer 34B and the green light-emitting layer 34G is not greater than the Förster radius. In addition, the layer thickness of the red light-emitting layer 34R may be configured as that in cases of related art and is not limited to a particular thickness.

As described above, in the present embodiment, the green light-emitting layer 34G and the blue light-emitting layer 34B in the subpixel 3G are layered in the reverse order form the corresponding orders in the first to sixth embodiments. Each subpixel 3 having a layering structure according to the present embodiment is intended to efficiently emit the light of the luminescent color that is to be displayed. To this end, it is preferable that the material having the highest content percentage of all the materials for the green light-emitting layer 34G or, desirably, all the materials for the green light-emitting layer 34G be a material or materials allowing the carriers to flow from the first electrode 21 and the second electrode 23 towards the green light-emitting layer 34G within the subpixel 3G as illustrated in FIG. 19. For this transfer, it is desirable to use a hole-transport material having a hole mobility that is higher than its electron mobility.

To this end, it is preferable that a hole-transport material or hole-transport materials be used for: the material having the highest content percentage of all the materials for the blue light-emitting layer 34B or, desirably, all the materials for the blue light-emitting layer 34B; the material having the highest content percentage of all the materials for the green light-emitting layer 34G or, desirably, all the materials for the green light-emitting layer 34G; and the material having the highest content percentage of all the materials for the red light-emitting layer 34R or, desirably, all the materials for the red light-emitting layer 34R.

In addition, the material having the highest content percentage of all the materials in the separation layer 38 or preferably all the materials for the separation layer 38 may be a hole-transport material or hole-transport materials. As illustrated in FIG. 15, it is preferable that the separation layer 38 as a whole exhibit bipolar transport properties.

Note that as described above, use of hole-transport materials for the material having the highest content percentage in the blue light-emitting layer 34B, the material having the highest content percentage in the green light-emitting layer 34G, and the material having the highest content percentage in the red light-emitting layer 34R may raise the drive voltage from a case where electron-transport materials are used for such materials. However, the organic EL display apparatus 1 according to the present embodiment differs from the one employing the white CF technique in that it is not necessary to simultaneously make the entire blue light-emitting layer 34B, green light-emitting layer 34G, and red light-emitting layer 34R emit light. Hence, the drive voltage can be reduced from the case where the white CF technique is employed, and the power consumption at the time of driving can be reduced as well.

Note that in a case where the material having the highest content percentage in the separation layer 38 or preferably all the materials in the separation layer 38 is a hole-transport material or are hole-transport materials, the material having the highest content percentage of all the materials in the blue light-emitting layer 34B or preferably all the materials in the blue light-emitting layer 34B may be a material or materials allowing the carriers to flow, in the subpixel 3G, from the first electrode 21 and the second electrode 23 towards the green light-emitting layer 34G. Hence, in this case, the material having the highest content percentage of all the materials in the blue light-emitting layer 34B or preferably all the materials in the blue light-emitting layer 34B may be an electron-transport material or electron-transport materials.

The organic EL display apparatus 1 according to the present embodiment has a configuration that is identical to the corresponding configuration of the organic EL display apparatus 1 according to the first embodiment except the above-mentioned points.

In addition, a method for manufacturing the organic EL display apparatus 1 according to the present embodiment is identical to, for example, the method of manufacturing the organic EL display apparatus 1 according to the first embodiment except that the red light-emitting layer formation process, the separation layer formation process, the green light-emitting layer formation process, and the blue light-emitting layer formation process are performed in this order.

Also in the present embodiment, as in the first modified example of the sixth embodiment, the separation layer 38 is formed as a common layer that is common to the subpixels 3B, 3G, and 3R. Hence, the separation layer 38 is like the red light-emitting layer 34R and can be formed not by a separately patterning vapor deposition technique but by the use of, for example, an open mask as the vapor deposition mask for separation layer formation. Thus, the separation layer 38 can be vapor-deposited on the entire surface of the display region 1a of the TFT substrate 10. In this case, the vapor deposition mask for forming the red light-emitting layer can be used in the film formation of the separation layer 38. The separation layer 38 and the red light-emitting layer 34R may be formed consecutively by the use of the vapor deposition mask for forming the red light-emitting layer.

Display Method of Organic EL Display Apparatus 1

The organic EL display apparatus 1 according to the present embodiment has a configuration that is identical to, for example, the configuration of the sixth embodiment except that: in the subpixel 3G, the green light-emitting layer 34G and the blue light-emitting layer 34B are layered in the reverse order from the corresponding order in the sixth embodiment; as a result, for example, a hole-transport material is used as the material having the highest ratio of mixing of all the materials in the green light-emitting layer 34G; and the separation layer 38 has a layer thickness that is greater than the Förster radius.

Hence, the principle of light emission in the subpixels 3B and 3R is the same as the corresponding principle in the sixth embodiment. As illustrated in FIG. 19, in the subpixel 3B, excitons are generated in the blue light-emitting layer 34B. For the reasons described in the first and the sixth embodiments, in the subpixel 3B, the energy transfer that would otherwise be caused by the Förster transfer does not occur from the blue light-emitting layer 34B to the red light-emitting layer 34R. Hence, the subpixel 3B achieves almost 100% blue light emission (blue fluorescence emission).

In the subpixel 3G, depending on the carrier balance among the light-emitting layers 34, especially the carrier balance between the blue light-emitting layer 34B and the green light-emitting layer 34G, the holes and the electrons are recombined together either in the blue light-emitting layer 34B or in the green light-emitting layer 34G, and thus excitons are generated in their respective locations.

FIG. 19 illustrates an exemplar case where excitons are generated in the blue light-emitting layer 34B. As described earlier in the first embodiment, the $S_1$ level of the green fluorescent luminescent material is lower than the $S_1$ level of the blue fluorescent luminescent material. The blue light-emitting layer 34B and the green light-emitting layer 34G are mutually adjacent, and a part of the PL emission spectrum of the blue fluorescent luminescent material overlaps a part of the absorption spectrum of the green fluorescent luminescent material. Hence, as illustrated in FIG. 19, in the subpixel 3G, in a case where excitons are generated in the blue light-emitting layer 34B, the Förster transfer from the $S_1$ level of the blue fluorescent luminescent material to the $S_1$ level of the green fluorescent luminescent material does occur. On the other hand, due to the separation layer 38 formed between the green light-emitting layer 34G and the red light-emitting layer 34R, no Förster transfer occurs from the $S_1$ level of the green luminescent material to the $S_1$ level of the red luminescent material. Hence, the subpixel 3G achieves almost 100% green light emission (green fluorescence emission). In this case, use of a TADF material as the blue fluorescent luminescent material causes reverse intersystem crossing to convert upwardly the excitons with a 75% $T_1$ level generated in the blue light-emitting layer 34B to the $S_1$ level. Hence, the luminous efficiency in the subpixel 3B and the luminous efficiency in the subpixel 3G can be improved to a great degree.

Note that as described above, no Förster transfer occurs from the $S_1$ level of the green luminescent material to the $S_1$ level of the red luminescent material. Hence, in a case where excitons are generated in the green light-emitting layer 34G, almost 100% green light emission (green fluorescence emission) is achieved in the green light-emitting layer 34G. In this case, use of a TADF material as the green fluorescent luminescent material causes reverse intersystem crossing to convert upwardly the excitons with a 75% $T_1$ level generated in the green light-emitting layer 34G to the $S_1$ level. Hence, the luminous efficiency in the subpixel 3G can be improved to a great degree. As described earlier, in a case, for example, where the material having the highest content percentage in the separation layer 38 is a hole-transport material and where the material having the highest content percentage in the blue light-emitting layer 34B is an electron-transport material, excitons are generated in the subpixel 3G.

Also in the present embodiment, in the subpixel 3R, the light-emitting layer includes only the red light-emitting layer 34R. In the subpixel 3R, excitons are generated in the red light-emitting layer 34R, and the subpixel 3R achieves almost 100% red light emission (red fluorescence emission). In this case, use of a TADF material as the red fluorescent luminescent material causes reverse intersystem crossing to convert upwardly the excitons with a 75% $T_1$ level generated in the red light-emitting layer 34R to the $S_1$ level. Hence, the luminous efficiency in the subpixel 3R can be improved to a great degree.

Advantageous Effects

Accordingly, the present embodiment can also obtain similar advantageous effects to those of the first and the sixth embodiments. In the present embodiment, despite the fact that the order of layering the light-emitting layers 34 is partially changed from the order in the first to the sixth embodiments, each subpixel 3 can obtain its own luminescent color with a high efficiency without causing any color mixing or color shift to take place. In addition, a higher degree of freedom in selecting the carrier mobilities than in the cases of related art can be obtained also in the present embodiment. Hence, the organic EL display apparatus 1 has a higher degree of freedom in the layering order of the light-emitting layers 34 in the light-emitting layer unit 33 and in the selection of materials than in the cases of related art.

Note that though not described in detail below, in the present embodiment, it is possible to modify the first embodiment, or it is possible to make similar modifications to those in the second to fifth embodiments. By means of such modifications, similar advantageous effects to those obtained by such embodiments can be obtained.

Supplement

A display apparatus (e.g., organic EL display apparatus 1) according to a first aspect of the disclosure may include: a display region 1a; a first electrode (first electrode 21); a second electrode (second electrode 23) and a layered body (e.g., organic EL layer 22) formed between the first electrode and the second electrode. In the display apparatus, the display region may include: a first subpixel (e.g., blue subpixel 3B); a second subpixel (e.g., green subpixel 3G); and a third subpixel (e.g., red subpixel 3R). The first subpixel, the second subpixel, and the third subpixel emit their respective light having mutually different peak wavelengths (e.g., blue light, green light, and red light). The layered body includes: a first light-emitting layer (e.g., blue light-emitting layer 34B) containing a first fluorescent luminescent material (e.g., blue fluorescent luminescent material), a second light-emitting layer (e.g., green light-emitting layer 34G) containing a second fluorescent luminescent material (e.g., green fluorescent luminescent material), and a third light-emitting layer (e.g., red light-emitting layer 34R) containing a third fluorescent luminescent material (e.g., red fluorescent luminescent material) or a phosphorescent luminescent material (e.g., red phosphorescent luminescent material) as a third luminescent material. The first fluorescent luminescent material emits light having a first peak wavelength. The second fluorescent luminescent material emits light having a second peak wavelength that is longer than the first peak wavelength. The third luminescent material emits light having a third peak wavelength that is longer than the second peak wavelength. The second fluorescent luminescent material has a lower energy level in a minimum excited singlet state than an energy level of the first fluorescent luminescent material in the minimum excited singlet state. The third luminescent material has a lower energy level in a minimum excited singlet state than the energy level of the second fluorescent luminescent material in the minimum excited singlet state. The third light-emitting layer is formed as a layer that is common to the first subpixel, the second subpixel, and the third subpixel. The first light-emitting layer is formed as a layer that is common to the first subpixel and the second subpixel. The second light-emitting layer is formed only in the second subpixel. A distance between the first light-emitting layer and the second light-emitting layer in the second subpixel is not greater than a Förster radius, and the distance between the second light-emitting layer and the third light-emitting layer is greater than the Förster radius. The third light-emitting layer is formed on the first electrode side or on the second electrode side closer than the first light-emitting layer and the second light-emitting layer.

The display apparatus according to a second aspect of the disclosure is the display apparatus according to the first aspect, wherein one of the first electrode and the second electrode may include a reflective electrode and the other of the first electrode and the second electrode is a light-transmissive electrode, in the first subpixel, light emitted from the first light-emitting layer may be let out to outside either directly through the light-transmissive electrode or through the light-transmissive electrode after being reflected multiple times between the reflective electrode and the light-transmissive electrode in the first subpixel, in the second subpixel, light emitted from the second light-emitting layer may be let out to outside either directly through the light-transmissive electrode or through the light-transmissive electrode after being reflected between the reflective electrode and the light-transmissive electrode in the second subpixel, and, in the third subpixel, light emitted from the third light-emitting layer may be let out to outside either directly through the light-transmissive electrode or through the light-transmissive electrode after being reflected multiple times between the reflective electrode and the light-transmissive electrode in the third subpixel.

The display apparatus according to a third aspect of the disclosure is the display apparatus according to the first or second aspect wherein a part of a light emission spectrum of the first fluorescent luminescent material and a part of an absorption spectrum of the second fluorescent luminescent material may overlap each other.

The display apparatus according to a fourth aspect of the disclosure is the display apparatus according to any of the first to third aspects, wherein the first fluorescent luminescent material may be a thermally activated delayed fluorescence material with an energy difference of 0.3 eV or smaller between a minimum excited singlet state and a minimum excited triplet state.

The display apparatus according to a fifth aspect of the disclosure is the display apparatus according to any one of the first to fourth aspects, wherein the second fluorescent luminescent material may be a thermally activated delayed fluorescence material with an energy difference of 0.3 eV or smaller between a minimum excited singlet state and a minimum excited triplet state.

The display apparatus according to a sixth aspect of the disclosure is the display apparatus according to any one of the first to fifth aspects, wherein the third fluorescent luminescent material may be a thermally activated delayed fluorescence material with an energy difference of 0.3 eV or smaller between a minimum excited singlet state and a minimum excited triplet state.

The display apparatus according to a seventh aspect of the disclosure is the display apparatus according to any one of the first to sixth aspects, wherein in the second subpixel, the first light-emitting layer and the second light-emitting layer may be layered via a blocking layer containing no luminescent material and having a layer thickness that is equal to or smaller than a Förster radius.

The display apparatus according to an eighth aspect of the disclosure is a display apparatus according to any one of the first to seventh aspects, wherein in the second subpixel, a distance between the second light-emitting layer and the third light-emitting layer may be at least 15 nm.

The display apparatus according to a ninth aspect of the disclosure is the display apparatus according to any one of the first to eighth aspects, wherein the third light-emitting layer, the first light-emitting layer, and the second light-emitting layer may be layered between the first electrode and the second electrode in this order from the first electrode side.

The display apparatus according to a tenth aspect of the disclosure is the display apparatus according to any one of the first to eighth aspect, wherein the second light-emitting layer, the first light-emitting layer, and the third light-emitting layer may be layered between the first electrode and the second electrode in this order from the first electrode side.

The display apparatus according to an eleventh aspect of the disclosure is the display apparatus according to the seventh or the eighth aspect, wherein a separation layer containing no luminescent material may be formed between the first light-emitting layer and the third light-emitting layer at least in the second subpixel.

The display apparatus according to a twelfth aspect of the disclosure is the display apparatus according to the eleventh aspect, wherein a total layer thickness of the first light-emitting layer and the separation layer may be greater than a Förster radius.

The display apparatus according to a thirteenth aspect of the disclosure is the display apparatus according to the first to eighth aspects, wherein the third light-emitting layer, the second light-emitting layer, and the first light-emitting layer may be layered between the first electrode and the second electrode in this order from the first electrode side.

The display apparatus according to a fourteenth aspect of the disclosure is the display apparatus according to the thirteenth aspect, wherein a separation layer containing no luminescent material may be formed between the second light-emitting layer and the third light-emitting layer at least in the second subpixel.

The display apparatus according to a fifteenth aspect of the disclosure is the display apparatus according to the fourteenth aspect, wherein the separation layer has a layer thickness that is greater than a Förster radius.

The display apparatus according to a sixteenth aspect of the disclosure is the display apparatus according to the eleventh, twelfth, fourteenth, and fifteenth aspects, wherein in the separation layer, a light emission spectrum of a fluorescent luminescent material in a light emission layer that is adjacent on the opposite side of the separation layer from the third light emission layer and an absorption spectrum of the material for the separation layer may do not overlap at all.

A display apparatus manufacturing method according to a seventeenth aspect of the disclosure for manufacturing a display apparatus (e.g., organic EL display apparatus 1) including: a display region 1a; a first electrode (first electrode 21); a second electrode (second electrode 23); and a layered body (e.g., organic EL layer 22) formed between the first electrode and the second electrode. The display region includes: a first subpixel (e.g., blue subpixel 3B), a second subpixel (e.g., green subpixel 3G), and a third subpixel (e.g., red subpixel 3R). The first subpixel, the second subpixel, and the third subpixel emit their respective light having mutually different peak wavelengths (e.g., blue light, green light, and red light). The layered body includes: a first light-emitting layer (e.g., blue light-emitting layer 34B) containing a first fluorescent luminescent material (e.g., blue fluorescent luminescent material), a second light-emitting layer (e.g., green light-emitting layer 34G) containing a second fluorescent luminescent material (e.g., green fluorescent luminescent material), and a third light-emitting layer (e.g., red light-emitting layer 34R) containing a third fluorescent luminescent material (e.g., red fluorescent luminescent material) or a phosphorescent luminescent material (e.g., red phosphorescent luminescent material) as a third luminescent material. The first fluorescent luminescent material emits light having a first peak wavelength. The second fluorescent luminescent material emits light having a second peak wavelength that is longer than the first peak wavelength. The third luminescent material emits light having a third peak wavelength that is longer than the second peak wavelength. The second fluorescent luminescent material has a lower energy level in a minimum excited singlet state than an energy level of the first fluorescent luminescent material in the minimum excited singlet state. The third luminescent material has a lower energy level in a minimum excited singlet state than the energy level of the second fluorescent luminescent material in the minimum excited singlet state. The display apparatus manufacturing method includes: a first electrode formation step for forming the first electrode; a layered body formation step for forming the layered body; and a second electrode formation step for forming the second electrode, wherein the layered body formation step includes: a first light-emitting layer vapor deposition step for vapor-depositing the first light-emitting layer as a layer that is common to the first subpixel, the second subpixel, and the third subpixel; a second light-emitting layer vapor-deposition step for vapor-depositing the second light-emitting layer in a separately patterning manner as a layer that is common to the second subpixel and the third subpixel; and a third light-emitting layer vapor-deposition step for vapor-depositing the third light-emitting layer in a separately patterning manner in the third subpixel. A distance between the first light-emitting layer and the second light-emitting layer in the second subpixel is not greater than the Förster radius, and a distance between the second light-emitting layer and the third light-emitting layer is greater than the Förster radius. The layered body is formed allowing the third light-emitting layer located on the first electrode side or on the second electrode side closer than the first light-emitting layer and the second light-emitting layer.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Organic EL display apparatus (display apparatus)
1a Display region
2 Pixel
3, 3B, 3G, 3R Subpixel
4, 4B, 4G, 4R Light emitting region
10 TFT substrate (substrate)
11 Insulating substrate
12 TFT
13 Interlayer insulating film
13a Contact hole
14 Wiring lines
15 Bank
15a Opening
20, 20B, 20G, 20R Organic EL element
21 First electrode
21a Reflective electrode
21b Light-transmissive electrode
22 Organic EL layer
23 Second electrode
24 Protection layer
31 Hole injection layer
32 Hole transport layer
33 Light-emitting layer unit (layered body)
34 Light-emitting layer
34B Blue light-emitting layer (first light-emitting layer)
34G Green light-emitting layer (second light-emitting layer)
34R Red light-emitting layer (third light-emitting layer)
35 Electron transport layer
36 Electron injection layer
37 Blocking layer
38 Separation layer
40 Sealing substrate
DBG, DGR Distance between mutually opposing surfaces

The invention claimed is:
1. A display apparatus comprising:
a display region;
a first electrode;
a second electrode; and
a layered body formed between the first electrode and the second electrode,
wherein the display region includes
a first subpixel,
a second subpixel, and
a third subpixel,
the first subpixel, the second subpixel, and the third subpixel emit their respective light having mutually different peak wavelengths,
the layered body includes
a first light-emitting layer containing a first fluorescent luminescent material,
a second light-emitting layer containing a second fluorescent luminescent material, and
a third light-emitting layer containing a third fluorescent luminescent material or a phosphorescent luminescent material as a third luminescent material,
the first fluorescent luminescent material emits light having a first peak wavelength,
the second fluorescent luminescent material emits light having a second peak wavelength that is longer than the first peak wavelength,
the third luminescent material emits light having a third peak wavelength that is longer than the second peak wavelength,
the second fluorescent luminescent material has a lower energy level in a minimum excited singlet state than an energy level of the first fluorescent luminescent material in the minimum excited singlet state,
the third luminescent material has a lower energy level in a minimum excited singlet state than the energy level of the second fluorescent luminescent material in the minimum excited singlet state
the third light-emitting layer is formed as a layer that is common to the first subpixel, the second subpixel, and the third subpixel, the first light-emitting layer is formed as a layer that is common to the first subpixel and the second subpixel, the second light-emitting layer is formed only in the second subpixel, a distance between the first light-emitting layer and the second light-emitting layer in the second subpixel is not greater than a Förster radius, and the distance between the second light-emitting layer and the third light-emitting layer is greater than the Förster radius, and the third light-emitting layer is formed on the first electrode side or on the second electrode side closer than the first light-emitting layer and the second light-emitting layer.

2. The display apparatus according to claim 1,
wherein one of the first electrode and the second electrode includes a reflective electrode and the other of the first electrode and the second electrode is a light-transmissive electrode, in the first subpixel, light emitted from the first light-emitting layer is let out to outside either directly through the light-transmissive electrode or through the light-transmissive electrode after being reflected multiple times between the reflective electrode and the light-transmissive electrode in the first subpixel, in the second subpixel, light emitted from the second light-emitting layer is let out to outside either directly through the light-transmissive electrode or through the light-transmissive electrode after being reflected multiple times between the reflective electrode and the light-transmissive electrode in the second subpixel, and in the third subpixel, light emitted from the third light-emitting layer is let out to outside either directly through the light-transmissive electrode or through the light-transmissive electrode after being reflected multiple times between the reflective electrode and the light-transmissive electrode in the third subpixel.

3. The display apparatus according to claim 1,
wherein a part of a light emission spectrum of the first fluorescent luminescent material and a part of an absorption spectrum of the second fluorescent luminescent material overlap each other.

4. The display apparatus according to claim 1,
wherein the first fluorescent luminescent material is a thermally activated delayed fluorescence material with an energy difference of 0.3 eV or smaller between a minimum excited singlet state and a minimum excited triplet state.

5. The display apparatus according to claim 1,
wherein the second fluorescent luminescent material is a thermally activated delayed fluorescence material with an energy difference of 0.3 eV or smaller between a minimum excited singlet state and a minimum excited triplet state.

6. The display apparatus according to claim 1,
wherein the third fluorescent luminescent material is a thermally activated delayed fluorescence material with an energy difference of 0.3 eV or smaller between a minimum excited singlet state and a minimum excited triplet state.

7. The display device according to claim 1,
wherein in the second subpixel, the first light-emitting layer and the second light-emitting layer are layered via a blocking layer containing no luminescent material and having a layer thickness that is equal to or smaller than a Förster radius.

8. The display apparatus according to claim 7,
wherein a separation layer containing no luminescent material is formed between the first light-emitting layer and the third light-emitting layer at least in the second subpixel.

9. The display apparatus according to claim 8,
wherein a total layer thickness of the first light-emitting layer and the separation layer is greater than a Förster radius.

10. The display apparatus according to claim 1,
wherein in the second subpixel, a distance between the second light-emitting layer and the third light-emitting layer is at least 15 nm.

11. The display apparatus according to claim 1,
wherein the third light-emitting layer, the first light-emitting layer, and the second light-emitting layer are layered between the first electrode and the second electrode in this order from the first electrode side.

12. The display apparatus according to claim 1,
wherein the second light-emitting layer, the first light-emitting layer, and the third light-emitting layer are layered between the first electrode and the second electrode in this order from the first electrode side.

13. The display apparatus according to claim 1,
wherein the third light-emitting layer, the second light-emitting layer, and the first light-emitting layer are layered between the first electrode and the second electrode in this order from the first electrode side.

14. The display apparatus according to claim 13,
wherein a separation layer containing no luminescent material is formed between the second light-emitting layer and the third light-emitting layer at least in the second subpixel.

15. The display apparatus according to claim 14,
wherein the separation layer has a layer thickness that is greater than a Förster radius.

16. A display apparatus manufacturing method for manufacturing a display apparatus including: a display region; a first electrode; a second electrode; and a layered body formed between the first electrode and the second electrode, wherein the display region includes a first subpixel, a second subpixel, and a third subpixel, the first subpixel, the second subpixel, and the third subpixel emit their respective light having mutually different peak wavelengths, the layered body includes a first light-emitting layer containing a first fluorescent luminescent material, a second light-emitting layer containing a second fluorescent luminescent material, a third light-emitting layer containing a third fluorescent luminescent material or a phosphorescent luminescent material as a third luminescent material, the first fluorescent luminescent material emits light having a first peak wavelength, the second fluorescent luminescent material emits light having a second peak wavelength that is longer than the first peak wavelength, the third luminescent material emit light having a third peak wavelength that is longer than the second peak wavelength, the second fluorescent luminescent material has a lower energy level in a minimum excited singlet state than an energy level of the first fluorescent luminescent material in the minimum excited singlet state, the third luminescent material has a lower energy level in a minimum excited singlet state than the energy level of the second fluorescent luminescent material in the minimum excited singlet state, the display apparatus manufacturing method comprising:

a first electrode formation step for forming the first electrode;

a layered body formation step for forming the layered body;

a second electrode formation step for forming the second electrode;

wherein the layered body formation step includes a first light-emitting layer vapor deposition step for vapor-depositing the first light-emitting layer as a layer that is common to the first subpixel, the second subpixel, and the third subpixel, a second light-emitting layer vapor-deposition step for vapor-depositing the second light-emitting layer in a separately patterning manner as a layer that is common to the second subpixel and the third subpixel, and a third light-emitting layer vapor-deposition step for vapor-depositing the third light-emitting layer in a separately patterning manner in the third subpixel, a distance between the first light-emitting layer and the second light-emitting layer in the second subpixel is not greater than a Förster radius, and a distance between the second light-emitting layer and the third light-emitting layer is greater than the Förster radius, and the layered body is formed allowing the third light-emitting layer located on the first electrode side or on the second electrode side closer than the first light-emitting layer and the second light-emitting layer.

* * * * *